United States Patent [19]

Usagawa et al.

[11] Patent Number: 5,567,961
[45] Date of Patent: Oct. 22, 1996

[54] SEMICONDUCTOR DEVICE

[75] Inventors: Toshiyuki Usagawa, Yono; Atsushi Takai; Hiroyuki Itoh, both of Tokyo, all of Japan

[73] Assignee: Hitachi, Ltd., Tokyo, Japan

[21] Appl. No.: 100,718

[22] Filed: Aug. 3, 1993

[30] Foreign Application Priority Data

Aug. 21, 1992 [JP] Japan .................................. 4-222498

[51] Int. Cl.⁶ .................. H01L 31/0328; H01L 31/0336; H01L 31/072
[52] U.S. Cl. ........................ 257/197; 257/198; 257/192
[58] Field of Search ...................... 257/197, 198, 257/539, 577, 370, 192, 194, 378, 273; 327/524, 26; 326/309, 325, 331

[56] References Cited

U.S. PATENT DOCUMENTS

| | | | |
|---|---|---|---|
| 4,758,870 | 7/1988 | Hase et al. | 257/198 |
| 4,821,090 | 4/1989 | Yokoyama | 257/198 |
| 5,250,826 | 10/1993 | Yokoyama | 257/197 |

FOREIGN PATENT DOCUMENTS

| | | | |
|---|---|---|---|
| 0113334 | 7/1984 | European Pat. Off. | 257/273 |
| 056-8874 | 1/1981 | Japan | 257/273 |
| 0220470 | 12/1983 | Japan | 257/370 |
| 62-199049 | 9/1987 | Japan . | |
| 63-236358 | 3/1988 | Japan . | |
| 63-136358 | 10/1988 | Japan . | |

OTHER PUBLICATIONS

"Semiconductor Devices Physics and technology"; Sze; 1985 pp. 110–111,208–209.
"Microelectronic Circuits", Sedra et al.; 1987; p. 869.

"Integrated Schottky diodes in HBT Technology"; IBM Technical Disclosure Bulletin; vol. 31, No. 5 Oct. 1988.

IEEE Transactions on Electron Devices, vol. 38, No. 2, Feb. 1991, Patrick D. Rabinzohn et al.; pp. 222–231: *The New Two–Dimensional Electron Gas Base HBT (2DEG–HBT): Two–Dimensional Numerical Simulation.*

IEEE 1983, GaAs IC Symposium, M. Abe et al.: *HEMT LSI Technology for High Speed Computers,* pp. 158∞161.

IEEE 1987, Shuichi Fujita et al., pp. 1889–1896: *Characterization of Heterostructure Complementary MISFET Circuits Employing the New Gate Current Model.*

IEEE 1985, N. C. Cirillo, Jr. et al.: pp. 317–320: *Complementary Heterostructure Insulated Gate Field Effect Transistors (HIGFETs).*

Transactions of the Institute of Electronics, Information and Communication Engineers, C, vol. J70–C, No. 5, pp. 716–723; Toshiyuki Usagawa et al.: *Device Analysis of Two Dimensional Electron Gas (2DEG)FET.*

*Primary Examiner*—Wael M. Fahmy
*Attorney, Agent, or Firm*—Kenyon & Kenyon

[57] ABSTRACT

A semiconductor device may include a double hetero junction bipolar transistor and a field-effect transistor. The base of the bipolar transistor and the gate of the field-effect transistor are connected to each other to serve as an input terminal and the collector of the bipolar transistor and the drain of the field-effect transistor are connected to each other to serve as an output terminal. The bipolar transistor and the field-effect transistor may be created on a common substrate. In this case, both the bipolar and field-effect transistors can have the same multilayer/film structures.

40 Claims, 36 Drawing Sheets

JUNCTION GATE 2DEG-FET     2DEG BASE PNp HBT

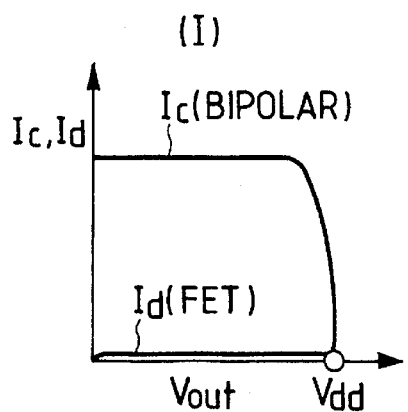
FIG. 8(a) (I)
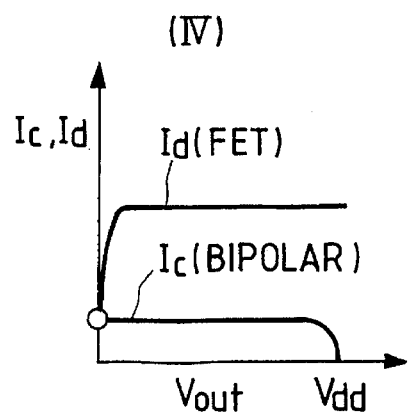
FIG. 8(d) (IV)
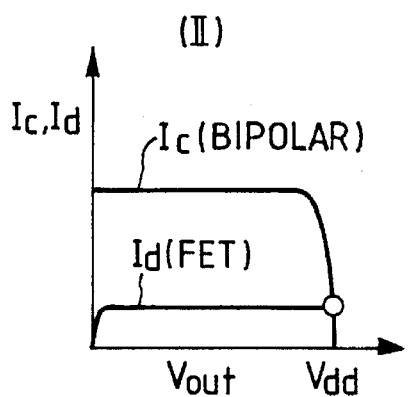
FIG. 8(b) (II)
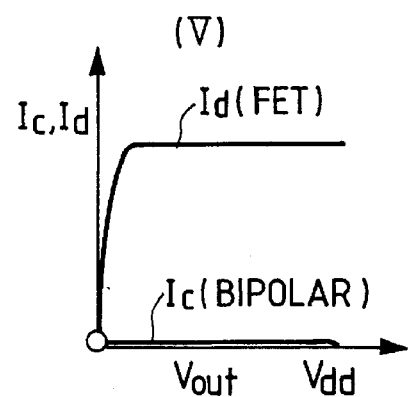
FIG. 8(e) (V)
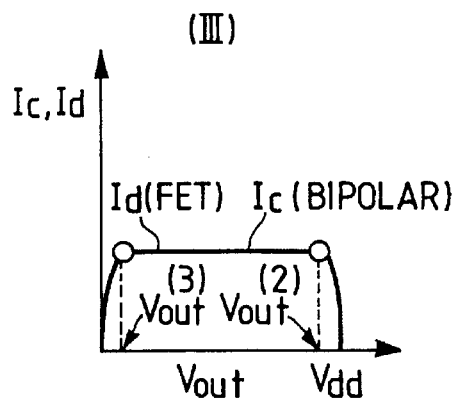
FIG. 8(c) (III)

$I_{c1} + I_{b1} = I_{d1} + I_{g1}$
$I_{o2} + I_{b2} = I_{d2} + I_{g2}$

JUNCTION GATE 2DEG-FET      2DEG BASE PNp HBT

JUNCTION GATE 2DEG-FET      2DEG BASE PNp HBT

JUNCTION GATE 2DEG-FET     2DEG BASE PNp HBT

JUNCTION GATE 2DEG-FET     2DEG BASE PNp HBT

JUNCTION GATE 2DEG-FET    2DEG BASE PNp HBT

HEMT    2DEG BASE PNp HBT

JUNCTION GATE 2DEG-FET    2DEG BASE PNp HBT

JUNCTION GATE 2DEG-FET    2DEG BASE PNp HBT

JUNCTION GATE 2DEG-FET    2DEG BASE PNp HBT

JUNCTION GATE 2DEG-FET    2DEG BASE PNp HBT

SEMICONDUCTOR DEVICE

BACKGROUND OF THE INVENTION

The present invention relates to a semiconductor device. To be more specific, the present invention relates to logic and memory circuits using field-effect transistors (FETs) and double hetero junction bipolar transistors (DHBTs) having different polarities from each other. In particular, the present invention relates to a semiconductor device which has a two-dimensional electron gas base having, in its base and collector, a double hetero junction structure allowing a pnp-type HBT and an n-channel FET both implemented at the same time on the same multilayer structure, and is suitable for use as a complementary BiFET having an ultra-high speed and ultra-low power consumption.

In circuit conventional integrated logic circuits and integrated memory circuits which have a generic name IC standing for an integrated circuit, bipolar and field-effect transistors are used. In general, an integrated circuit using bipolar transistors offers a characteristic of having a large load drivability and a high speed. On the other hand, an integrated circuit using field-effect transistors exhibits a characteristic of having a high integration density and low power consumption. In particular, most semiconductor devices made of silicon are CMOS (Complementary MOS) logic circuits using n and p-type MOS (Metal Oxide Semiconductor) FETs. A large number of MOSFETs can be used due to their property of consuming only low power. Several hundreds of thousands of gates constituting large-scale logic circuits can be formed on a single LSI silicon chip, being embedded in an area of the order of one square centimeter. As a result of an application of the CMOS technology to memory products, four-megabit SRAMS (Static Random-Access Memories) with an access time of 15 nanoseconds and low power consumption of less than 1 W have been successfully implemented. From the device-structure point of view, the successful implementation of the four-megabit SRAMS is attributed to the successful development of a technology which allows n- and p-channel MOSFETS to be created with a high degree of stability.

In the case of a bipolar-transistor IC, on the other hand, a carrier-storage phenomenon occurring in a saturation region is observed. When used as a high-speed logic circuit, it is thus necessary to operate the bipolar transistor in a non-saturation region. When thinking about only the principle of operation, the DCTL (Direct Coupled Transistor Logic) was also taken as a subject of a feasibility study. However, the transistor inevitably operates in the saturation region, resulting in a low speed. As an IC, the DCTL can thus hardly be put to practical use. As a result, a circuit type that allows the transistors in the non-saturation region cited above is adopted. That is, most bipolar transistors in use are of the current-switching types such as the CML (Current Mode Logic) and the ECL (Emitter Coupled Logic) which allow the bipolar transistors to operate in the non-saturation region.

In order to increase the LSI speed of a bipolar-transistor integrated circuit, an ECL (Emitter Coupled Logic) circuit is preferably used. In this case, the circuit is used by continuously flowing the emitter current all the time. Accordingly, it consumes much power. As a result, large-scale integration can not be implemented. In the following description, an ECL circuit is taken as an example. An example of the highest level of integration is the so-called 64-kilobit SRAM with power consumption of 20 W and a short access time of the order of 2 nanoseconds. A typical CMOS device is therefore 100 times better in terms of integration level and power consumption. Since the levels of integration are much different from each other, however, the comparison of an ECL device to a CMOS device is not a fair comparison. Nevertheless, a bipolar-transistor integrated circuit is superior in that its speed is higher by 10 times as much.

In order to increase the speeds of systems developed in recent years, nevertheless, high-speed LSI devices are in high demand. As a result, the superiority of a circuit using bipolar transistors starts threatening the dominance of the BiCMOS and CMOS devices.

In addition, personal communication equipment such as personal computers with radio-communication functions and radio LANS for transmission of information in the high-frequency region of the order of 1 to 30 GHz are in high demand in the telecommunication area. Thus, low-power transistors and circuits offering power consumption of the order of 10 mW, which can cope with problems encountered in such a high-frequency region, are required. Basically, devices with ultra-low powers and ultra-high speeds are really expected as devices of the next stage.

In the case of the CMOS technology, on the other hand, performance improvement resulting from the miniaturization of the gate length does not make any further progress as suggested by the original trend. Furthermore, it is also necessary to decrease the supply voltage from 5 V to a value in the range 2.0 to 3.3 V in order to preserve reliability. Accordingly, the load drivability of the transistor deteriorates, resulting in a reduced LSI speed.

During the 1980s decade, on the other hand, IC devices with an ultra-high speed using compound semiconductors as their raw materials were developed. Gallium arsenic is a representative example of such compound semiconductor materials. The gallium-arsenic compound semiconductor material has a mobility six times that of silicon and can thus be used as a semi-insulating substrate. Devices, which were made up of gallium arsenic, were at that time field-effect transistors (FETs) such as GaAs MESTETs and HEMTs (High Electron Mobility Transistors) to mention a few. The so-called SCFL (Source Coupled FET Logic) similar to the ECL described above and the DCFL (Direct Coupled FET Logic) using enhancement and depletion-type FETs are predominant types of circuits. The GaAs FET is about the same as the silicon bipolar transistor as far as the level of integration and the speed are concerned. However, the former exhibits characteristics of being capable of reducing power consumption to about one-third in comparison to that of the latter and generating low noise at high frequencies. A complementary circuit making use of n- and p-channel FETs in a GaAs FET is described, for example, on Pages 317 to 320 of an IEEE IEDM abstract issued in the year of 1985. A detailed study of the circuit performance is discussed on Pages 1889 to 1896 of the IEEE Transactions ED-34, 1987 or on Page 262 of the IEEE Electron Device Letters EDL8 No. 6 in year of 1957.

However, these conventional technologies have shortcomings that the performance of the p-channel FET cannot be improved and a high speed, which is the most important characteristic of the compound semiconductor material, cannot be realized. The mobility of a two-dimensional hole gas at the AlGaAs/GaAs hetero junction is 400 cm$^2$/Vs at room temperature. As for the FET performance, the transconductance Gm is 170 mS/mm at a gate length Lg of 0.1 μm and a source-gate resistance Rsg of 1.7 Ωmm. Refer to, for example, the description on Pages 716 to 723 and FIG. 1(a) of the Transactions of the Institute of Electronics, Information and Communication Engineers, C, Vol. J70-C, No. 5, May 1987. This FET performance can be expected to be about merely one-seventh of the n-channel FET and, therefore, there is no way of achieving a high speed. From the power-consumption point of view, the gate electrode of either the n or p channel experiences a high forward bias when the circuit is at a standby state due to the fact that the so-called Shottky junction is adopted in the gate structure, causing the gate current to flow from the power supply to the ground side and consuming almost 80% or even more of the total consumed power of the circuit as is generally known. On the contrary, the conventional CMOS device has a characteristic of consuming power only while the circuit is switching from one state to another. Accordingly, the important feature of a complementary circuit of GaAs FET of consuming only low power is lost.

In the case of a hetero bipolar transistor (abbreviated as an HBT) which is made up of compound semiconductor materials, on the other hand, using the same circuit as that of the silicon bipolar transistor such as the ECL circuit results in a shortcoming that the turned-on power of the hetero bipolar transistor increases to 1.5 times, giving rise to twice as much consumed power due to a large band gap.

That is, with FETs and bipolar transistors made up of the conventional compound semiconductor materials, a device that implements an ultra-high speed smaller than a propagation time of 10 psec per gate and ultra-low consumed power less than 10 µW at the same time could not so far be created.

SUMMARY OF THE INVENTION

The present invention addresses the problems described above. The present invention provides a number of device circuits which can be manufactured with ease by using simple manufacturing processes, have a high speed allowing high-frequency signals in the microwave and miliwave regions to be processed, consume low power and allow high-speed logic and memory circuits to be implemented into simple circuit configurations.

By joining the base to the collector through a hetero junction in accordance with the present invention, when a forward bias is applied between the base and the collector, the number of minority carriers accumulated in the collector layer is greatly reduced and, at the same time, a delay effect caused by minority carriers accumulated in the base layer can also be decreased to a negligible level. Accordingly, various types of circuits employing bipolar transistors, which have been traditionally regarded to have a low speed when operated in the saturated region, now offer a number of possibilities and applications different from those of the conventional devices by virtue of the hetero junction between the base and the collector according to an embodiment of the present invention. The complementary BiFET is just one of their examples.

A two-dimensional electron gas hetero bipolar transistor (2PEG-HBT) has been proposed by one of the present inventors in Japanese Patent Laid-open No. 62-199049 and Japanese Patent Laid-open No. 63-236258. In a two-dimensional electron gas hetero bipolar transistor, a two-dimensional electron gas is used in the base layer of its hetero bipolar transistor and the two-dimensional electron gas is created on the boundary face at the undoped GaAs side of the n-channel AlGaAs/undoped GaAs hetero junction.

A detailed analysis of device characteristics of the 2DEG-HBT was carried out by one of the inventors of the present invention. Results of the analysis are described in the IEEE Transactions on Electron Devices, Vol. 38, No. 2, 1991, pp. 222–231. The results of the analysis indicate discoveries of the following facts:

In an HBT of the GaAs/AlGaAs family,
(1) In the case of the pnp type, the emitter delay time $\tau e$ can be reduced to a magnitude of the order of 0.1 picoseconds.
(2) In the case of the npn type, on the other hand, the emitter delay time $\tau e$ inevitably stays at a large value of the order of 1.0 picosecond.

The above phenomena are explained as follows. In a GaAs/AlGaAs hetero junction, for a normally used Al composition of 0.3, a discontinuity of the conduction band ($\Delta Ec$) is 300 nev whereas a discontinuity of the valance band ($\Delta Ev$) is 50 meV. It is obvious that the former ($\Delta Ec$) is six times greater than the latter ($\Delta Ev$). This means that an electron faces a much larger potential barrier than a hole. Roles played by the discontinuity of the conduction band ($\Delta Ec$) and the discontinuity of the valance band ($\Delta Ev$) are explained by referring to FIGS. 3(a) and (b) which show energy bands of the emitter-base-collector junctions of the 2DEG-HBT and the ordinary npn-type HBT respectively.

As shown in FIG. 3(a), a discontinuity of the conduction band between a p-type $Al_yGa_{1-y}As$ layer 36 serving as an emitter layer and an n-type $Al_xGa_{1-x}As$ layer 35 which is a 2DEG 38 supply layer serving as a base layer is $\Delta Ec_1$ whereas a discontinuity of the conduction band between the n-type $Al_xGa_{1-x}As$ layer 35 serving as the 2DEG 38 supply layer and a high-purity GaAs layer 34 serving as a 2DEG storage layer is $\Delta Ec2$. The sum of the discontinuities $\Delta Ec$ (=$\Delta Ec_1+\Delta Ec_2$) is seen by electrons, the minority carriers in this case, as a potential barrier suppressing injection into the emitter layer. As indicated by an analysis described in the above 1991 IEEE Transactions on Electron Devices Article, for x=0.3 and y=0.45, $\Delta Ec$ is found to be 450 meV, a value greater than the average thermal energy kT (=24.8 meV) of an electron at room temperature by more than one digit order of magnitude.

Accordingly, the total discontinuity $\Delta Ec$ of the conduction band works as an adequate potential for suppressing the injection of minority carriers. As described in detail in a section entitled 'B. Frequency Performance Analysis' on Page 225 of the 1991 IEEE article, the great potential barrier is a physical reason why the emitter delay time re of the 2DEG-HBT can be reduced to a value in the range 0.02 to 0.1 picoseconds, a value which can virtually be ignored. On the other hand, a discontinuity $\Delta Ev$ of the valence band of an ordinary npn-type HBT is shown in FIG. 3(b). As shown in the figure, the discontinuity $\Delta Ev$ of the valence band between an n-type $Al_yGa_{1-y}As$ layer 135 serving as an emitter layer and a p-type GaAs layer 134 serving as a p-type base layer is seen by the minority carriers, which are holes in this case, as a potential barrier suppressing their injection into the emitter layer.

The discontinuity $\Delta Ev$ of the valence band has a small value of 75 meV even if the Al composition of the emitter layer is increased from the normal value 0.3 to y=0.45. The value 75 meV is only three times greater than the average thermal energy of kT (=24.8 meV) at room temperature. The fact that the discontinuity $\Delta Ev$ of the valence band, which serves as a potential barrier suppressing the hole injection into the emitter layer, is small is a physical reason why the emitter delay time $\tau e$ is inevitably increased to a value of the order of 1.0 picoseconds. This is a sufficiently large value that cannot be ignored when compared to other delay times.

This has led to a detailed analysis of device characteristics of the double hetero junction 2DEG-HBT, the base-collector junction of which is a hetero junction increasing the band gap of the collector. In particular, the state of the minority carriers, electrons in this case, accumulated in the collector with a forward bias applied between the base and the collector was analyzed. Results of the analysis indicated a large decrease in the number of minority carriers accumulated in the collector. In addition, a device was created and its characteristics were evaluated. The effect was also verified by experiments. The experiments have verified that electrons of the base region serving as minority carriers are hardly injected into the collector region physically due to the discontinuity $\Delta Ec$ of the conduction band between the base and the collector. It should be noted that the value of $\Delta Ec$ is 300 meV for an Al composition of 0.3 and 450 meV for an Al composition of 0.45. From the device-operation point of view, this effect contributes to a solution to the problem that, in the saturation-type circuit of a bipolar transistor, when the bipolar transistor transits from the saturation region to the non-saturation region, the charging time $\tau cc$ of the minority carriers remaining in the collector lowers the speed of the circuit.

This effect also has significance that, if the saturation problem can be ignored even for a bipolar transistor, types of circuits that did not exist before can now be used.

The matter described above can be explained as the effect suppressing the injection of minority carriers into the emitter has been. An energy-band diagram of the collector region comprising a hetero junction between an undoped GaAs layer 34 and an undoped AlGaAs layer 33 in a double hetero junction 2DEG-HBT is shown in FIG. 4(a). For electrons, the discontinuity $\Delta Ec$ of the conduction band is a very large potential barrier having a value of 300 meV~450 meV depending on the Al molar fractions of undoped AlGaAs layer 33. It has a magnitude that is large enough for suppressing injection of the electrons into the AlGaAs layer 33. Having a value of only 50 meV, on the other hand, the discontinuity $\Delta Ev$ of the valence band is a potential barrier that is not so large as required for suppressing injection of holes into the AlGaAs layer 33. This is the physical reason why the charging time $\tau cc$ of minority carriers remaining in the collector of the double hetero junction type 2DEG-HBT has a very small value of the order of 0.1 picoseconds. Also in this case, a difference in charging time $\tau cc$ exists between an pnp-type HBT and npn-type HBT of the GaAs/AlGaAs family. The difference is attributed to the fact that the roles played by the discontinuity $\Delta Ec$ of the conduction band and the discontinuity $\Delta Ev$ of the valence band in a hetero junction are interchanged with each other. That is, in the case of an ordinary npn-type HBT, the charging time $\tau cc$ cited above has a value of several picoseconds to several tens of picoseconds.

Next, a storage effect of holes in the base layer is discussed. In the case of a 2DEG-HBT, the hole storage effect in the base layer is extremely small due to the following structural characteristic. Much like an ordinary bipolar transistor, the 2DEG-HBT does not have a neutral region, being divided into a metallurgic n-type AlGaAs layer 35 which is normally depleted and a 2DEG at a triangle potential created on the collector side. It should be noted that the n-type AlGaAs layer 35 corresponds to an n-type base-layer portion, a depleted layer, in the pn junction between the emitter and the base of an ordinary bipolar transistor. An energy band diagram with a forward bias applied between the base and the collector is shown in FIG. 4(b). With a forward bias applied between the base and the collector, holes are accumulated in the region of a GaAs layer 34 with a low doping level. As the base and collector transits from a forward-biased state to an off state, however, a strong electric field E shown in FIG. 3(a) immediately results, pulling out the holes accumulated in the GaAs layer 34 therefrom. It should be noted that the magnitude of the electric field E is equal to the ratio of the built-in potential between the base and the collector to the thickness Wc of the collector layer which is approximately equal to (1.8 V/300 nm)=$6 \times 10^4$ V/cm. In addition, some holes are also accumulated in the depleted AlGaAs layer 35. However, the number of holes accumulated therein is very small. This is because the n-type AlGaAs layer 35 has a very small thickness of the order of 30 nm and the space electric charge is charged positively. The delay time $\tau bb$ of the circuit caused by the so-called accumulation of minority carriers in the base layer of the 2DEG-HBT described above becomes very small.

The present invention provides an ultra-high-speed/ultra-low-power semiconductor device which has a speed which is not possible with the conventional semiconductor electronic device and higher than that of the bipolar ECL circuit as well as consumes power less than that consumed by the CMOS device. These ultra-high-speed and ultra-low-power characteristics are made possible by the use of a complementary BIFET circuit comprising a bipolar transistor and a field-effect transistor having different polarities from each other as in the case of a CMOS device as described below with the bipolar transistor characterized in that the collector thereof has a wide gap in comparison to its base. The use of a bipolar transistor having such a characterization has been inspired by the phenomenon that a hetero junction between the collector and the base in conjunction with a forward bias applied between the former and the latter allow the number of minority carriers accumulated in the collector to be decreased to a large extent and the delay effect caused by minority carriers accumulated in the base can also be reduced to a negligible level as well.

The following description is focused on a complementary BIFET circuit that employs a 2DEG-HBT of the GaAs/AlGaAs family because of the following reasons:

(1) The GaAs family provides the most excellent hetero junction, having the most advanced process technology.

(2) The complementary BIFET circuit is the only combination, that allows both the bipolar and FET transistors to operate at high speeds, among combinations of transistors having different polarities from each other: a pnp-type bipolar transistor paired with an n-channel FET and an npn-type bipolar transistor paired with a p-channel FET.

(3) Devices can be separated from each other with ease without causing a parasitic-transistor effect such as a latch-up to occur, resulting in a simple manufacturing process.

The principle suggested by the present invention can be applied not only to the 2DEG-HBT, but also to a variety of other devices as well. That is to say, the principle proposed by the present invention can be implemented by combining an HBT suppressing the storage effect of minority carriers in the collector and the base with a FET with a different polarity therefrom as will be described below. In addition, materials other than the GaAs/AlGaAs hetero junction family can also be used as well.

A cross-sectional structure of the 2DEG-HBT device is shown, for example, in FIGS. 1(a) and (b) of the IEEE Transactions on Electron Devices, Vol. 38, No. 2, 1991 pp.

222 to 231. It is seen from the figures that, even though the multilayer structures are identical, one of them is a pnp-type hetero junction bipolar transistor while the other is a two-dimensional electron gas FET of the junction gate. Accordingly, the 2DEG-HBT offers an advantage that a common process can be used for the creation of electrodes and the separation of devices, allowing a pnp-type bipolar transistor and an n-channel FET to be created with ease. In addition, it is not necessary to specially devise an electrical device-separation technology. As a result, unlike the CMOS process technology using silicon, the BiCMOS process (a merged technology of the CMOS and the bipolar transistors) and the like, the 2DEG-HBT has a feature that its process structure is not complicated but very simple instead. Furthermore, unlike the CMOS technology, no parasitic pnp and npn transistors exist. Accordingly, the latch-up phenomenon caused by injection of minority carriers does not occur. These features will be preserved even if the junction between the base and the collector is made a hetero junction.

As described above, the 2DEG-HBT offers the features that the manufacturing process thereof is simple and the storage effect of minority carriers is substantially reduced due to the hetero junction between the base and the collector. Making the best use of these features, complementary BiFET employing the double hetero junction 2DEG-HBT was created as shown in FIG. 1. An ultra-high-speed and ultra-low-power electronic circuit made of a compound semiconductor material was thereby created for the first time. The present invention is described by referring to FIG. 1(a) showing an inverter circuit based on an AlGaAs/GaAs hetero junction, FIG. 1(b) showing the device's cross-sectional structure, FIG. 2(a) showing an energy-band diagram and FIG. 2(b) showing characteristics of the inverter circuit.

First of all, the conceptual device structure is explained by referring to FIG. 1(b). The figure shows cross-sectional structures of a junction gate 2DEGFET and a 2DEG base PNpHBT which are electrically insulated from each other. As shown in the figure, a p-type GaAs layer 31, a p-type AlGaAs layer 32, an undoped AlGaAs layer 33, an undoped GaAs layer 34, an n-type AlGaAs layer 35 and a p-type AlGaAs layer 36 are piled up on a semiconductive GaAs substrate 30 in a multilayer structure.

On the HBT side, a p-type AlGaAs layer 36 is an emitter layer whereas a 2DEG (Two-Dimensional Electrical Gas) layer 38 created on a boundary face between the n-type AlGaAs layer 35 and the undoped GaAs layer 34 is a base layer. The undoped GaAs layer 34 and the undoped AlGaAs layer 33 form a collector layer while the p-type AlGaAs layer 32 and the p-type GaAs layer 31 constitute a subcollector layer.

On the FET side, the p-type AlGaAs layer 36 is a gate layer whereas a 2DEG (Two-Dimensional Electrical Gas) layer 38 created on a boundary face between the n-type AlGaAs layer 35 and the undoped GaAs layer 34 is an n-channel layer. The undoped AlGaAs layer 33 has an effect of suppressing a short-channel effect. The p-type AlGaAs layer 32 and the p-type GaAs layer 31 are p-type buffer layers. As will be described later, there are some concepts of applying a potential to these layers. In order to reduce a source-gate resistance Rsg and a base resistance rbb', an n-type ion implanted layer 37 serving as an ohmic connection to the 2DEG layer 38 is created. Created electrodes are an emitter electrode 40, a base electrode 41, a collector electrode 42, a gate electrode 45, a source electrode 43, a drain electrode 44 and a substrate-bias electrode 46.

The processes of manufacturing the device are characterized in that the number of processes can be reduced substantially at the implementation stage because the emitter electrode 40 and the gate electrode 45, the base electrode 41, the source electrode 43 and the drain electrode 44 as well as the collector electrode 42 and the substrate bias electrode 46 can each be created using a common process as the same time. With no bias voltage applied between the source and the gate (the base and the emitter), the existence of the 2DEG layer 38 is not necessarily required. That is, a threshold voltage Vth of the FET can have a positive or negative value as required.

In the following description, a typical value of the threshold voltage Vth in the range of 0.0 to 0.3 V is assumed.

An energy-band diagram indicating a state of the creation of a 2DEG (Two-Dimensional Electron Gas) layer 38 on the boundary face between the n-type AlGaAs layer 35 and the undoped GaAs layer 34 with a forward bias applied between the emitter and the base is shown in FIG. 2(a). As described earlier, electrons are hardly injected from the base into the p-type AlGaAs collector layers 33 and 32, even if such an attempt is made, because of a potential barrier formed by the discontinuity ΔEc of the conduction band on the hetero junction boundary face between the undoped GaAs layer 34 and the undoped AlGaAs collector layer 33.

As shown in FIG. 1(a), the complementary BiFET comprises a pnp-DHBT (Double Hetero Bipolar Transistor) 10 and an enhancement-type n-channel FET 30. The drain portion of the FET is electrically connected to the collector portion of the bipolar transistor whereas the gate portion of the FET is connected electrically to the base portion of the bipolar transistor. Furthermore, the emitter of the DHBT is connected to a first power supply and the source of the FET is connected to a second power supply which is the ground in this case. In addition, the collector of the DHBT and the drain of the FET are connected to the output terminal while the base of the DHBT and the gate of the FET are connected to the input terminal. Normally, the substrate bias electrode (the SB portion) of the FET is further connected to the source portion of the FET.

The basic operation of the logic circuit is similar to that of the silicon CMOS device. To be more specific, when the input is set at a voltage almost equal to that of the first power supply, or set at a high-level voltage, the pnp-type DHBT is turned off while the n-channel FET is turned on. At that time, the voltage of the output approaches the low level of the second power supply. When the input is set a voltage almost equal to that of the second power supply, or set at a low-level voltage, the pnp-type DHBT is turned on while the n-channel FET is turned off. At that time, the voltage of the output approaches the high level of the first power supply.

The difference between the logic circuit and the silicon CMOS device is that one side of the former is a pnp-type bipolar transistor. Because of this difference, the problems listed below, which are encountered in the conventional device, have been solved by the present invention as follows.

(1) When the DHBT is on, the transistor enters the saturation region. Thus, the storage effect of minority carriers becomes a problem as in the case of the DCTL mentioned previously. As have been described before, however, the storage effect of minority carriers at saturation is so small that it can be ignored due to the hetero junction between the base and the collector and the aforementioned features offered by the 2DEG-HBT. It should be noted that by the storage effect of minority carriers, the number of electrons in the collector layer and the number of holes in the base layer are meant.

(2) The operation speed of a pnp-type transistor depends upon a time required by holes to pass through the base which is long. Therefore, it has been believed so far that there is no way to use a pnp-type transistor for high-speed operations. In the case of a 2DEG-HBT, however, the delay time in the emitter region is so small that it can be ignored because of the hetero junction between the emitter (the p-type AlGaAs layer 36 shown in FIG. 1(b)) and the metallurgical base (the n-type AlGaAs layer 35 also shown in FIG. 1(b)) and a big hetero barrier faced by the 2DEG, the actual base. It should be noted that the hetero barrier is the discontinuity $\Delta E_c$ of the conduction band between the n-type AlGaAs layer 35 and the undoped GaAs layer 34. That is, the minority carriers, electrons in this case, are almost incapable of penetrating the emitter region. The propagation time through the base is also so small that it can be ignored due to the fact that the thickness of the 2DEG is only 10 nm which is an extremely small value.

(3) Power-Supply Voltages

The voltages of the first and second power supplies are determined by taking the base building-up voltage of the DHBT and the gate building-up voltage of the FET into consideration. Normally, the power-supply voltages are set at minimum values of theses building-up voltages. Even if the DHBT and FET are in a turned-on state, such setting of power-supply voltages causes voltages to be applied to the base and gate of the DHBT and FET at the next stage; the applied voltages are lower than the build-up voltages thereof. It is thus not necessary to flow large currents. As a result, only little power is consumed. On the other hand, the power-supply voltages can be set at values greater than the building-up voltages. In this case, however, the amount of consumed power inevitably increases even though the speed of the operation is also raised as well. In this case, the power consumption can be reduced by inserting a resistor for input clamping in series with the base or the gate as required. The same effect can also be obtained as well by installing a resistor in series with the emitter. The fact that the series resistor connected to the emitter causes the output potential to decrease by an amount equal to a voltage drop across the emitter resistor must, however, be taken into consideration.

(4) Number of Fan-outs

When the DHBT is on, the base current is supplied by the FET at the preceding stage. Therefore, the number of fan-outs is determined by the drain saturation current of the FET. Conversely speaking, the gate width of the FET is determined by the maximum number of fan-outs set in advance. Normally, the saturation currents of the DHBT and FET are made equal to each other in order to provide balance of driving power. In this case, the number of fan-outs is ideally equal to the current amplification factor hfe of the DHBT. In actuality, however, the number of fan-outs is set at a value of the order of one-third to one-fourth of the current amplification factor hfe. Since the current amplification factor hfe has a value of 100 or greater, a fan-out count in the range one-third to one-fourth of 100 causes almost no problem.

Next, the input/output characteristics of the single inverter shown in FIG. 2(b) are explained. The vertical and horizontal axes of the figure represent the output voltage Vout and the input voltage Vin respectively. The values of the output and input voltages Vout and Vin are in the range 0 V to Vdd V, the levels of the second and first power supplies respectively. As seen from the configuration of the complementary BiFET, the relations Vin=Vg and Vout=Vsd always hold true. In addition, when the input voltage Vin is 0 V, the base-emitter voltage Vbe is equal to Vdd and when the input voltage Vin is equal to Vdd, on the other hand, the base-emitter voltage Vbe is 0 V. This figure shows a case in which the threshold voltage Vth of the FET is positive. The input/output characteristics of the single inverter are described by dividing them into five regions I, II, III, IV and V as follows:

(I) With the input voltage Vin having a value in the range 0 V to the threshold voltage Vth, the n-channel FET 20 is turned off, providing an output voltage Vout fixed at Vdd.

(II) With the input voltage Vin having a value in the range Vth to Vtc, where Vtc is a gate voltage providing a collector current of the bipolar transistor equal to the drain current of the FET, the n-channel FET 20 enters an operating state, causing the drain current of the FET to start flowing. The output voltage Vout starts to drop from Vdd.

(III) When the input voltage Vin is equal to Vtc, the collector current in the active region of the bipolar transistor matches the drain current in the saturation region of the FET.

(IV) When the input voltage Vin has a value in the range Vtc to (Vdd–Vtp), where Vtp is a base-emitter voltage Vbe that turns on the collector current Ic of the bipolar transistor, the collector current Ic of the bipolar transistor starts to turn off and the output voltage Vout starts to approach 0 V.

(V) When the input voltage Vin has a value in the range (Vdd–Vtp) to Vdd, the bipolar transistor is turned off and the output voltage Vout becomes 0 V.

By the way, a region where Vbc is positive is a base-collector saturation region. A dotted line representing (Vbc= 0) serves as a boundary of the region as shown in FIG. 2(b). It should be noted that (Vbc=0) represented by the dotted line indicates that the base and the collector have the same potential.

A complementary logic circuit comprising a pnp-type hetero bipolar transistor and an n-type field-effect transistor has been described above. It is also clear that a similar complementary logic circuit that has a configuration comprising an npn-type hetero bipolar transistor and a p-type field-effect transistor can also be implemented as well.

A basic aspect of the present invention concerning a complementary BiFET employing a DHBT with a very small storage effect of minority carriers at saturation and a FET with a different polarity has been explained so far. Next, considering the actual creation of the circuit, the following are described:

(1) Characteristics of the complementary BiFET as a device.

(2) Conditions required for exhibiting high performance (3) Analysis of connected inverters' operation and their problems (4) Improvements to provide an integrated circuit with a super-high speed, super-low power and large-scale integration.

First of all, characteristics of a grounded-emitter bipolar transistor shown in FIG. 5(a) are explained. When considering the characteristics of a bipolar transistor in terms of FET operations from the aspect of static current-voltage characteristics, the following analogies hold true. The collector current Ic corresponds to the source-drain current Ids, the emitter-collector voltage Vce corresponds to the source-drain voltage Vde, the emitter-base voltage Vbe corresponds to the gate voltage Vg and Vtp corresponds to the threshold voltage Vth of the FET, where Vtp is defined as an emitter-base voltage Vbe at which the collector current Ic is cut off. Strictly speaking, however, the collector current Ic of the bipolar transistor is controlled by the base current Ib instead of being controlled by the emitter-base voltage Vbe. Accordingly, the analogies described above are merely approximate ones.

When observing the characteristics of the bipolar transistor in terms of FET features, a characteristic can be seen as follows. A change of 200 mV in emitter-base voltage Vbe from 1.5 to 1.7 V or vice verse varies the magnitude of the collector current Ic by two digits. Viewing this phenomenon from a FET standpoint, the operation can be regarded as similar to a FET having a threshold voltage Vth of about 1.5 V. Such a threshold voltage Vth is exhibited only by a FET of a very high enhancement type in comparison to a FET made up of ordinary compound semiconductor materials. In spite of the fact that the logic swing ΔV has a small value of merely 200 mV, the collector current can be changed over a range with a two-digit difference between the lower and upper limits. The bipolar transistor thus offers a big feature in that it has a transconductance greater by a two-digit difference in magnitude than that of a FET having the same dimensions.

A relation between the collector current Ic in the non-saturation region of the Ic-Vce characteristics shown in FIG. 5(a) and the emitter-base voltage Vbe is shown in FIG. 5(b). It is obvious from FIG. 5(b) and Equation (1) given below that the on-behaviour of the collector current Ic from the threshold voltage Vtp is exponential and quantitatively proportional to EXP (βVbe). Therefore, the collector current Ic can be switched from a small value to a large one by a tiny change in logic swing ΔV.

$$Ic = A \exp(\beta Vbe) \quad (1)$$

where A is a constant dependent upon device dimensions and the material structure and β is equal to q/kT, where q is the unit electrical charge, k is Boltzmann's constant and T is the absolute temperature. In the large-current region, the curve shown in FIG. 5(b) deviates from the exponential characteristic due to a resistance between the emitter and the base.

The source-drain saturation current Idss of the FET in the large-current region is expressed approximately as a quadratic function of (Vg−Vth) as shown in Equation (2) given below:

$$Idss = K(Vg - Vth)^2 \quad (2)$$

where Vg is the gate voltage. For values of the gate voltage Vg close to the threshold voltage Vth, the source-drain saturation current Idss deviates from Equation (2). It is therefore a usual practice to determine the threshold voltage Vth by extrapolation from a plot showing a relation between the square root of the source-drain saturation current Idss and the gate voltage Vg. The relation and the extrapolation based on the relation are shown in FIG. 6. A residual source-drain saturation current Idssres is a source-drain saturation current Idss at the gate voltage Vg with the threshold voltage Vth as taken as a reference as shown in FIG. 6. The residual source-drain saturation current Idssres has something to do deeply with the standby-state power of the complementary BiFET as will be described-below.

If a hetero junction of compound semiconductor materials is used, the maximum value of K is of the order of 5 to 20 mA/V² for a transistor width W of 10 μm and a gate length Lg in the range 0.1 to 0.5 μm. In the case of a bipolar transistor having the same dimensions, on the other hand, an equivalent value of K is of the order of 25 to 50 mA/V², which is greater in magnitude than the hetero junction's K by more than one digit. The residual source-drain saturation current Idssres, which is dependent upon, among other things, the device structure and the threshold voltage Vth, can be set approximately at a value in the range 0.1 to 50 μA.

Normally, with the logic swing ΔV (=Vg−Vth) of the 2DEG-FET set at a value in the range 400 to 800 mV, the 2DEG-FET can most likely be operated at the highest circuit operational speed. In this case, the source-drain saturation current Idss is approximately of the order of 1 to 7 mA.

In the case of an n-channel silicon MOSFET having a transistor width W of 10 μm and a gate length Lg of 0.1 to 0.2 μm, the source-drain saturation current Idss is about 3 mA or smaller for a logic swing (Vg−Vth) of 1.5 V which corresponds to a power-supply voltage of 2 V. In the case of a p-channel MOSFET, the source-drain saturation current Idss is of the order of 1.5 mA. That is, when evaluating the 2DEG-HBT in terms of FET operations, current flowing in the 2DEG-HBT is capable of having a magnitude one to two times as much in comparison to an n-channel MOSFET which has a power-supply voltage of 2 V. In this case, the required logic swing is only one-fourth to one-third. In other words, when viewing the 2DEG-HBT of the GaAs family as a FET, the load driving power is about one to two times as much and the speed is higher by as much as several times in comparison to those of an n-channel MOSFET. Used in conjunction with a FET in a complementary BiFET is a high-speed pnp bipolar transistor having a high load driving power. The use of such a pnp bipolar transistor gives rise to a speed higher than that of an ordinary CMOS LSI device made up of silicon by at least a one-digit difference.

Taking the single inverter shown in FIG. 1(a) as an example, the following description explains conditions of the threshold voltage Vth of the FET, the collector-current cut-off voltage Vtp of the bipolar transistor and the power-supply voltage Vdd which are required for normal operation. Operating regions of the FET/bipolar transistors at different values of the input voltage Vin supplied to the single inverter are shown in FIG. 6(b). With an input voltage of the single inverter set at a value of 0 V, the bipolar transistor operates. As for the FET portion, the gate voltage Vg is 0 V and the source-drain saturated current Idss flows even for Vg=0 V. At that time, the consumed power P is expressed by Equation (3) as follows:

$$P = Idss(Vg=0\ V) \times Vdd \quad (3)$$

It is obvious from Equation (3) that the determination of the value of Idss for Vg=0 V in accordance with the circuit design is important. For example, for a Vth greater than 0 V, Idss is equal to Idssres. In this case, power P expressed by Equation (4) below is consumed:

$$P = Idssres \times Vdd \quad (4)$$

For a Vth smaller than 0 V, on the other hand, Idss for Vg=0 V is greater than Idssres. However, the value of the current flowing through the FET for the logic swing (Vg−Vth) can be increased for the same Vg. In this way, the performance of the FET can be enhanced. In this case, however, much power is inevitably consumed. Nevertheless, the operating speed is increased. In a normal application aimed at a low power consumption even at the expense of performance to a certain degree, the threshold voltage Vth is set at a value in a range expressed by Equation (5) as follows:

$$0\ V \leq Vth \leq 0.30\ V \quad (5)$$

In an application intended for high performance in which high-power consumption is tolerable, on the other hand, it is desirable to set the threshold voltage Vth at a negative value.

The threshold voltage Vth of the FET employed in the 2DEG-FET is approximated in terms of principal parameters by Equation (6) as follows:

$$Vth = Eg(AlGaAs) - \Delta Ec - qNDd^2(1+ND/NA)/(2\epsilon_1) + sqr$$

$$[2q\epsilon_1 NAA(2kT<ln(NAA/ni)>q+VSB)+X]/\epsilon_1-Y \qquad (6)$$

where sqr and ln is the square-root and natural-logarithm notations respectively, whereas X and Y are expressed by Equations (7) and (8) respectively as follows:

$$X \equiv NNA(NAA/N\beta-1)(qN\beta Wcd/\epsilon_1)^2/N\beta \qquad (7)$$

$$Y \equiv NAA(N\beta-1)(qN\beta Wcd/\epsilon_1) \qquad (8)$$

In Equation 6, Eg(AlGaAs) is the energy-band gap of a p-type AlGaAs layer 36 of the emitter, ΔEc is the discontinuity of the conduction band between an undoped GaAs layer 34 created in a 2DEG layer 38 and the p-type AlGaAs layer 36. It should be noted here that the layers are piled up one on another in the same multilayer/film structure as those shown in FIGS. 1(b) and 2(a). In addition, ND and d are the doping level and film thickness respectively of an n-type AlGaAs layer 35 of the metallurgical base. NA is the doping level of the p-type AlGaAs layer 36 of the emitter. $E_1$ is the dielectric constant of AlGaAs. In this case, differences in Al composite ion between emitter, base and collector layers are ignored. Wc is the film thickness of the undoped GaAs and AlGaAs layers 34 and 33 of the undoped collector layer. NAA and ni are the impurity concentration and the intrinsic concentration respectively of the sub-collector layer 32 of the p-type AlGaAs layer. Nβ is the impurity concentration of the undoped GaAs and AlGaAs layers 34 and 33. Finally, VSB is a substrate bias for controlling the potential of the p-type embedded layer 32, the sub-collector layer of the p-type AlGaAs layer.

As an FET, the threshold voltage Vth of the 2DEG-HBT can almost be expressed by Equation (6) as described above. At the stage of determining actual parameters for the multilayer structure comprising a plurality of films piled up one on another, the value of the threshold voltage can thus be set in accordance with the type of circuit and the circuit performance at which the design is aimed.

In the case of the 2DEG-HBT, on the other hand, the bipolar transistor and the FET have the same multilayer/film structure. Therefore, for the bipolar transistor, a positive threshold voltage of the FET means a normally-off bipolar transistor which indicates a punch-through state between the emitter and the collector. Accordingly, a punch-through collector current Icres unavoidably flows even for a small value of Vbe. In the case of a small threshold voltage Vth in the range 0 to 0.15 V, however, the punch-through collector current Icres is extremely small so that it can be ignored. In addition, for a small value of Vbe, the 2DEG is induced merely to a slight extent, giving rise to an increased base resistance rbb'. In a region where the collector current density is sufficiently increased, however, the 2DEG is excited adequately. Thus, the base resistance rbb' decreases, reflecting an increased mobility of the 2DEG.

The phenomenon described above is a feature offered by a 2DEG-HBT in which the 2DEG is created in the collector layer. Ic-versus-Vce characteristics of the 2DEG-FET are shown in FIG. 7.

Changes in FET and bipolar-transistor states are shown in FIGS. 8(a) to (e) which correspond to Regions (I) to (V) shown in FIG. 2(b) respectively. To be more specific, a state in which a small current is flowing through the FET with an initial input voltage Vin of 0 V, is shown in FIG. 8(a). The 2DEG-HBT transits through a state shown in FIG. 8(b) to a state of FIG. 8(c) in which both the FET and the bipolar transistor are turned on. The state shown in FIG. 8(e) is opposite to that of FIG. 8(a). In the state shown in FIG. 8(e), the bipolar transistor is off, producing an output voltage approaching 0 V. As the input voltage is varied from 0 V to Vdd, the flowing inverter currents Ic and Id change as shown in FIG. 9(a). The range of the input voltage which causes the inverter to switch is divided into three regions: (II), (III) and (IV). Region (II): Vth<Vin(Vg)<Vtc This region corresponds to the state shown in FIG. 8(b). The current flowing through the inverter is the saturation current of the FET which is expressed by Equation (9) as follows:

$$Idss=K(Vin-Vth)^2 \qquad (9)$$

Region (IV): Vtc<Vin(Vg)<(Vdd-Vtc)

This region corresponds to the state shown in FIG. 8(d). The current flowing through the inverter is the current of the bipolar transistor in the active region Ic which is expressed by Equation (10) as follows:

$$Ic=A\{\exp[-\beta(Vin-Vdd+Vtp)]-1\} \qquad (10)$$

Region (III)

In this region, the source-drain current Idss of the FET in the saturation region is equal to the collector current Ic of the bipolar transistor in the active region.

It should be kept in mind that, for a low input voltage, the bipolar transistor is in an ON state, allowing the base current Ib to flow and, for a high input voltage, on the other hand, the FET is in an ON state, allowing the gate current Ig to flow. These states are shown in FIG. 9(b). These two currents Ig and Ib are both different from those of a CMOS inverter and cause the standby-power consumption by the circuit to inevitably increase. As will be described later, however, a significant solution to this problem has been found.

Next, requirements for high-speed switching operations are described. Let Δf and Δb be input logic swings of the FET and the bipolar transistor in the course of switching respectively. Δf and Δb are expressed by Equations (11) and (12) respectively as follows:

$$\Delta f \equiv Vtc-Vth \qquad (11)$$

$$\Delta b \equiv (Vdd-Vtp)-Vtc \qquad (12)$$

First of all, Δf and Δb must each have a positive value. In order for the current flowing in the course of switching to drive a load borne by the inverter at a sufficiently high speed, it is necessary for an adequate current to flow in each of the FET and the bipolar transistor. That is, the input logic swings Δf and Δb must each have a range of proper values.

In other words, in the case of a hetero structure of the GaAs/AlGaAs family, ranges indicated by Equations (13) to (18) are appropriate.

$$\Delta f = 400 \text{ to } 600 \text{ mV} \qquad (13)$$

$$\Delta b = 100 \text{ to } 300 \text{ mV} \qquad (14)$$

$$Vtp = 1.4 \text{ to } 1.5 \text{ V} \qquad (15)$$

$$Vth = 0 \text{ to } 0.15 \text{ V} \qquad (16)$$

$$Vdd = 1.9 \text{ to } 2.55 \text{ V} \qquad (17)$$

where Vdd≡Vth+Δf+Δb+Vtp. An effective swing ΔV of the input potential is defined by Equation (18) as follows:

$$\Delta V \equiv Vth+\Delta f+\Delta b \qquad (18)$$

From the above ranges and definition, standard values for the above quantities are found as follows: Vth=0.1 V, Vtp=1.4 V, Δf=500 mA, Δb=150 mV, Vdd–2.15 V and ΔV=750 mV.

From the current-versus-voltage characteristic at switching shown in FIG. 9(a), it can be said that the greater the value of Imax and the smaller the swing width from Vth to (Vdd–Vtp), the better the performance.

In the case of a complementary BiFET, the aforementioned k, $E_2(2)$, values of the FET and the bipolar transistor can be made greater than that of a CMOS device. Accordingly, the complementary BiFET has a higher speed and lower power consumption than those of a CMOS device.

Next, characteristics of three connected inverters are described by referring to FIG. 10 in order to show an effect of the base current Ib of the bipolar transistor and the gate current Ig of the FET on the complementary BiFET. The three inverters are called the left, center and right inverters. First of all, the problem of a single converter shown in FIG. 1(a) is clarified through an operational analysis of multiple connected complementary BiFETs and a solution to the problem is found. In the state shown in FIG. 10(a), the input to the left inverter is set to a high level indicated by the H notation and, hence, the output of the right inverter is pulled to a low level denoted by the L notation. Current paths are shown by solid and dotted lines which indicate large and small currents respectively. Ib denotes the base current of the bipolar transistor whereas Ic is the collector current thereof. Id and Ig denote the drain and gate currents of the FET respectively. A subscript appended to each current show an inverter through which the current flows.

A role played by the substrate biased electrode 46 of the junction gate 2DEG-FET shown in FIG. 1(b) is important. As is generally known, the p buffer layer of an n-channel FET gives not only a positive effect such as suppression of a short-channel effect, but also a negative effect of, among other things, giving rise to an increase in parasitic-gate capacity. In this case, the potential of the p buffer layer is rarely in an unfixed (or floating) state. Usually, it is set at a fixed value of the source potential. However, the junction gate 2DEG-FET shown in FIG. 1(b) can also be regarded as a bipolar transistor with two existing base electrodes. In this case, the p buffer layer plays the role of the collector layer. Therefore, the potential of the p buffer layer is very important.

With regard to the potential of the p buffer layer, the following three cases are possible:

(1) The potential of the p buffer layer is set at the source potential.

(2) The potential of the p buffer layer is set at the gate potential.

(3) By devising the structure of the device, the p buffer layer of the FET part is eliminated.

In the first case in particular, the gate current Ig is the sum of the collector current and the base current corresponding to the so-called gammer plot with the base and the collector shorted. In this case, the gate current Ig is different from the gate current of an ordinary junction gate FET which corresponds to the third case. In the second case, two gates exist, sandwiching an active layer to produce a gate leak current.

Next, characteristics of the three independently connected inverters are explained qualitatively. The explanation is based on power consumption by the complementary BiFET of FIGS. 1(a) and (b) provided by the present invention. Here, "independently" means ignoring effects of a current Ig0 flowing into the input terminal of the left inverter and a current Ig3 flowing into the input terminal of the right inverter. In addition, there are three cases as described above as far as the potential of the FET's p buffer layer is concerned. Nevertheless, only the first case is explained in outline. The reason why the first case is explained is because, in the first case, power is consumed most. In the other two cases, on the other hand, only little power is consumed, giving rise to no problems. Input/output characteristics of the center inverter shown in FIG. 10(a) are shown in FIG. 10(b) in the same form as that of FIG. 2(b). $Vout^2$ shown in FIG. 10(b) is defined as an input voltage at an intersecting point of a dotted line representing (Vbc=0) and an inverter input/output curve. This input voltage $Vout^2$ is in a state of the inverter's characteristic (III), corresponding to $Vout^2$ shown in FIG. 8(c). The vertical axis of FIG. 10(b) represents the output voltage Vout, the potential of the source-drain voltage Vsd of the FET portion. On the other hand, the input potential Vin, the potential of the gate voltage Vg of the FET portion, is represented by the horizontal axis. Vss is defined as a source-drain voltage in transition from the non-saturation region to the saturation region in the I-V characteristic of the FET. Vss is a function of (Vg–Vth) shown by a dotted line in the figure. As shown in the figure, for (Vg–Vth)=0 V, Vss=0 V. $Vout^3$ is defined as an input voltage at an intersecting point of this function and the inverter input/output curve. This input potential $Vout^3$ is in a state of the inverter's characteristic (III), corresponding to $Vout^3$ shown in FIG. 8(c).

Next, current-voltage characteristics of the complementary BiFETs on both sides of the center complementary BiFET are explained by referring to FIGS. 11 to 17. The current-voltage characteristics of the left and center complementary BiFETs are shown in FIGS. 11(a) to 17(a) whereas the current-voltage characteristics of the right and center complementary BiFETs are shown in FIGS. 11(b) to 17(b). The law of conservation applies to current in each state. The current-voltage characteristics for the input voltage Vin held at a minimum value, that is, for Vin=VL are shown in FIGS. 11(a) and(b). At that time, a base current Ibmax and a gate current Igmax flow as standby currents. As the input potential Vin is increased, the complementary BiFETs transit through the states shown in FIGS. 12, 13 and 14 and then through the state shown in FIG. 15(b), wherein a collector current Ic2 of the center complementary BiFET is equal to a source-drain current Id2 thereof and Imax denotes a maximum current flowing at that time, and get settled in the states shown in FIGS. 17(a) and(b), figures showing current-voltage characteristics for Vin=VH. In these states, the input voltage Vin has reached a maximum value. Also at that time, the base current Ibmax and the gate current Igmax flow as standby currents. It should be noted that, in spite of the fact that the base current Ibmax and the gate current Igmax also depend upon device dimensions, in the case of an ordinary logic memory circuit, they can each easily and unavoidably have a magnitude ranging from several mA to several tens of mA. The only way to decrease the magnitudes of these currents is to lower the power-supply voltage Vdd. However, a low power-supply voltage Vdd will also reduce the logic swings of the FET and bipolar transistors and decrease the circuit speed as well. By keeping the power-supply voltage Vdd as it is, power consumption is of the same order as the complementary circuit of the GaAsFET shown earlier. In comparison to the DCFL logic having a depletion-type FET of the compound-semiconductor GaAsFET as a load and an enhancement-type FET as a driver, the consumed power is merely one-tenth while the circuit speed is two to four times as much. For further details of the DCFL circuit, refer to, for example, M. Abe, et al,. HEMT LSI technology for high speed computer, Tech. Dig. GaAs IC Symposium, P. 158, 1983.

If compared to CMOS logic, however, the power consumption is inevitably close to ten times as much in magnitude.

It is obvious from the description given above that, in order to further improve the characteristics, the following three are of importance to improve the circuit performance.

(1) In order to operate the bipolar transistor, it is indispensable that a base current flow. At the same time, in order to reduce the power consumption, however, it is indispensable to decrease the base current.

(2) In order to use the 2DEG-HBT as an FET, the structure of a device that is capable of lowering and suppressing the gate leak current is indispensable to the reduction of the power consumption.

(3) The input and output of the inverter are in an unbalanced state. To be more specific, even though the values of the effective input voltage are of the order of merely 0 to 1 V, the output range 0 to Vdd is too wide.

The following two means are used for solving the above problems.

In order to operate the bipolar transistor, it is impossible to set the base current at a value of zero. Therefore, a device with a maximum current Io and a current-voltage characteristic shown in FIG. 18(a) is connected to the base in order to replace a maximum base current Ibmax inevitably flowing at Vbe=Vdd with the maximum current Io. In this way, the maximum current that flows through the base is Io. The device is designed so as to give an Io in the range 0.1 to 100 μA. The power consumption can thus be suppressed. The value of Io is smaller in magnitude by a more-than-one-digit difference than the maximum base current Ibmax normally ranging from several mA to several tens of mA. With a base current equal to Io, however, the high-speed characteristic of the bipolar transistor cannot be sustained unless the collector current Ico is kept at a sufficiently large value.

It should be noted here, however, that with the reduction of the base current, the collector current and, hence, the load driving power are also decreased as well. Accordingly, the HBT is designed so as to sustain a large current amplification factor hfe at a value of the order of 1000 to 100,000. For example, an hfe in the range 1000 to 3000 is required for Io=1 μA. The maximum collector current Ibmax is expressed by Equation (19) as follows:

$$Ibmax = hfe \times Io \quad (19)$$

Accordingly, power dissipated by the current Io can be expressed by Equation (20) as follows:

$$P = Vdd \times Io \quad (20)$$

That is to say, if the power consumption can be determined to meet system requirements, the maximum base current can also be found accordingly. The maximum collector current Ibmax is determined in accordance with a speed requirement. The current amplification factor hfe can be found from the maximum base current Io and the maximum collector current Ibmax by using the relation expressed by Equation (20). The current amplification factor hfe is, in turn, used for determining the structure of the device.

Due to the addition of a current limiting device for limiting the base current as described above, a gammer plot with the base and the collector shorted varies as shown in FIG. 18(b). As shown in the figure, the collector current is saturated because the base current is limited so as not to exceed Io. In the figure, variations with and without a current limiter are shown by solid and dotted lines respectively. As indicated by Equation (19), the collector current is suppressed at Ibmax=hfe×Io by the base current Io. It is thus necessary to have a sufficiently large current amplification factor hfe in accordance with a speed requirement of the circuit so as to prevent the load driving power from deteriorating.

On the other hand, the gate leak current can also be reduced by inserting a diode in series with the gate. That is to say, since the voltage applied to the gate of the FET can thereby be kept within the range 0 to 1 V, Igmax can be reduced from a value ranging from several mA to several tens of mA to a value in the range 0.1 to 100 μA. The value of the gate leak current Igmax is dependent upon the voltage shift quantity ΔV of the diode, the power-supply voltage Vdd and the shape of the diode which are variable design parameters. It is necessary to design such a diode that the capacity thereof does not considerably lower the speed of the circuit. From the high-speed point of view, it will be undesirable to use a diode of the pn-junction type that gives rise to a storage effect of minority carriers. With compound semiconductor materials, an excellent hetero junction can be created. Diode characteristics can thus be implemented by using the hetero junction. Details are explained in the description of embodiments.

The voltage shift quantity ΔV can be set at a desirable value in the range 0 to 1 to 2 V. Two different types of actual inverters shown in FIGS. 19(a) and (b) are possible. The difference between the two types is the location in which the diode is inserted. Let the voltage shift quantities of the diodes inserted in the inverter types shown in FIGS. 19(a) and (b) be ΔVgd and ΔVdd respectively. In the case of the inverter type shown in FIG. 19(a), the diode is directly connected to the gate of the FET. In this case, however, the input and output potentials of the inverter vibrate over the range 0 to Vdd, inevitably increasing the logic swing to an excessive value.

In order to solve this problem, the diode is inserted on the collector side of the bipolar transistor as shown in FIG. 19(b). In this case, the range of the input and output potentials of the inverter can be narrowed down to 0 to (Vdd−ΔVdd). Accordingly, the unbalance of the input/output characteristics can be improved. An effect of the voltage shift quantity ΔVdd on the circuit performance is a problem of a possible lack of power-supply voltage in a circuit comprising three input NAND gates and three input NOR gates in which three FETs and three bipolar transistors are each vertically cascaded. In either inverter scheme described above, only one diode is employed. It should be noted, however, that a plurality of diodes can also be inserted depending upon the magnitude of ΔV, the voltage to be shifted. In addition, a combination of the two types of FIGS. 19(a) and (b) can also be adopted as shown in FIG. 20.

Improvements of operating characteristics of a complementary BiFET with such a diode inserted therein are described by referring to FIGS. 21 and 22. Typical improvements of current-voltage characteristics of multiple connected inverters are shown in FIGS. 21(a) and (b) which correspond to FIGS. 11(a) to (b) respectively. Current-voltage characteristics of the left and center inverters of the multiple connected inveters improved by means of diodes are shown in FIG. 21(a). To be more specific, the characteristics have been plotted with a low input supplied to the connected inverters and, hence, a high output thereby produced. The connected inverters are those shown in FIG. 10(a) which employ complementary BiFETs with diodes inserted therein as shown in FIGS. 18, 19 and 20. As shown in FIG. 21(a), the current limiter suppresses the base current Ib1 to Io. The source/drain voltage Vsd corresponding to the source/drain current Io of the FET with a high voltage applied thereto gives a low level VL of the inverter. (The I-V characteristic is shown by a dotted line). On the other hand, the current-voltage characteristics of the right and center inverters are shown in FIG. 21(b). As shown in the figure, an offset voltage ΔVdd is resulted in on the Ic-Vce characteristic of the bipolar transistor due to the insertion of the diode on the collector side. As for the FET, the building-up voltage of the gate leak current Ig2 is shifted from Vfn to ΔVgd due to the connection of the diode to the gate of the FET. The current flowing at that time is Ig0. A dotted line shown in the figure represents an I-V characteristic with no inserted diode. At that time, the high level VH of the inverter is expressed by Equations (21) and (22) for ((Vfn+ΔVgd+ΔVdd)≦Vdd) and ((Vfn+ΔVgd+ΔVdd)>Vdd) respectively.

$$Vfn+\Delta Vgd \leq VH \ Vdd+\Delta Vdd \quad (21)$$

$$VH \doteq Vdd \quad (22)$$

Next, typical I-V characteristics of the center inverter are illustrated in FIGS. 22(a) and (b) which show states corresponding to FIGS. 8(a) and (b) respectively. In this case, if a relation expressed by Equation (23) holds true for FIG. 22(b), the circuit speed is increased.

$$Vout2-Vout3 > \Delta Vdd \quad (23)$$

At that time, basically, the I-V characteristic of the inverter itself shown in FIG. 9(a) does not change. It should noted here, however, that the leak currents Ibmax and Igmax shown in FIG. 9(b) are suppressed to Io and Ig0 respectively.

As is generally known, any arbitrary logic circuit can in general be implemented if the configuration thereof comprises NAND and/or NOR gates. Applications of the present invention to three-input NAND circuits shown in FIGS. 23 to 26 and three-input NOR circuits shown in FIG. 27 to 30 are described. The description is followed by explanation of general requirements for operating these circuits at a high speed. Let Vss be a source-drain voltage at which a single FET is saturated and Vcess be an emitter-collector voltage at which the bipolar transistor transits from the saturation region to the non-saturation region of the inverter characteristic shown in FIG. 8(c) corresponding to the region (III) shown in FIG. 2(b).

In the case of a NAND circuit, in order for a three-input NAND circuit to operate at a high speed, it is necessary to meet a condition expressed by Equation (24):

$$3Vdss+Vcess+\Delta Vdd \leq Vdd \quad (24)$$

As for the three-input NOR circuit, a condition expressed by Equation (25) needs to be met:

$$Vss+3Vcess+\Delta Vdd \leq Vdd \quad (25)$$

In addition, it is desirable to have a small ΔVgd in order to sustain the performance of the FET. In actuality, when designing a circuit, ΔVdd and ΔVgd had rather be considered separately depending upon the objective of the design.

By inserting a current limiter or a diode as described above, the stand-by power consumption per gate can be reduced to several μW to several tens of μW. In a design example of a logic circuit in which the complementary BiFET serves as the basic configuration thereof, a propagation delay time in the range 1 to 10 psec resulting in an ultra-high speed, and ultra-low power consumption less than 10 μW can be both realized simultaneously.

Next, memory circuits which are implemented by circuit configurations each adopting the complementary BiFET provided by the present invention are shown in FIGS. 31 and 32. FIGS. 31 and 32 show embodiments implementing basic memory circuits of SRAMs (Static Random-Access Memories) in accordance with the present invention. Here, explanation of individual operations of each circuit is omitted. At any rate, each circuit can operate at a high speed, consuming only low power. As for the manufacturing processes, the photolithography can be carried out merely two to three times whereas the cell surface can be reduced to one half to one-third because, in the case of the 2DEG-HBT, the FET and the bipolar transistor can be created into the same epitaxial structure.

In addition, the 2DEG-HBT is characterized in that, built into a single multilayer structure, the various circuits described above can be created using almost the same process by merely changing the mask pattern. In the case of an LSI device made up of silicon, a variety of components and circuits can be created mainly by injection of ions into a silicon substrate. On the other hand, a hetero-junction device made up of the GaAs compound semiconductor material offers an important process feature that a variety of components and circuits are created using an epitaxial growth technology such as the MBE, MOCVD and MOMBE. It is thus necessary to create essential portions of necessary components initially. In this case, the fact that more components can be created in the same epitaxial structure is useful for the design of the target system. The 2DEG-HBT is an element that has such a characteristic.

Finally, an offset voltage is explained. In the case of an ordinary DHBT, an offset voltage Vceoff shown in FIG. 6(a) appears in the Ic-Vce characteristic as is generally known due to, among other causes, a difference in building-up voltage between the base-emitter current and the base-collector current. The principle of operation of a complementary BiFET with such an existing offset voltage Vceoff can be basically understood by considering that the offset voltage Vceoff is added to ΔVdd. It is possible to determine how an offset voltage Vceoff is set by the multilayer structure of the device cross-sectional diagram in accordance with the performance such as the speed and power consumption of the circuit to be implemented.

In addition, by inserting a resistor RB in the base region of the bipolar transistor as shown in FIG. 20(b) as a substitute for a current limiter, the power consumption can also be reduced as well. However, it takes time to charge and discharge through the high-resistance resistor RB, giving rise to a small decrease in speed. In addition, with a current limiter used for limiting the base current to Io, a current flowing through the current limiter, when the transistor enters an ON state, the speed of the transient phenomenon is determined by the building-up characteristic of the current limiter, resulting in a high speed due to the low resistance of the current limiter. When the transistor enters an OFF state, on the other hand, a heavy load borne by the base inevitably reduces the speed due to the fact that the base current is limited to Io. When designing a circuit, this factor therefore needs to be taken into consideration accordingly.

BRIEF DESCRIPTION OF THE DRAWINGS

FIGS. 5(a), 5(b), 6(a), 6(b), 7, 8(a) to 8(e), 9(a), 9(b), 10(a), 10(b), 11(a), 11(b), 12(a), 12(b), 13(a), 13(b), 14(a), 14(b), 15(a), 15(b), 16(a), 16(b), 17(a) and 17(b) are diagrams used for explaining operating characteristics of a complementary BiFET provided by the present invention;

DESCRIPTION OF THE PREFERRED EMBODIMENTS

EXAMPLE 1

Figure 1A:
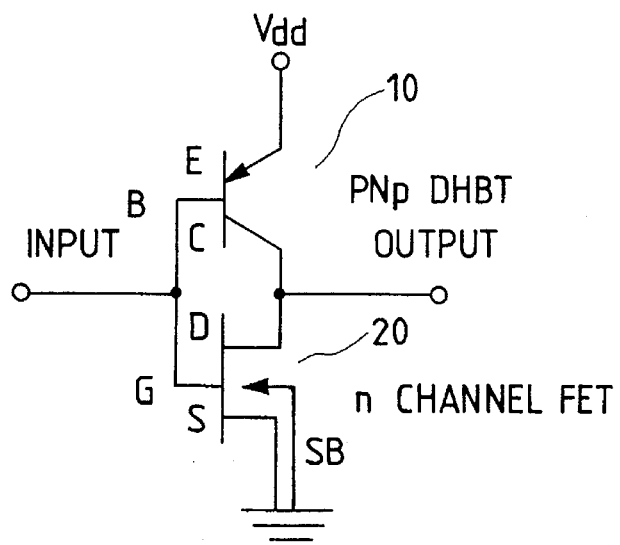
FIGS. 1(a) and (b) are diagrams showing a basic circuit and a cross-sectional structure of the present invention, respectively.
Figure 1B:
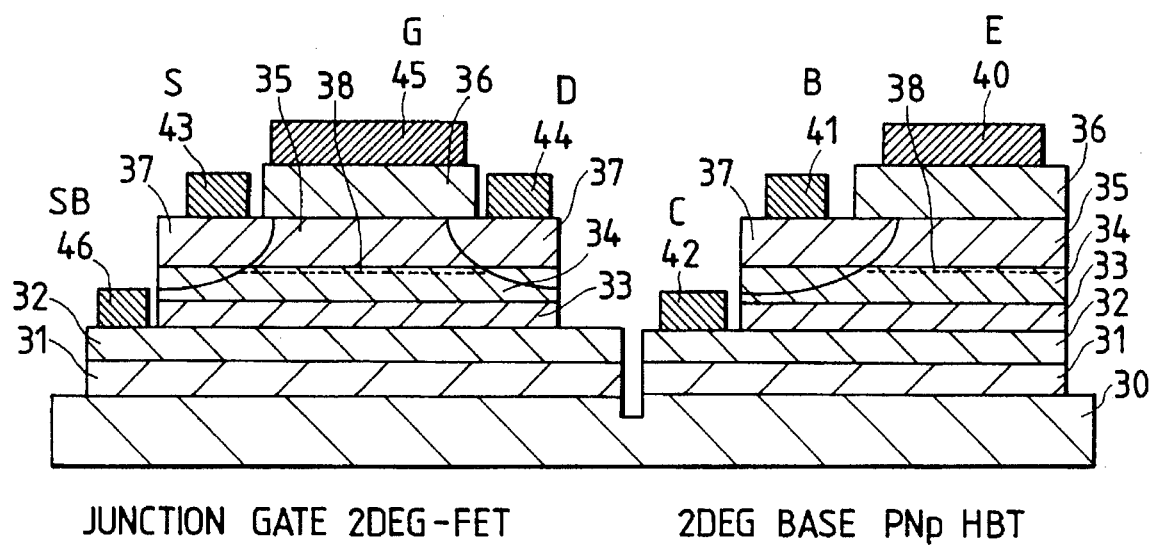
Figure 2A:
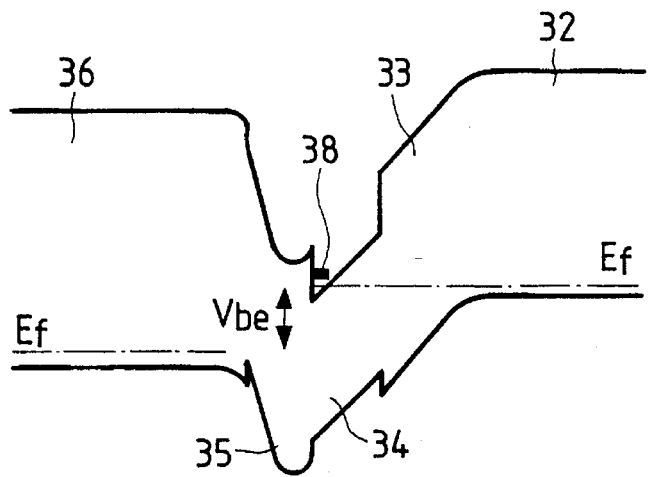
FIGS. 2(a) and (b) are diagrams used for explaining the basic structure and operating characteristics of the present invention, respectively.
Figure 2B:
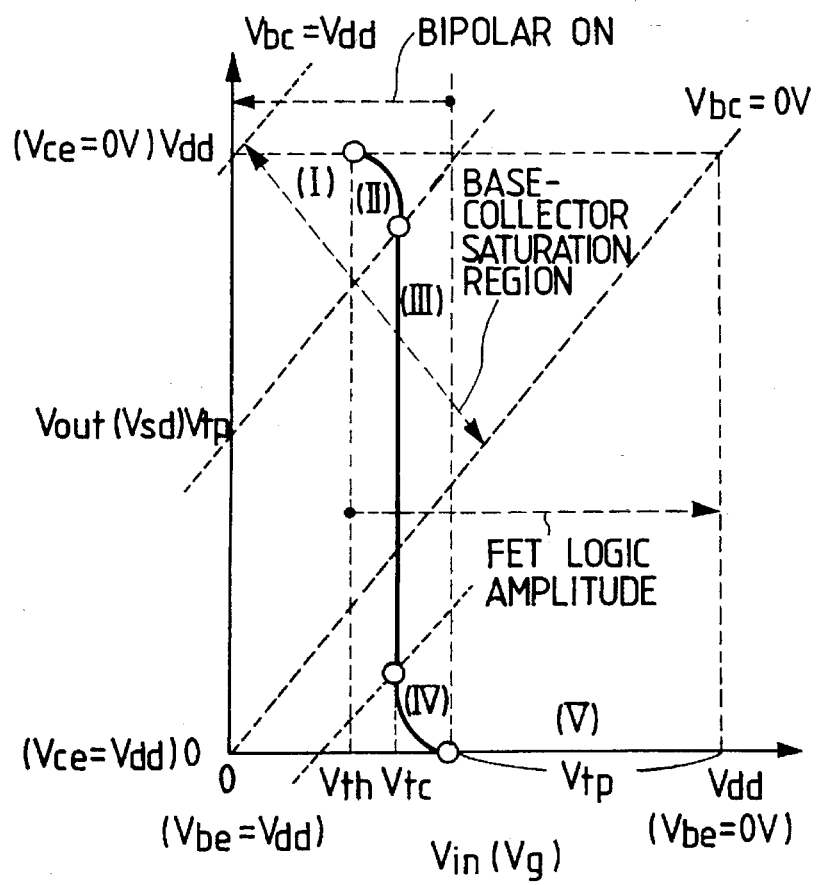
Figure 3A:
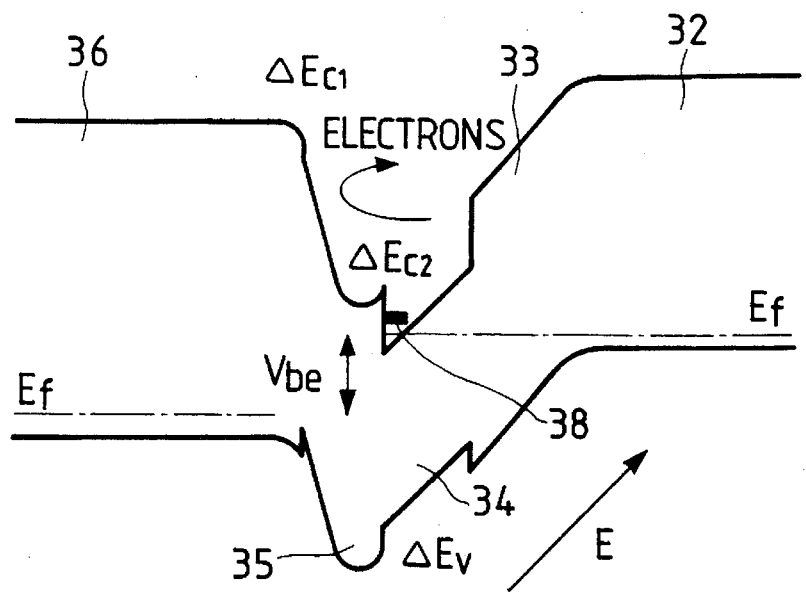
FIGS. 3(a) and (b) are an energy-band diagram of a double hetero junction 2DEG-FET and a diagram for explaining the energy band, respectively.
Figure 3B:
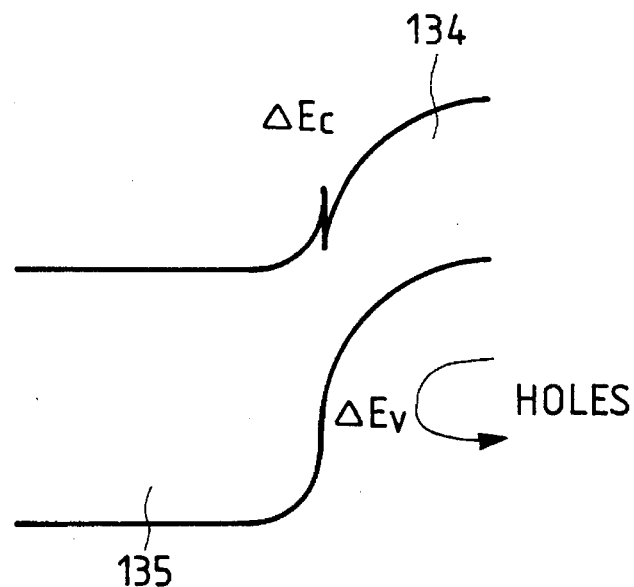
Figure 4A:
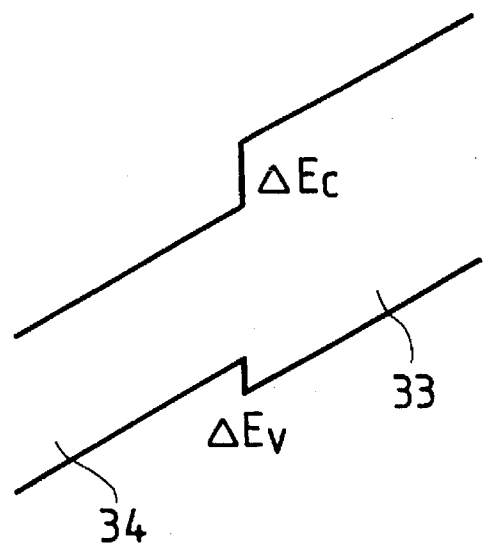
FIGS. 4(a) and (b) are an energy-band diagram of a double hetero junction 2DEG-FET and a diagram for explaining the energy band, respectively.
Figure 4B:
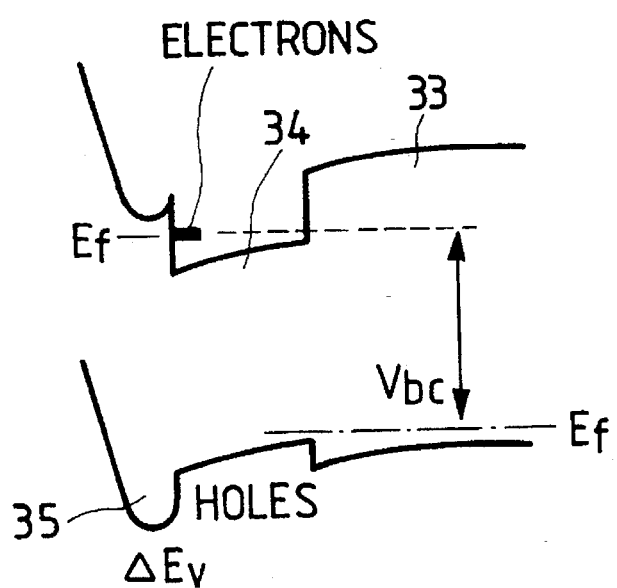
Figure 5A:
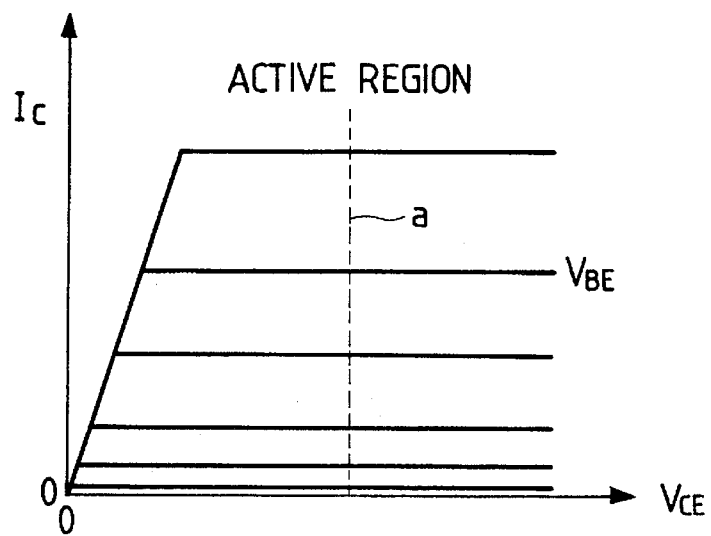
Figure 5B:
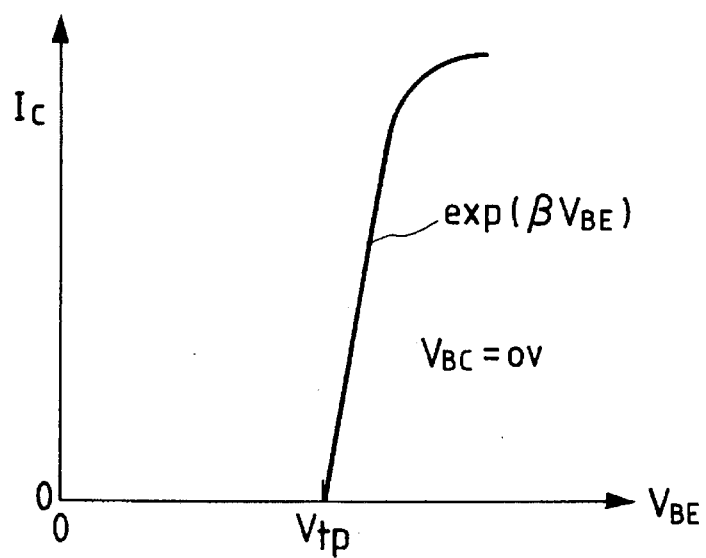

First of all, a basic structure of the present invention shown in FIG. 1(b) is described. By using an MBE (Molecule Beam Epitaxy) technique, a p-type GaAs layer 31 having a thickness of 400 nm and doped with Be at a concentration of $3\times10^{19}/cm^3$, a p-type $Al_xGa_{1-x}As$ (x=0.45) layer 32 with a thickness of 400 nm and the same doping level, an undoped layer $Al_yGa_{1-y}As$ (y=0.45) layer 33 with a thickness of 300 nm, an undoped GaAs layer 34 with a thickness of 30 nm, an n-type $Al_zGa_{1-z}As$ (z=0.30) layer 35 having a thickness of 25 nm and doped with Si at a concentration of $3\times10^{18}/cm^3$ and a p-type $Al_uGa_{1-u}As$ (u=0.45) layer 36 having a thickness of 200 nm and doped with Be at a concentration of $2\times10^{19}/cm^3$ are piled on a semi-insulating GaAs substrate 38 one after another to create a multilayer structure. After that, a heat-proof metallic film having a thickness of 300 nm and made of WSi is created. A gate electrode 45 on the side of the already known junction gate 2DEG-FET and an emitter electrode 40 on the side of a 2DEG base PNpHBT are then created. Next, by using the gate electrode 45 and the emitter electrode 40 as masks, exposed portions of the p-type $Al_uGa_{1-u}As$(u=45) layer 36 are removed, Si ions with a dose amount of $1\times10^{13}/cm^2$ are implanted by an acceleration voltage of 30 KeV and the Si is activated through a lamp anneal process for 30 seconds at 800 degrees Celcius in order to create a base, a source and a drain. An ion-implanted region 37 is then created for reducing the base resistance and the source-gate resistance. Much like an ordinary electrode, a source electrode 43, a drain electrode 44 and a base electrode 41 are subsequently created from an AuGe/Ni/Au multilayer film. Then, by using the emitter-base region and the FET region as masks, exposed portions of the semiconductor regions 35, 34 and 33 are removed by using an etching process. In order to further electrically separate the components from each other, the FET and bipolar-transistor portions are eliminated up to the substrate by using an etching process.

Subsequently, a collector electrode 42 and a substrate biased electrode 46 are created from an AuZn/Au multilayer film. The ordinary double-layer wiring technology is used to further connect the base electrode of the bipolar transistor to the gate electrode of the FET and the collector electrode of the bipolar transistor to the drain electrode of the FET. In this example, the substrate biased electrode 46 of the FET wired to the source electrode 43 of the FET is connected to the ground. On the other hand, the emitter electrode of the bipolar transistor is connected to a power-supply voltage Vdd of 2.0 V. In addition to Be, Mg (magnesium) or C (carbon) which hardly diffuse can also be used as a p-type impurity material. As for the crystal-growth technology, the MOMBE and MOCVD methods can also be adopted as well in addition to the MBE technique.

EXAMPLE 2

Figure 34A:
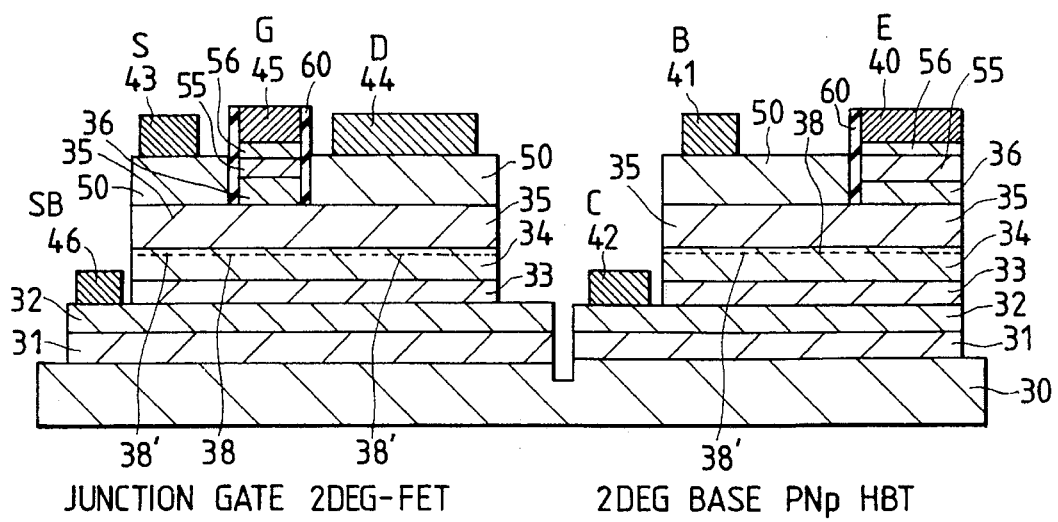
FIGS. 34(a), 34(b), 35(a), 35(b), 36(a), 36(b) and 37 are cross-sectional diagrams of embodiments of the present invention.

The threshold voltage Vth of the FET of the 2DEG-HBT implemented by the example 1 exhibits variations of plus and minus 0.1 V centering at 0.1 V for a gate length of 0.7 μm. In order to make the threshold voltage Vth controllable as well as to reduce the source-gate resistor Rsg, a p-type GaAs layer 55 having a thickness of 50 nm and containing Be at a concentration of $2\times10^{19}/cm^3$ and a p-type GaAs layer 56 having a thickness of 20 nm and containing Be at a concentration of $2\times10^{20}/cm^3$ are further created on the multilayer structure of the example 1. Following the processing of the gate portion after that, a selection-growth process is carried out by using the MOCVD (Metal Oxygen Chemical Vapor Deposition) technique as shown in FIG. 34(a) in order to create an n-type GaAs layer 50 having a thickness of 160 nm and a Si-doping level of $3\times10^{18}/cm^3$ in the source-gate region and the base region. In this case, the resistance of the source-gate resistor Rsg is 80 Ω when a transistor width is 10 μm. For Vg−Vth=0.6 V, the transconductance Gm is 350 mS/mm whereas the drain-source saturation current Idss is 1.05 mA. As a bipolar transistor, the characteristics include a current amplification factor hfe of 1,500 for a collector current Ic of 3.0 mA and emitter dimensions of $2\times3$ μm².

EXAMPLE 3

Figure 34B:
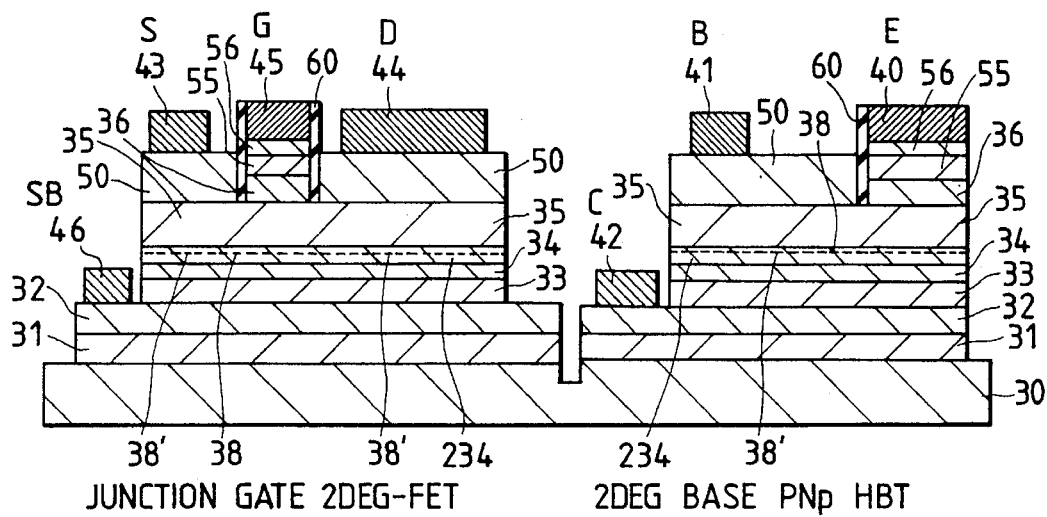

An embodiment of the present invention that gives a great current amplification factor hfe is shown in FIG. 34(b). In order to realize a great current amplification factor hfe using a 2DEG-HBT, basically, it is necessary to further reduce the injection of electrons from the 2DEG, which serves as the base, into the p-type $Al_uGa_{1-u}As$ (u=0.45) layer 36 of the emitter. To reduce the electron injection, an $In_wGa_{1-w}As$ high-purity material 234 having a band gap even smaller than GaAs, where w is the In composite, is inserted during the crystal-growth process onto the GaAs layer 34 to create a layer with a thickness of 20 nm. The same processing as the example 2 is carried out after the crystal-growth process. An In composite w of 0.15 is selected. This example has a current amplification factor hfe of 15,000 for emitter dimensions of 2×5 µm². This value of hfe is 10 times greater than that of the example 2 described above.

The Al composite u of the emitter layer 36 made of p-type $Al_uGa_{1-u}As$ can also be further increased from 0.45 to a greater value. In the case of such a distorted hetero junction, increasing the In composite or the film thickness of the $In_wGa_{1-w}As$ layer 234, where w is the In composite, worsens the crystal quality. For example, the film thickness is 10 nm for an In composite w of 0.3. The In composite can also be graded to be used as a substitute for the GaAs layer 34.

EXAMPLE 4

Figure 35A:
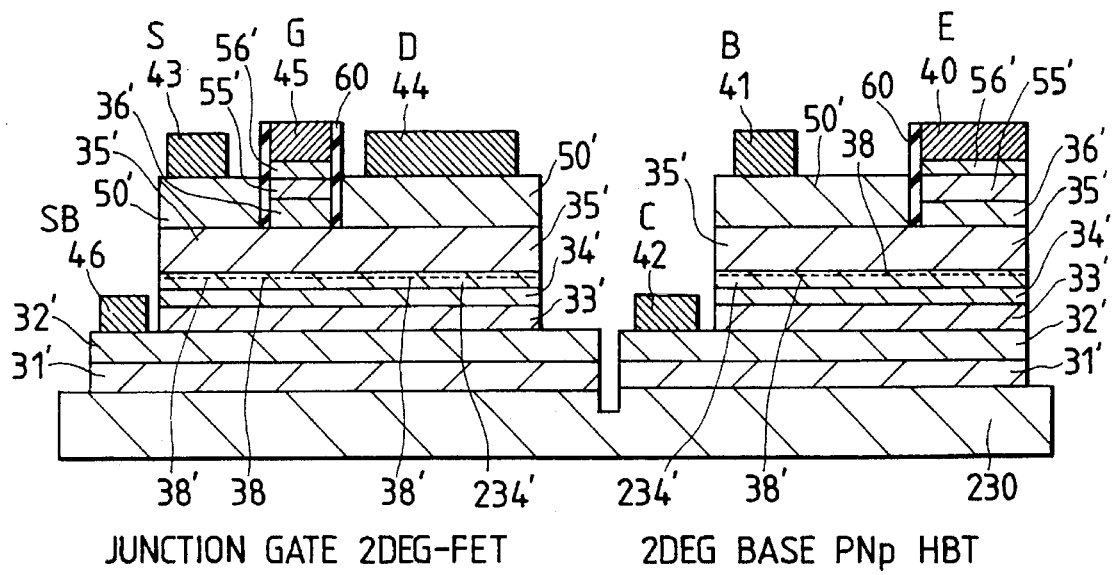

An embodiment that provides a still greater current amplification factor hfe is shown in FIG. 35(a). As shown in the figure, an undoped AlInAs layer with a thickness of 250 nm and an undoped AlInAs-GaInAs super lattice 31' with a thickness of 40 nm are created by means of the MBE technique on a semi-insulating InP substrate 230. Then, a p-type $Al_{0.48}In_{0.52}As$ layer 32' having a thickness of 400 nm and containing Be at a concentration of $4\times10^{19}/cm^3$, an undoped $Al_{0.48}In0.52As$ layer 33' having a thickness of 400 nm and an undoped $Ga_{0.47}In_{0.53}As$ layer 34' having a thickness of 40 nm are created. Next, an n-type $Al_{0.48}In_{0.52}As$ layer 45' having a thickness of 15 nm and containing Si at a concentration of $10^{19}/cm^3$, a p-type $Al_{0.48}In_{0.52}As$ layer 36' having a thickness of 200 nm and containing Be at a concentration of $4\times10^{19}/cm^3$, a p-type $Ga_{0.47}In_{0.53}As$ layer 55'm having a thickness of 40 nm and an equal impurity concentration and a p-type $Al_{0.47}In_{0.53}As$ layer 56' having a thickness of 20 nm and containing Be at a concentration of $4\times10^{20}/cm^3$ are piled one on another to create a multilayer structure. After an emitter electrode 40 and a gate electrode 45 are created using the already known technique, the p layers are removed by using an etching process. Then, an n-type $Ga_{0.47}In_{0.53}As$ layer 50' having a thickness of 160 nm and containing Si at a concentration of $10^{19}/cm^3$ is created by means of the MOCVD technique. Later on, techniques normally adopted in the manufacturing of a device of the AlInAs/GaInAs hetero family are used to form electrodes, to separate components from each other and to carry out other processing. As a result, a current amplification factor hfe of 5,000 is obtained for emitter dimensions of 1×2 µm². Since InGaAs is used as active layers in the FET of the examples 3 and 4, FET performance 1.5 to 2 times better than that of a device made up of GaAs is resulted in.

EXAMPLE 5

As described in the IEEE Transactions on Electron Devices, Vol. 38, No. 2, 1991, pp. 222 to 231 cited earlier, the characteristic of the bipolar transistor of the 2DEG-HBT is that the operating speed thereof is determined by the propagation time of the hole across the collector and the charging time of a parasitic capacitor between the base and the collector. With emitter dimensions of 1×10 µm², a base-collector parasitic-portion area of 10×10 µm², an undoped-collector film thickness of 150 nm and the cut-off frequency reaching a maximum value, the minimum charging time of the parasitic capacitance between the base and collector is as high as 0.75 psec. An embodiment for reducing the parasitic capacitance is explained by referring to FIGS. 36(a) and 35(b).

Figure 35B:
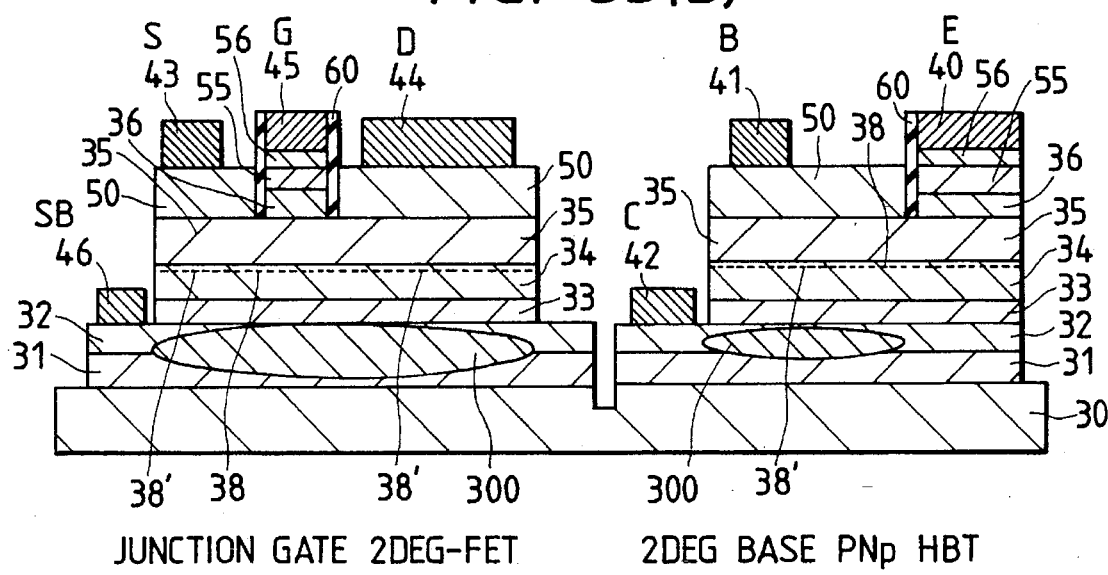

As shown in FIG. 35(b), after a p-type $Al_xGa_{1-x}As$ (x=0.45) layer 32 has been created, oxygen ions are injected into a base-collector region and a FET region. Thereafter, the process of creating an undoped $Al_yGa_{1-y}As$ (y=0.45) layer 33 and the subsequent processes for the example 2 including an anneal one are carried out for recovering the crystal qualities. It should be noted, however, that this embodiment does not have a p buffer layer so that the threshold voltage Vth of the FET is shifted to the negative side. It is thus necessary to lower the doping level of Si in the n-type $Al_zGa_{1-z}As$ (z=0.30) layer 35 to a value smaller than $2\times10^{18}/cm^3$. In this case, the 2DEG of the bipolar transistor of the 2DEG-HBT operates at Vbe=1.5 V, a level at which the punch-through collector current can be neglected. The subsequent processes are the same as those for the example 2. Requirements for the ion injection include an acceleration voltage of 150 keV and a dose quantity of $10^{13}/cm^2$. In this embodiment, the base-collector capacitance is reduced by 45% and the maximum value of the cut-off frequency is 120 GHz for an undoped-collector film thickness of 250 nm.

EXAMPLE 6

Figure 36A:
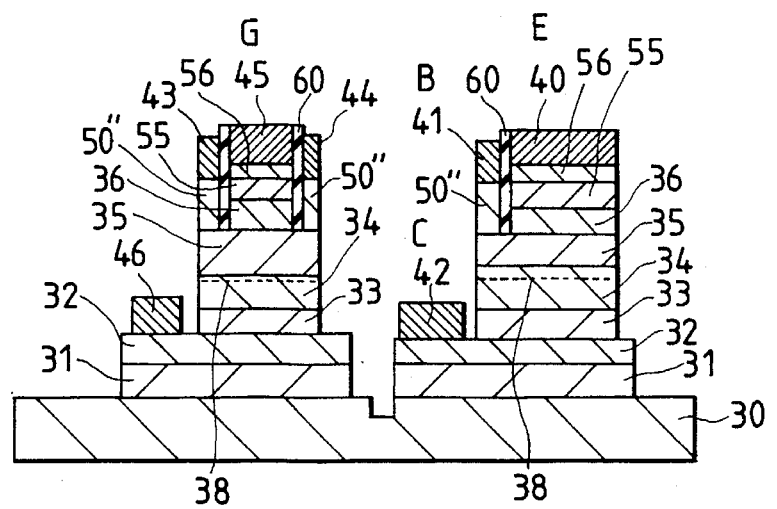

As shown in FIG. 36(a), instead of the n⁺GaAs regrowth layer 50, a graded layer 50" is grown from the GaAs through the InGaAs to replace the InAs. Then, source, drain and base electrodes are created from a non-alloy metal with high thermal durability such as WSi. By reducing the widths of the electrodes to values in the range 0.5 to 2.0 µm, the junction areas as well as the parasitic capacitance can be made smaller. In this case, the base-collector capacitance is reduced by 30% and the maximum value of the cut-off frequency is 90 GHz for an undoped-collector film thickness of 250 nm.

The creation of a complementary BiFET employing 2DEG-HBT has been explained so far. The following is description of techniques for implementing complementary BiFETs having similar device structures.

EXAMPLE 7

Figure 36B:
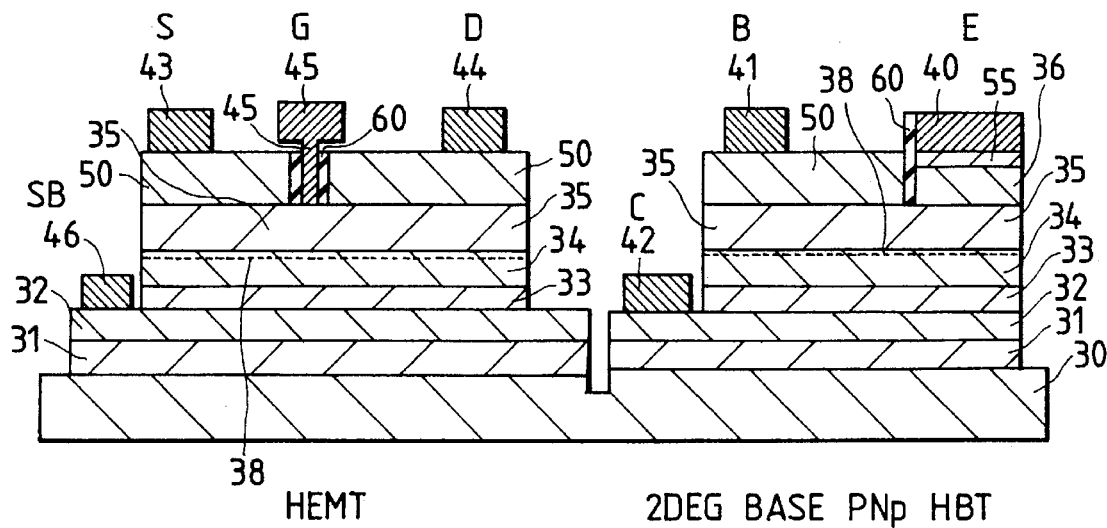

First of all, an embodiment implementing a complementary BiFET employing a HEMT (High Electron Mobility Transistor) is explained by referring to FIG. 36(b). An HEMT having a p buffer layer can be obtained by converting the gate structure of the pn junction in the FET operation of the 2DEG-FET into the gate structure of a Schottky junction. Therefore, the creation of the complementary BiFET is described by using the example 2.

In the case of the gate structure of the Shottky junction, the main term of Equation (6) expressing the threshold voltage Vth is the Schottky junction height Φbn which replaces the Eg(AlGaAs). Accordingly, the threshold voltage Vth is deepened by 0.5 V. It is thus necessary to lower the doping level of Si in the n-type $Al_zGa_{1-z}As$ (z=0.30) layer 35 to $2\times10^{18}/cm^3$. In this case, the 2DEG of the bipolar transistor of the 2DEG-HBT is turned on at Vbe=0.5 V. However, the punch-through collector current is held at a level that is not negligible. Thereafter, the p-type $Al_uGa_{1-u}As$ (u=0.45) layer 36 is removed in order to create a gate electrode 45 of the gate from a heat-proof metal. Then, an n+GaAs layer is regrown by means of the MOCVD technique. When it is desired to lower the gate resistance, a T-character-shaped structure can be adopted. In this case, an Mo/Au layer 45' can be used as the top portion of the T-character-shaped structure. The other processes are the same as those for the example 2. As an alternative, the film thickness of the n-type $Al_zGa_{1-z}As$ (z=0.3) layer 35 of the FET portion only can be made smaller by an etching process instead of changing the doping level.

EXAMPLE 8

Figure 37:
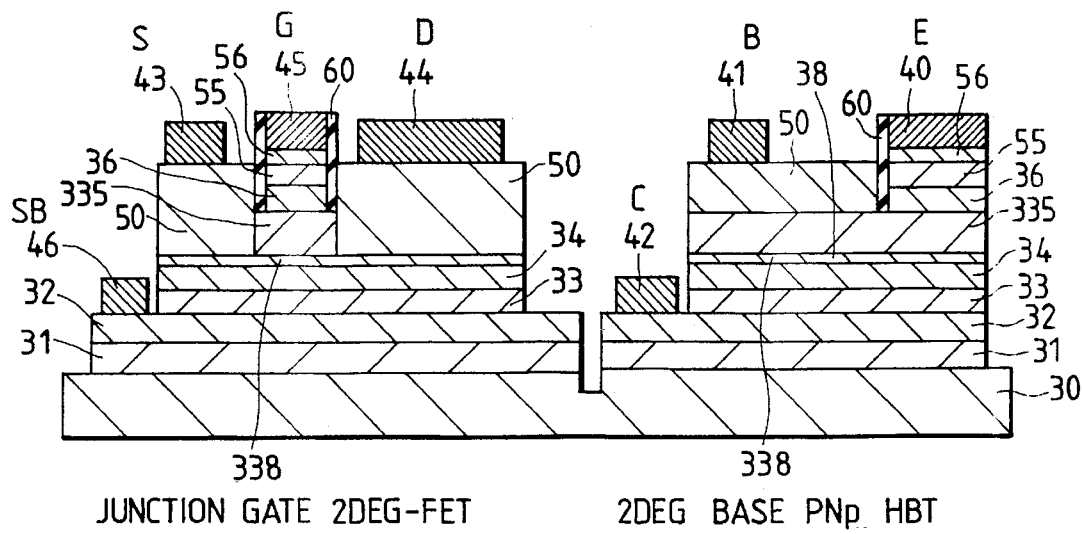

An embodiment in which a doped channel is used as a substitute for the 2DEG is shown in FIG. 37. After an undoped GaAs (y=0.45) layer 34 with a thickness of 10 nm is created as in the case of the example 2, an n-type GaAs layer 338 having a thickness of 10 nm and containing Si at a concentration of $3 \times 10^{18}/cm^3$ and an undoped $Al_zGa_{1-z}As$ (z=0.30) layer 335 with a thickness of 25 nm are created. Then, an emitter layer is piled as in the case of the example 2. The subsequent processes are the same as those for the example 2. An $In_uGa_{1-u}As$ layer can also be used as a substitute for the n-type GaAs layer 338 in order to enhance the performance of the FET and, hence, to increase the current amplification factor hFE. The reason why an undoped $Al_zGa_{1-z}As$ (z=0.30) layer 335 is inserted between the n-type GaAs layer 338, which serves as a base layer, and the emitter layer 36 is to realize a great current amplification factor for individual hetero barriers resulting from the creation of storage layer in the 2DEG in the case of Vbe greater than Vtp. In this case, however, the performance of the bipolar transistor is poorer than the operation using the 2DEG as the base. This is because the base layer is doped, giving rise to an excess time delay. The next description explains how to create a current limiter. One technique for creating a current limiter is to use the source-drain saturation current Idss(Vg=0 V) as the current of the current limiter Io, where Idss(Vg=0 V) is a source-drain current at a gate voltage Vg of 0 V with the source and the gate of the FET shorted. When applied to a complementary BiFET, the current mirror power Fo determines the stand-by consumed power Po. Accordingly, (1) It is necessary to suppress Io to a value in the range 0.1 to 50 μA. It is required that the stand-by consumed power Po be less than consumed power Ps at switching. The total power P consumed by the circuit is the sum of Po and Ps (=Po+Ps). In order to provide a low-power device, it is thus necessary to consider the reduction of P as a design principle.

(2) On the other hand, it is desired to create a current limiter without lasing the advantage offered by the 2DEG-HBT: the process is simple.

An embodiment that satisfies both the requirements described above is explained as follows.

EXAMPLE 9

Figure 6A:
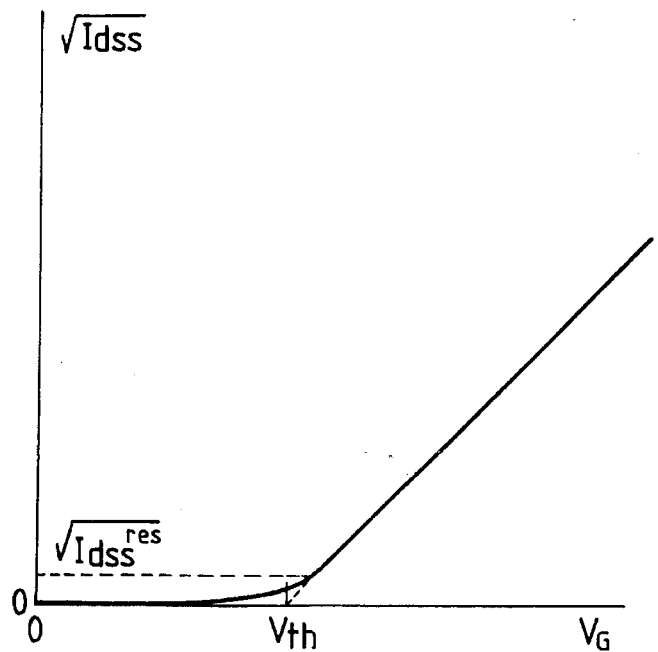
Figure 6B:
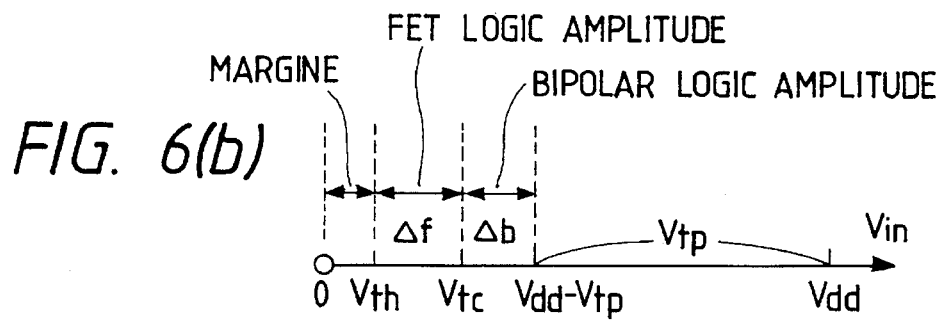
Figure 7:
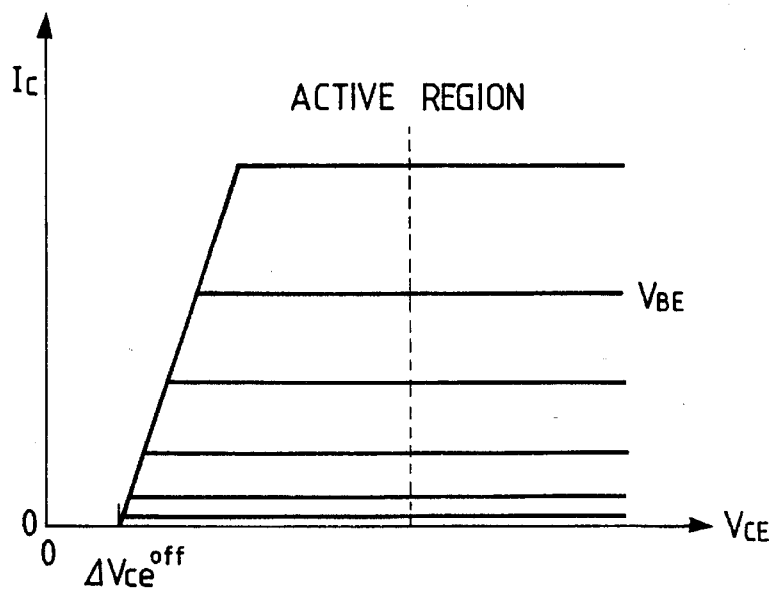
Figure 9A:
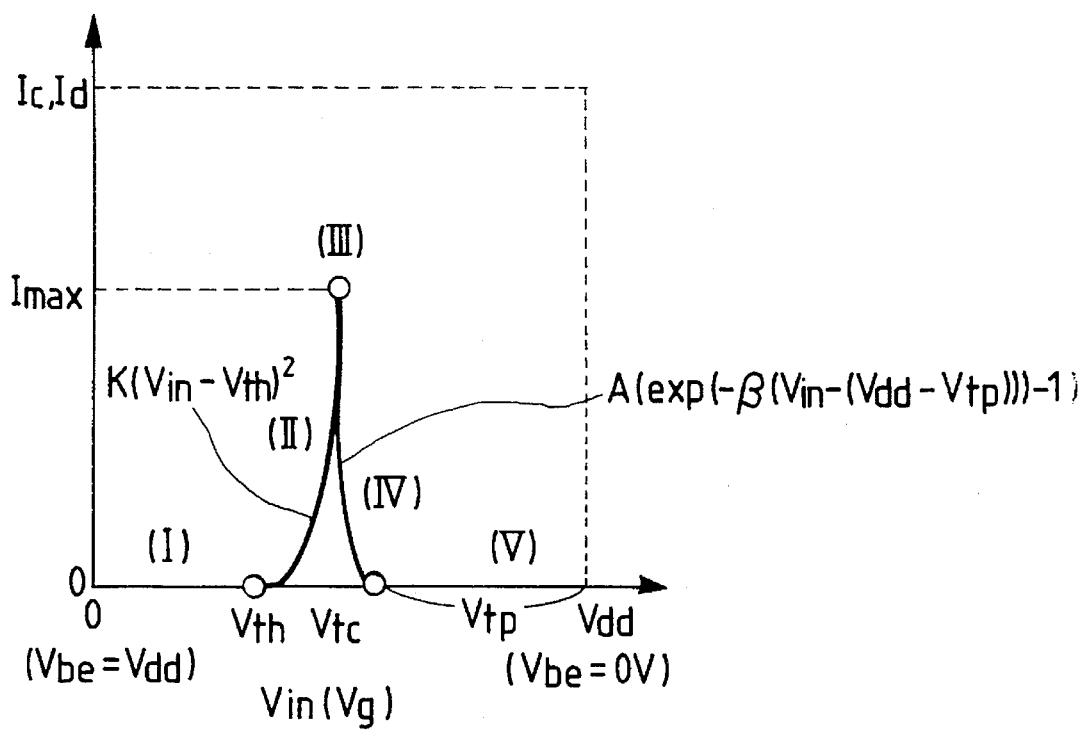
Figure 9B:
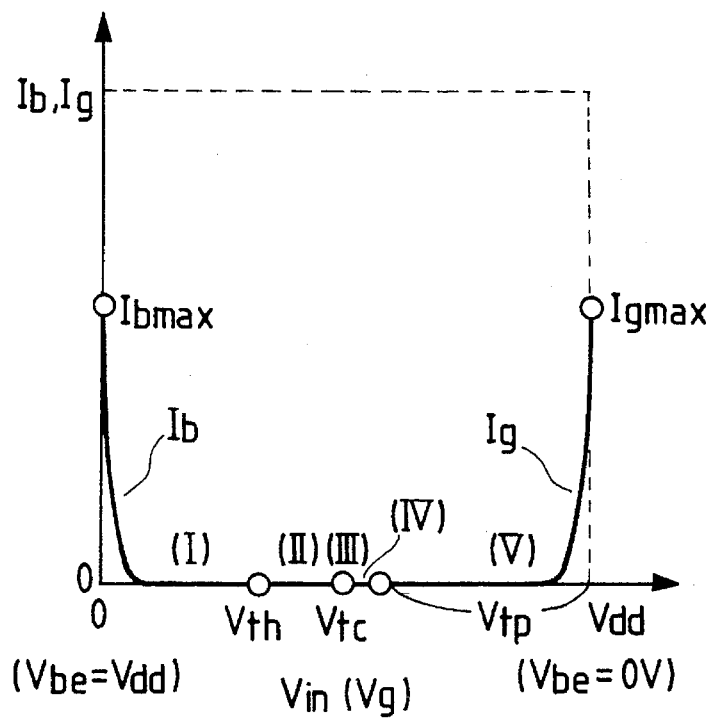
Figure 10A:
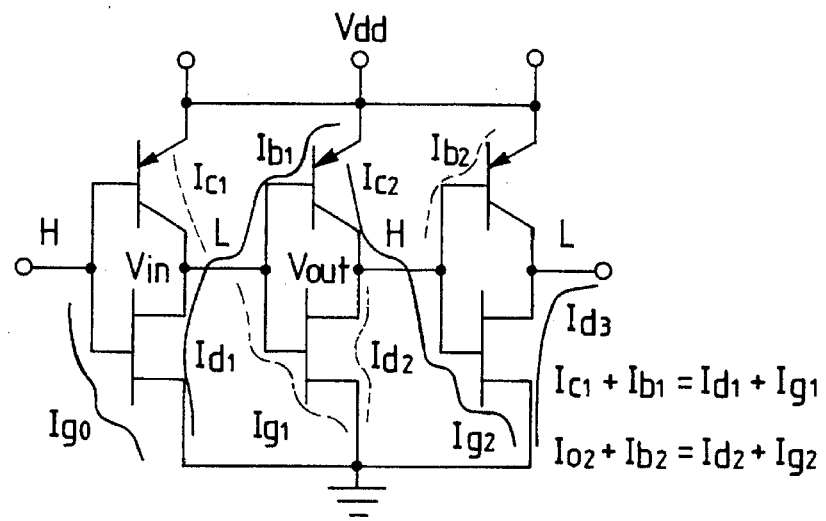
Figure 10B:
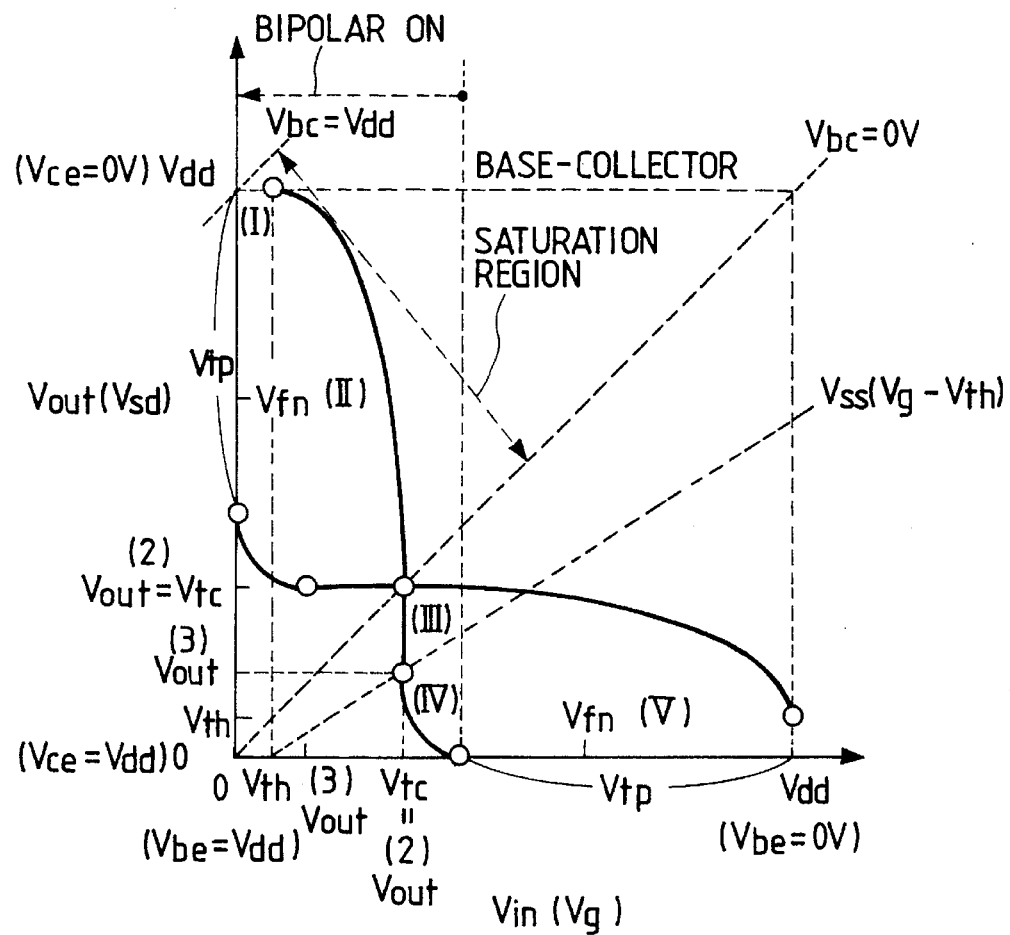
Figure 11A:
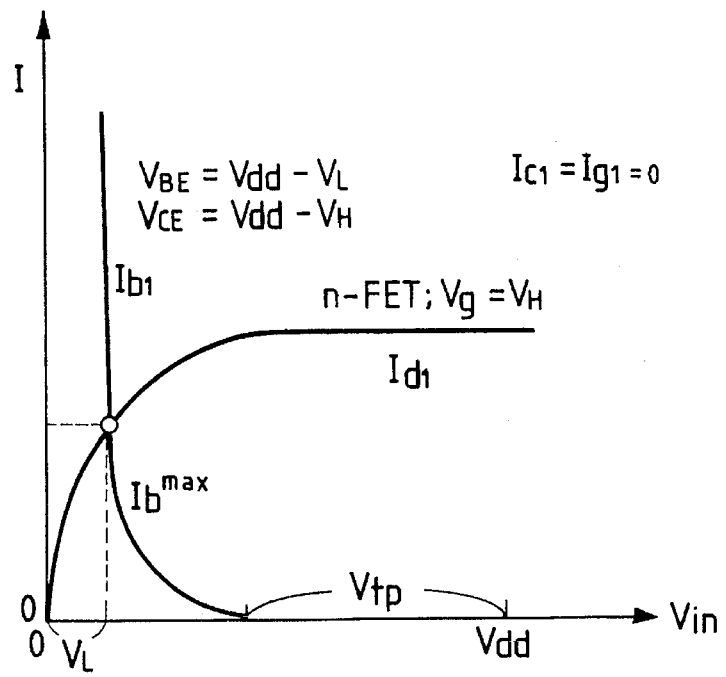
Figure 11B:
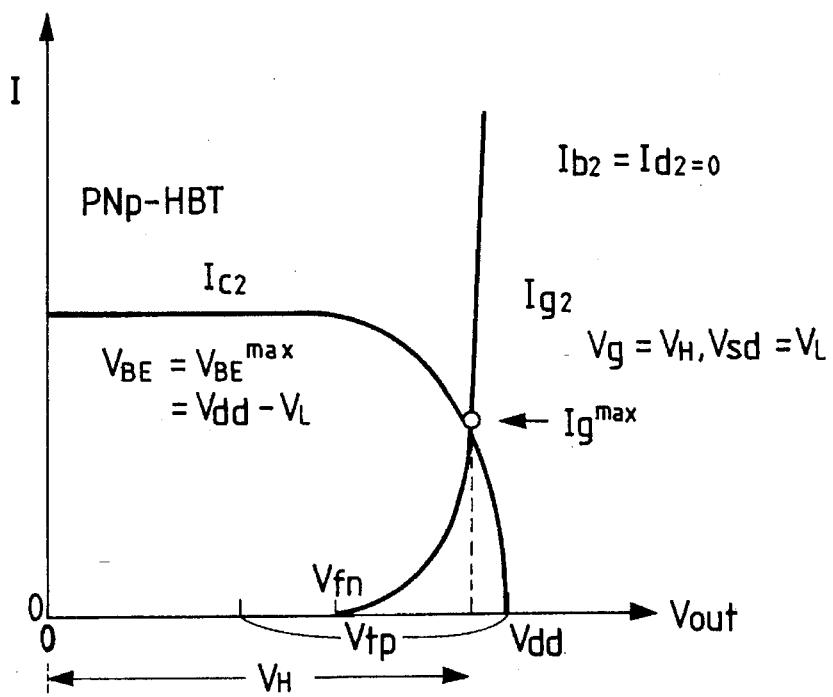
Figure 12A:
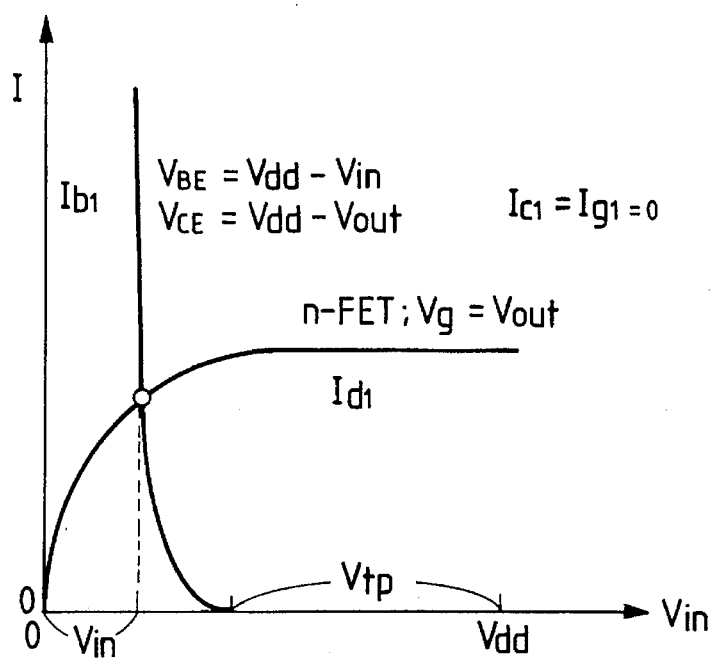
Figure 12B:
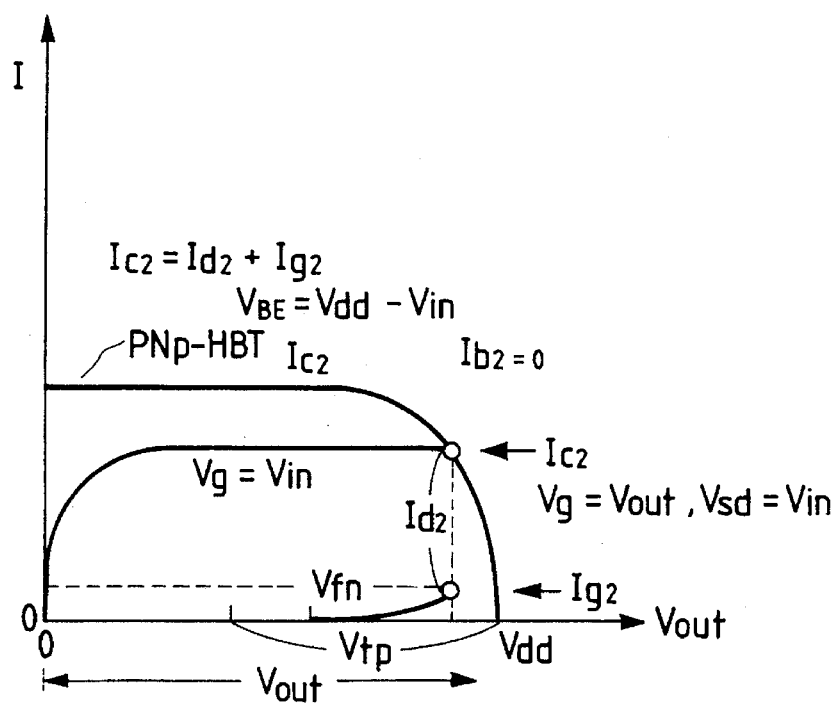
Figure 13A:
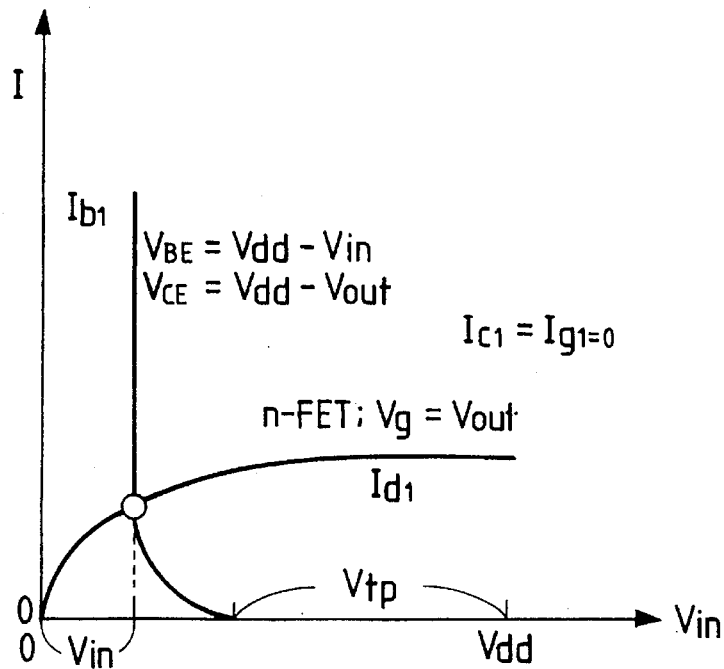
Figure 13B:
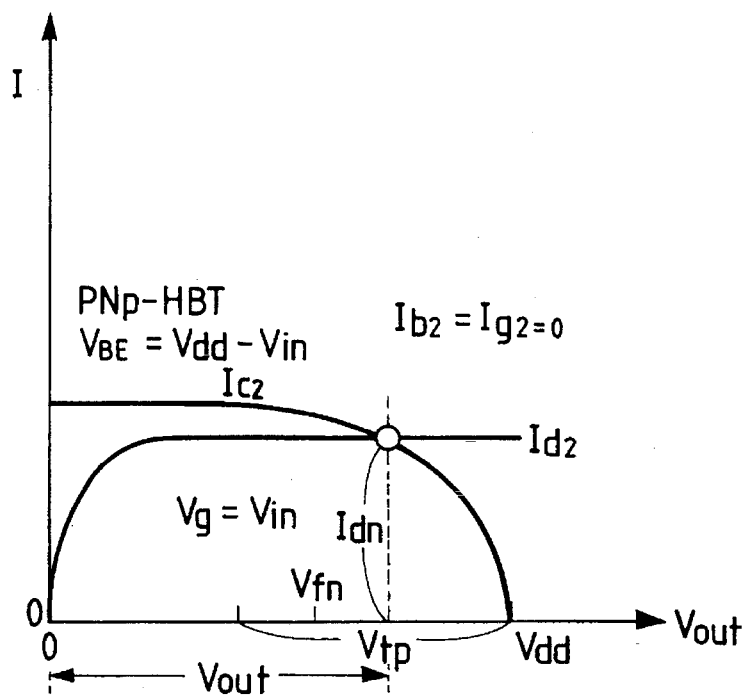
Figure 14A:
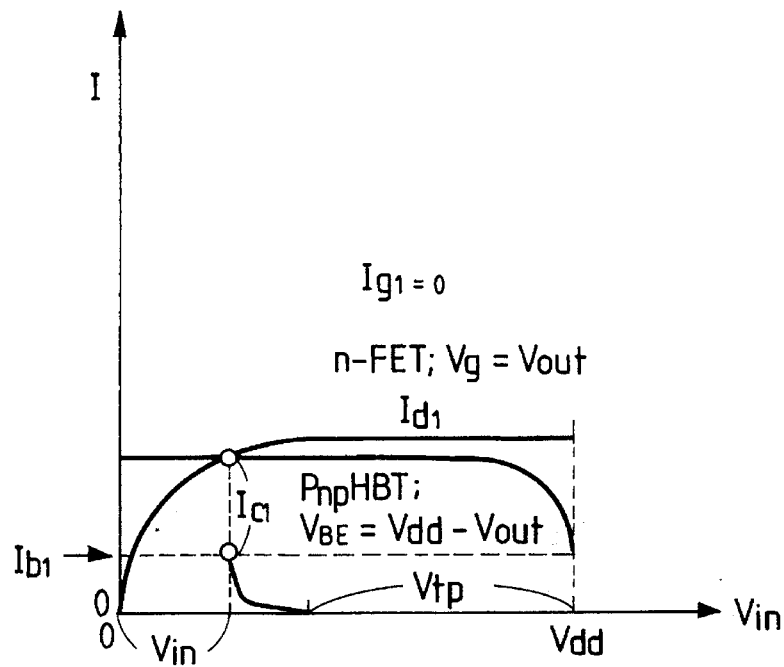
Figure 14B:
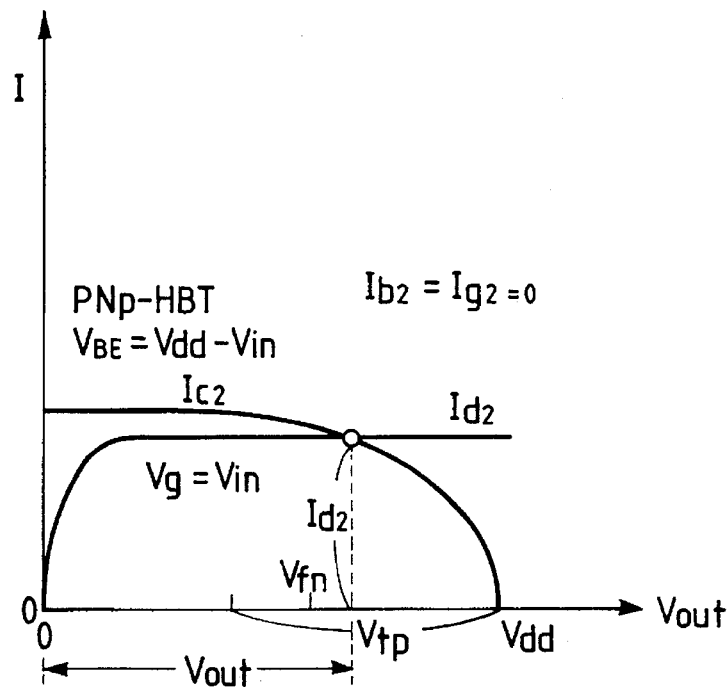
Figure 15A:
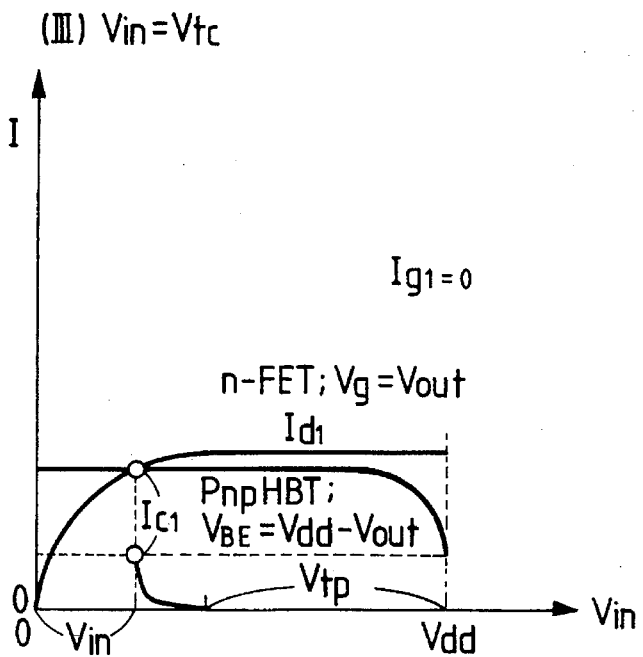
Figure 15B:
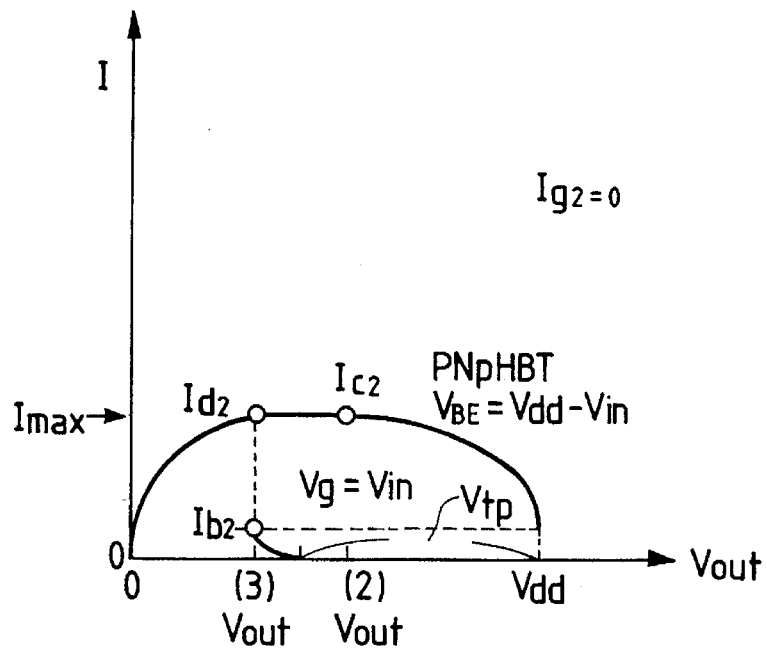
Figure 16A:
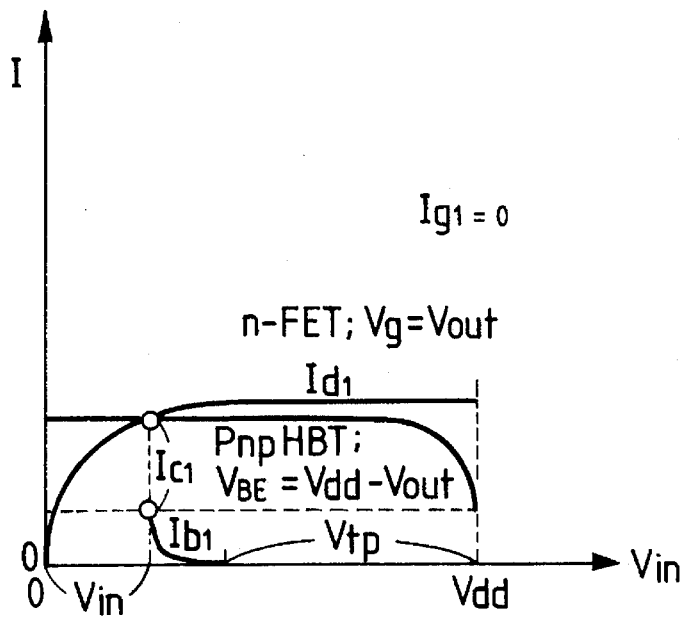
Figure 16B:
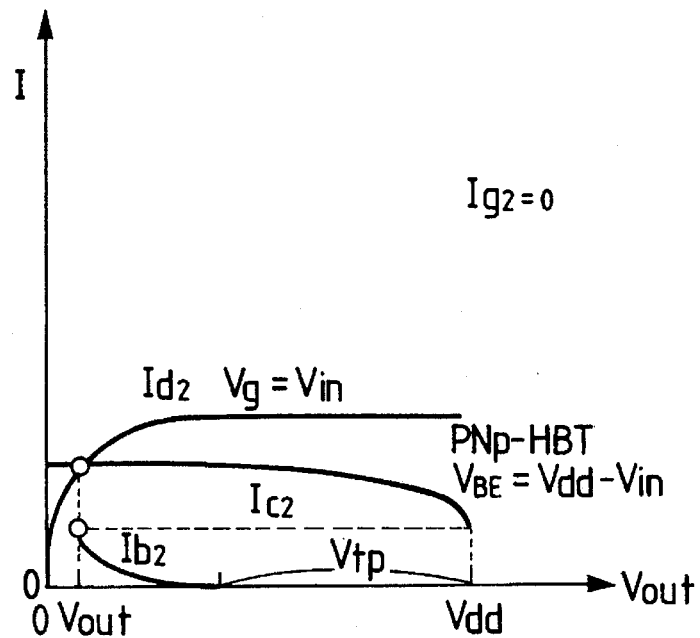
Figure 17A:
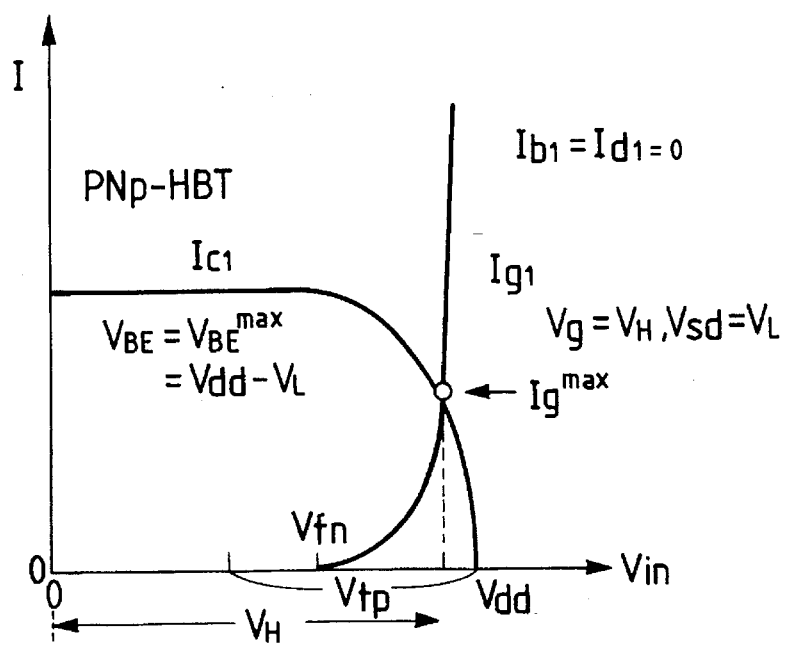
Figure 17B:
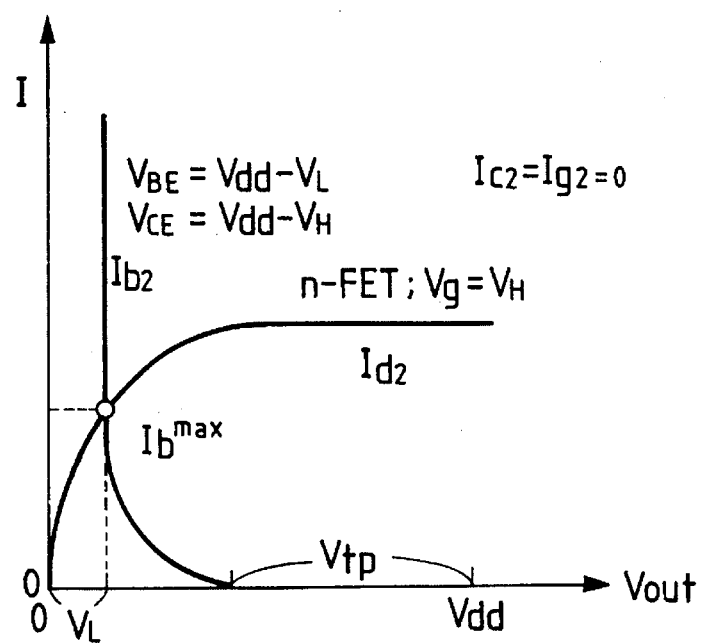
Figure 18A:
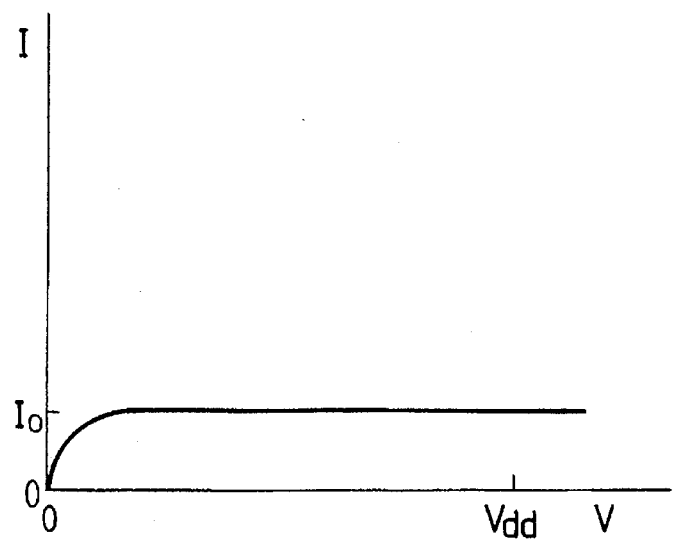
FIGS. 18(a), 18(b), 19(a), 19(b), 20(a) and 20(b) are diagrams used for explaining the reduction of power consumed by the complementary BiFET provided by the present invention.
Figure 18B:
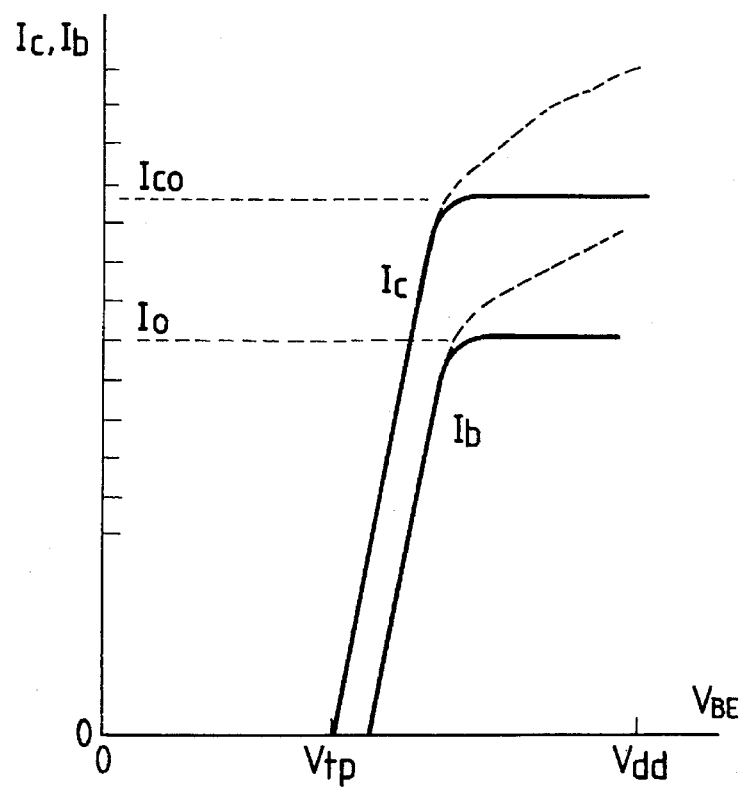
Figure 19A:
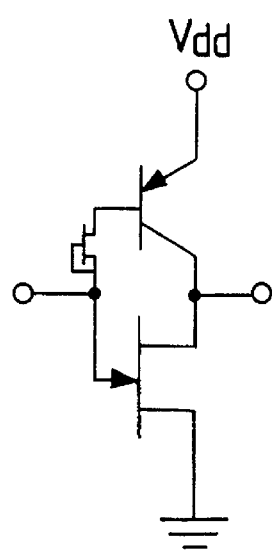
Figure 19B:
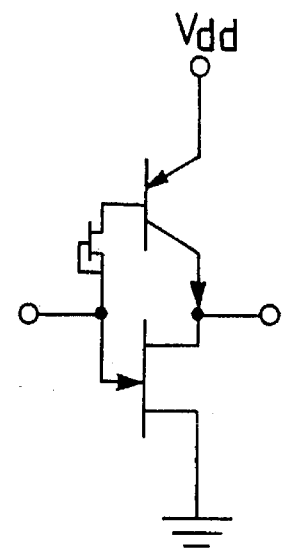
Figure 20A:
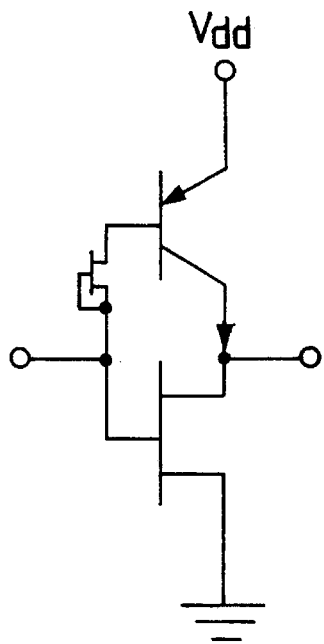
Figure 20B:
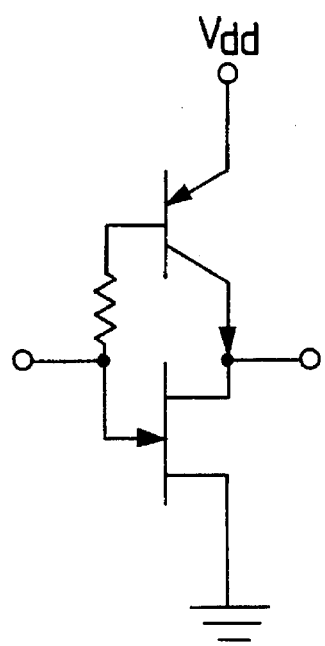
Figure 21A:
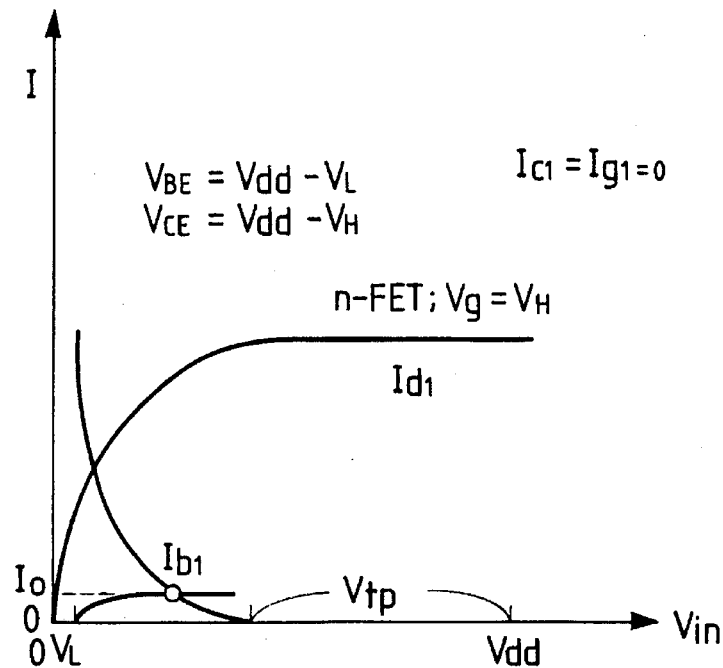
FIGS. 21(a), 21(b), 22(a) and 22(b) are diagrams used for explaining operating characteristics of a complementary BiFET provided by the present invention.
Figure 21B:
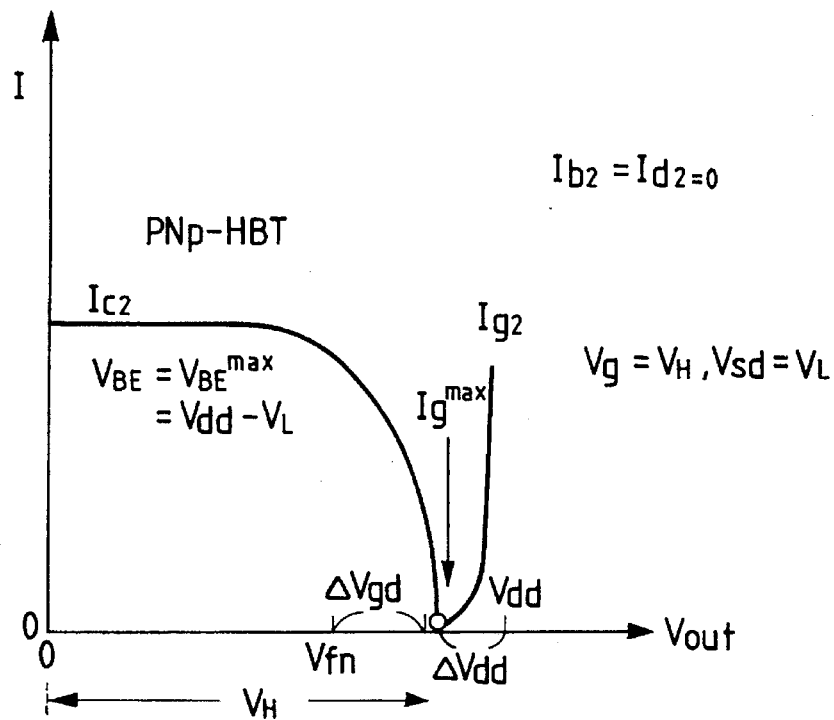
Figure 22A:
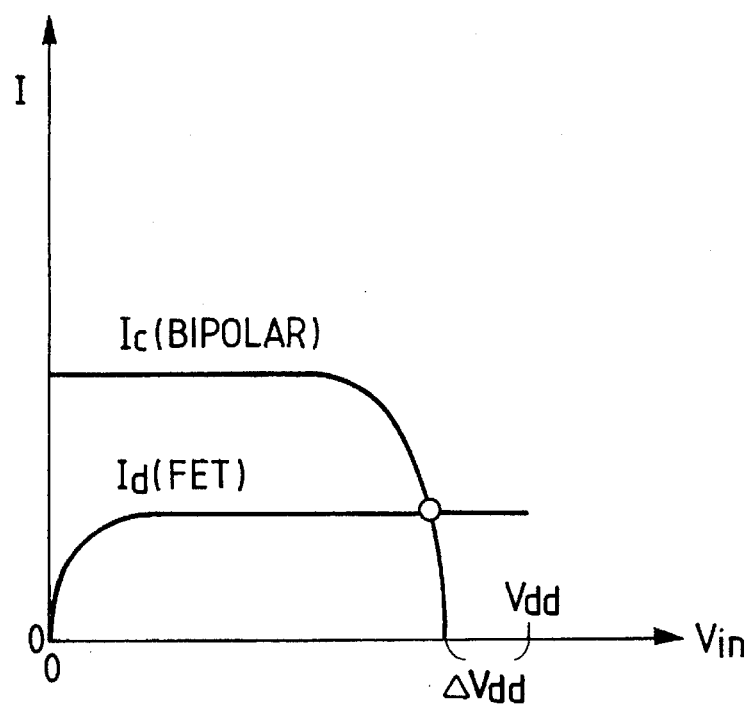
Figure 22B:
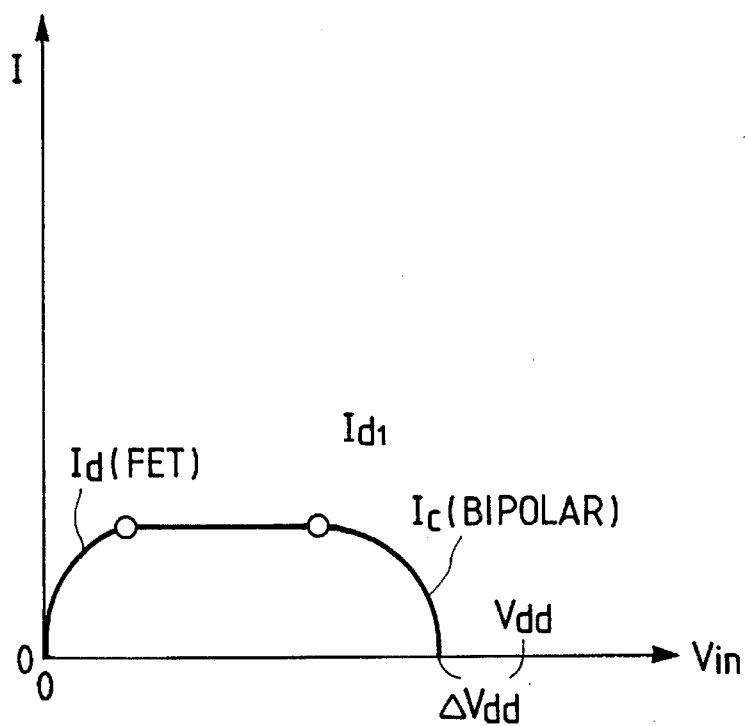
Figure 23:
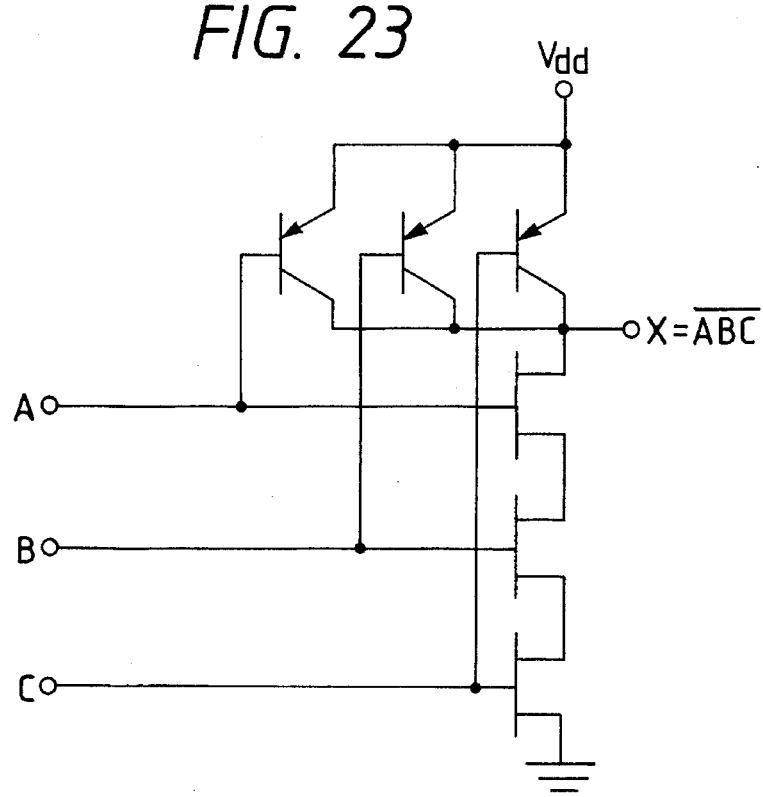
FIGS. 23 to 26 each show a three-input NAND circuit employing the complementary BiFET provided by the present invention.
Figure 24:
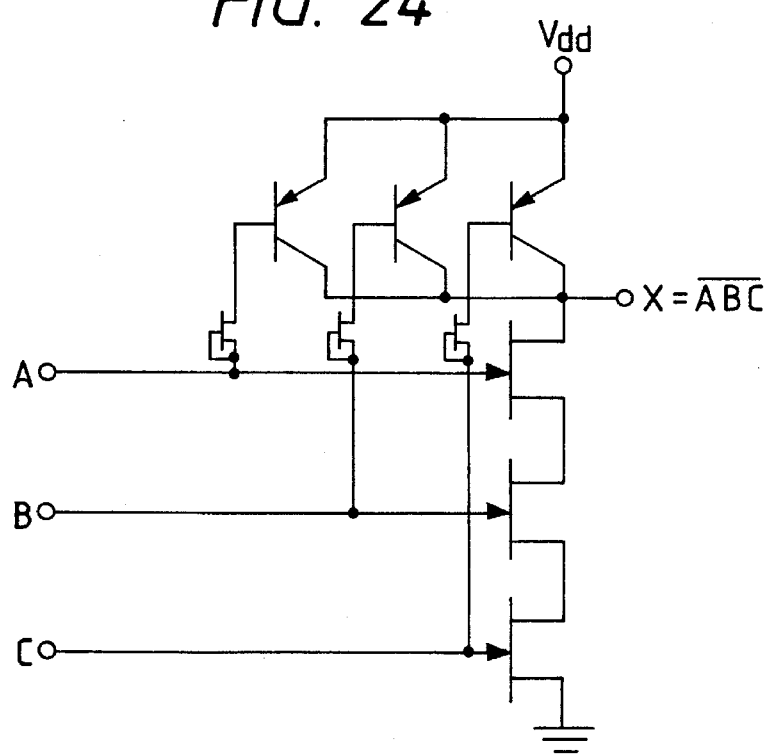
Figure 25:
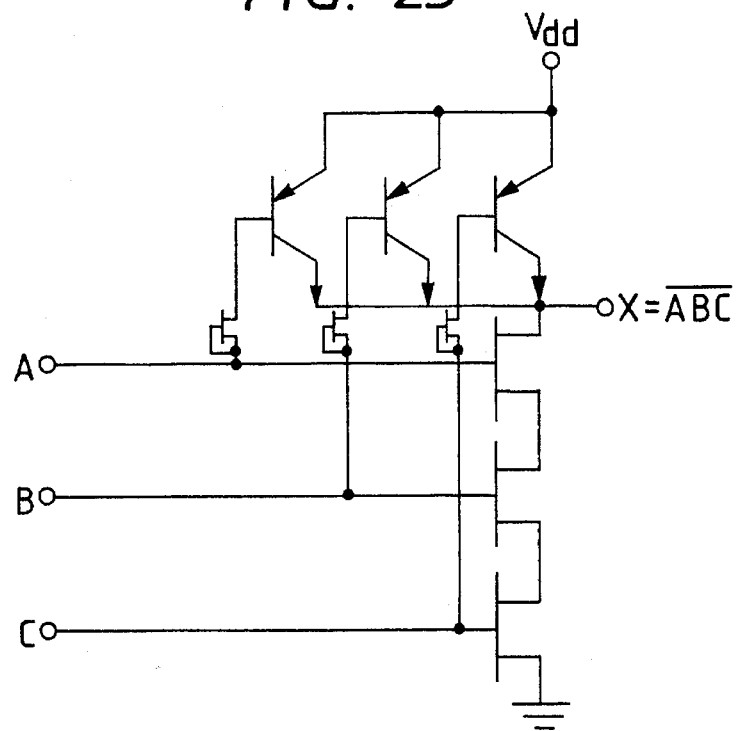
Figure 26:
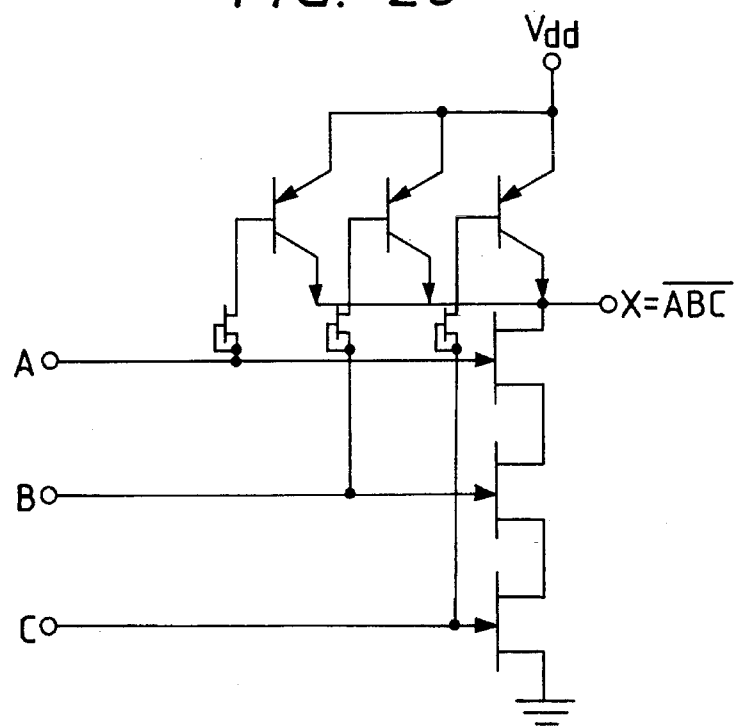
Figure 27:
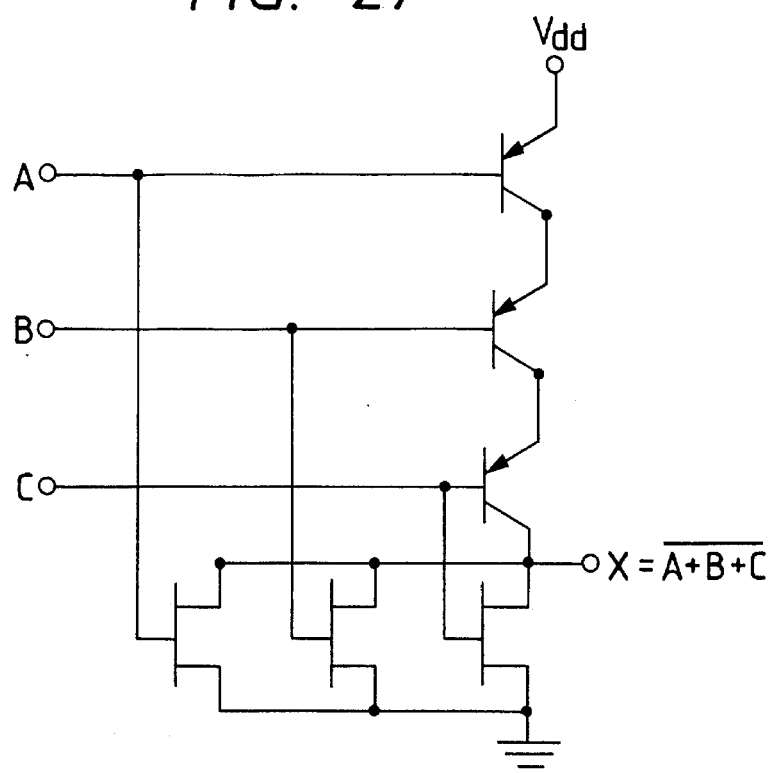
FIGS. 27 to 30 each show a three-input NOR circuit employing the complementary BiFET provided by the present invention.
Figure 28:
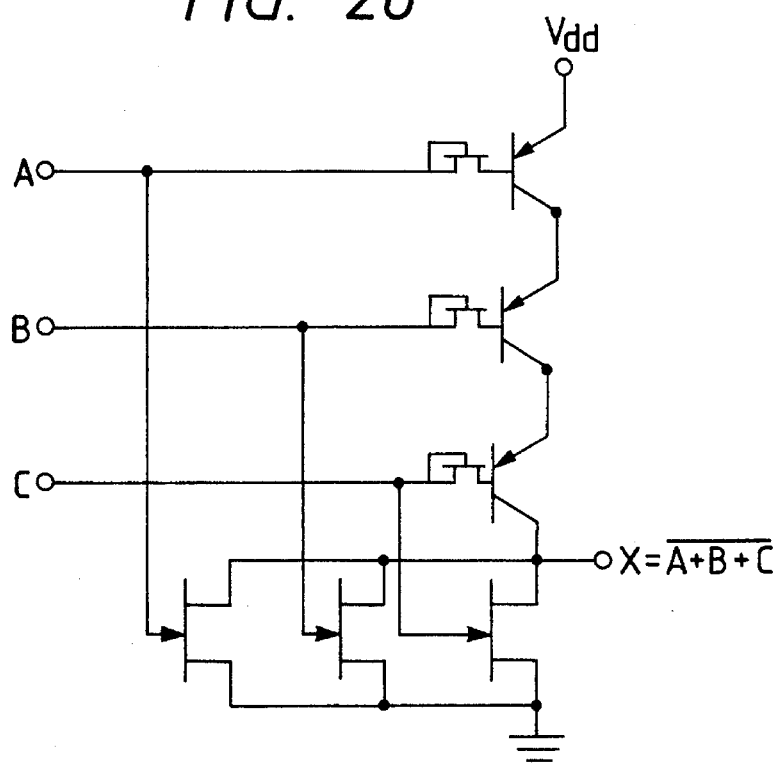
Figure 29:
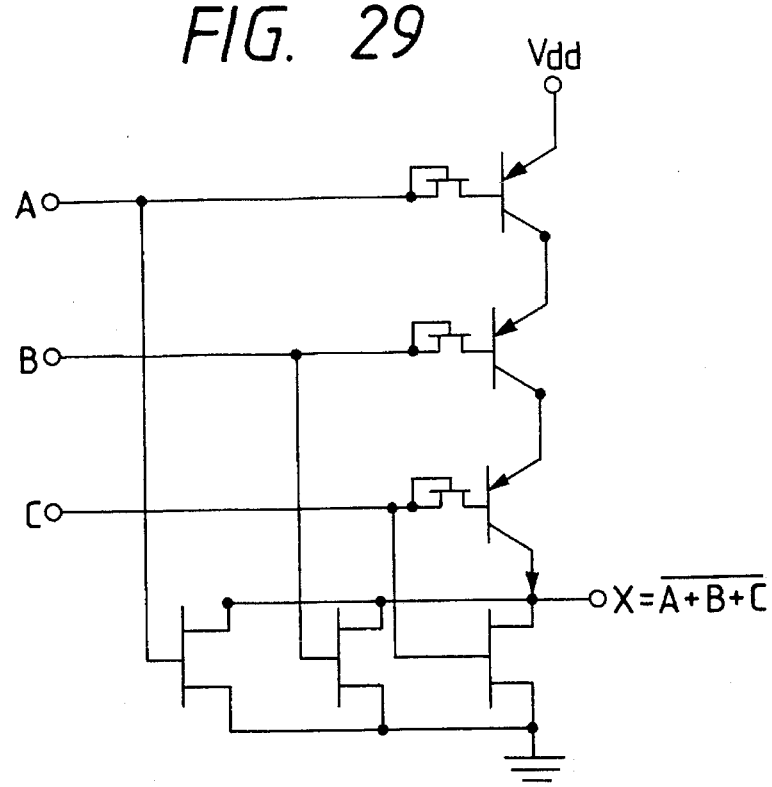
Figure 30:
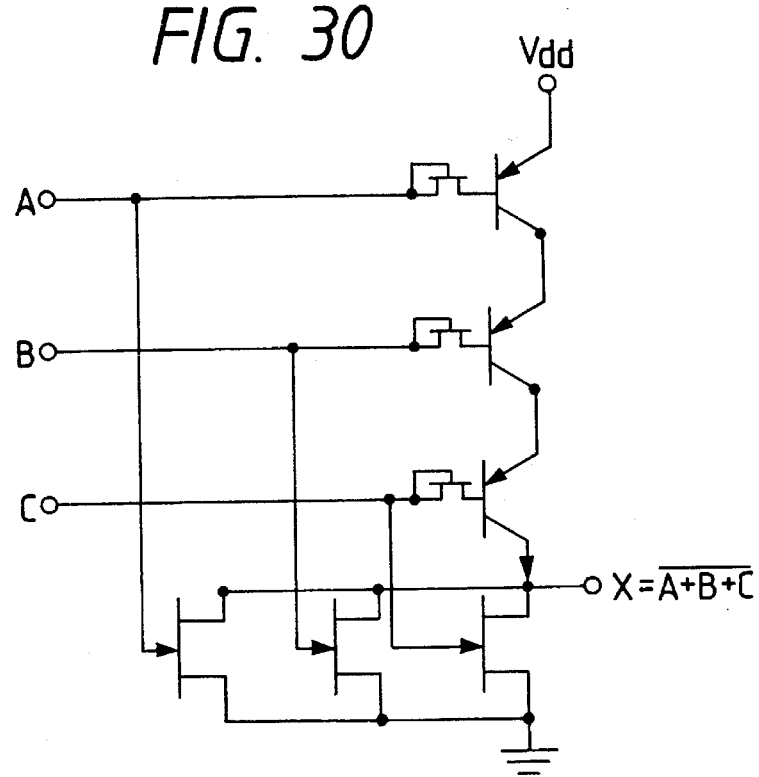
Figure 31A:
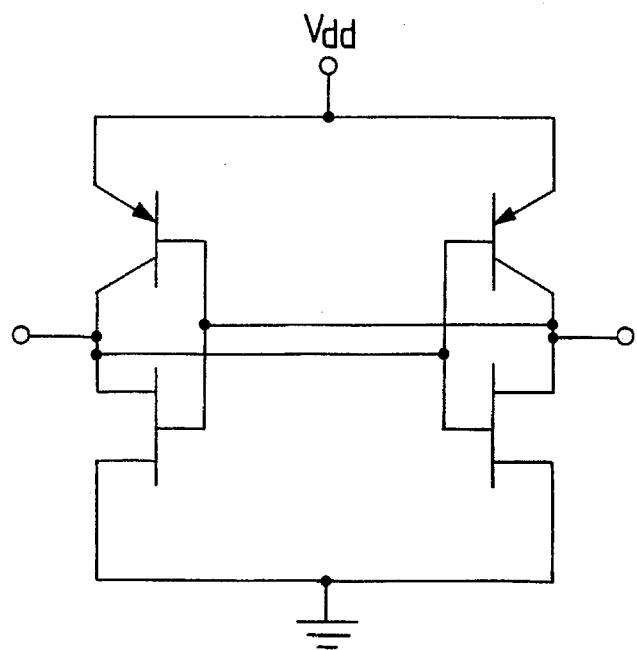
FIGS. 31A–31B to 32A–32B each show an SRAM employing the complementary BiFET provided by the present invention.
Figure 31B:
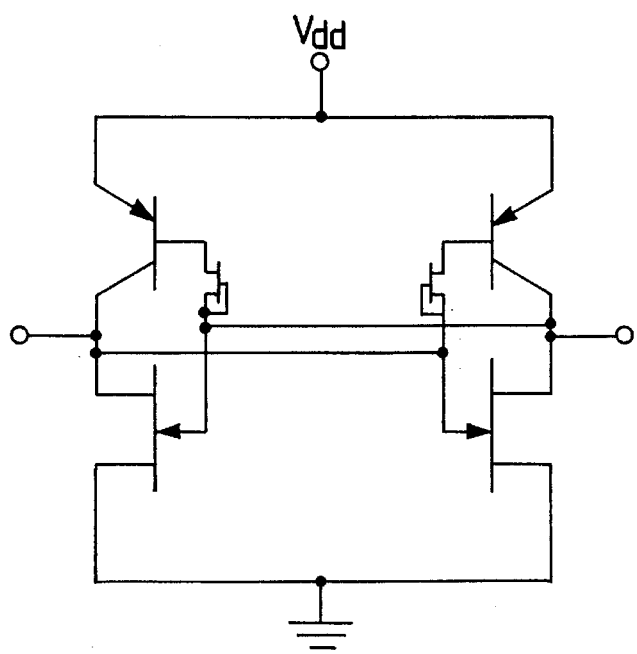
Figure 32A:
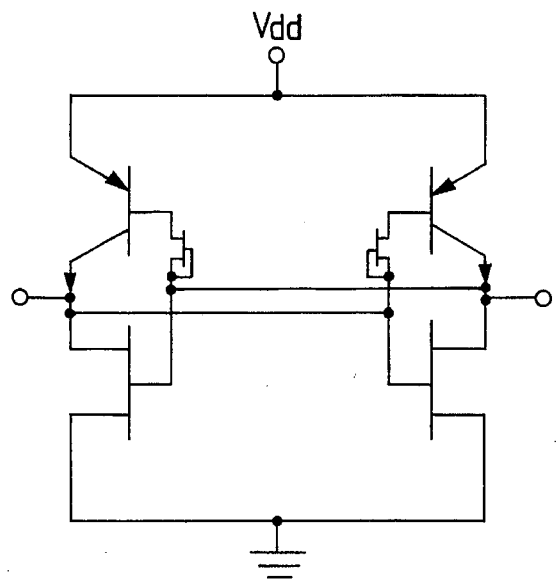
Figure 32B:
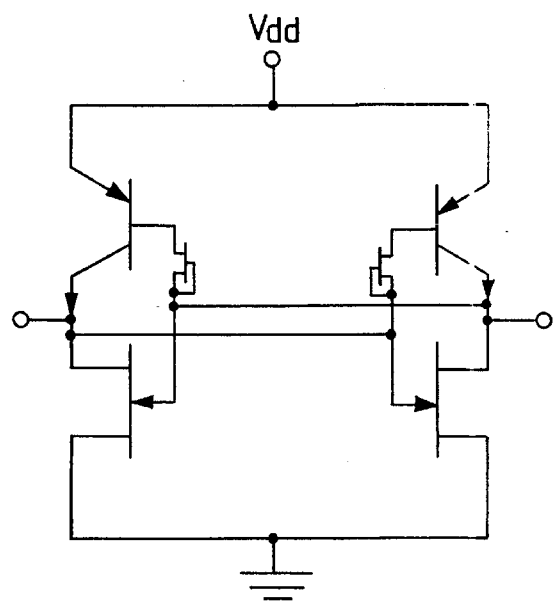
Figure 39:
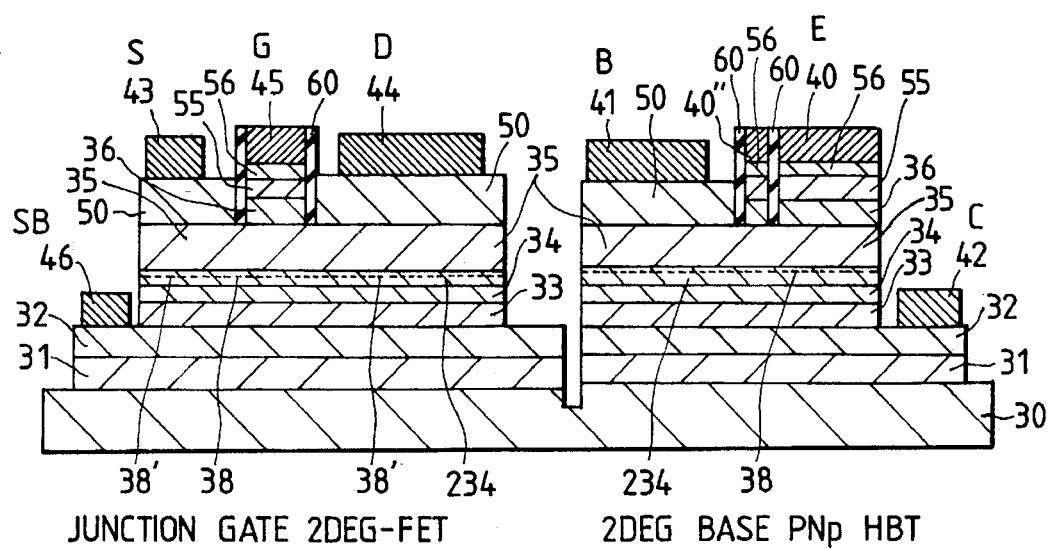
FIGS. 38(a), 38(b) and 39 are cross-sectional diagrams showing embodiments implementing current limiters in accordance with the present invention.
Figure 38A:
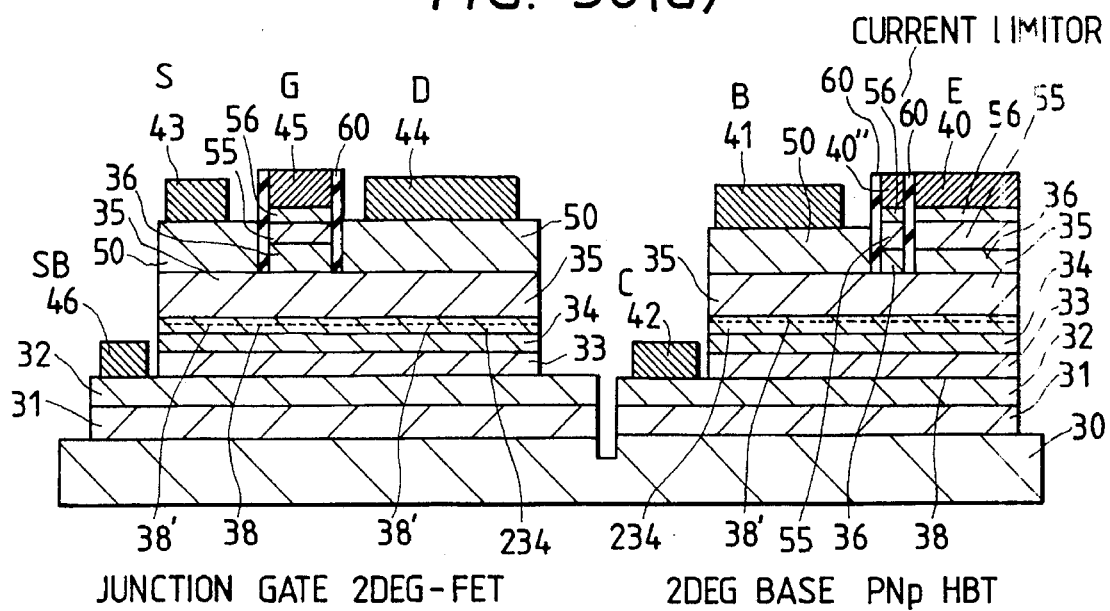
Figure 38B:
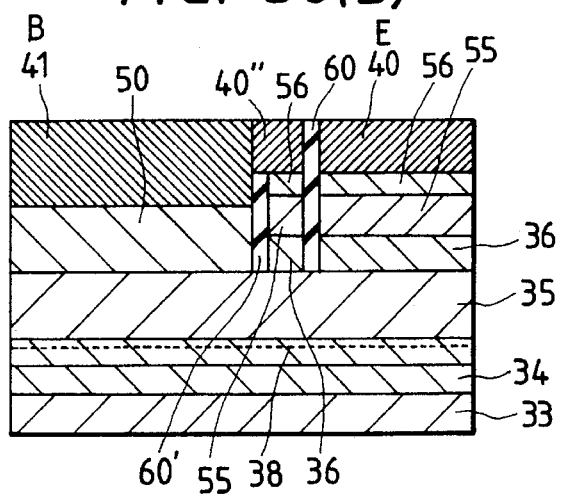
Figure 40A:
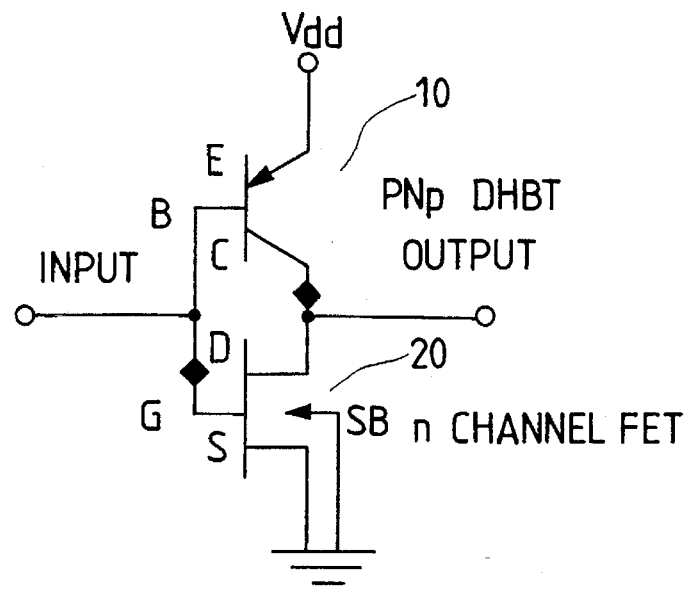
FIGS. 40(a), 40(b), 41(a), 41(b), 42(a) and 42(b) are diagrams used for explaining diodes each having an Iso-Hetero junction.
Figure 40B:
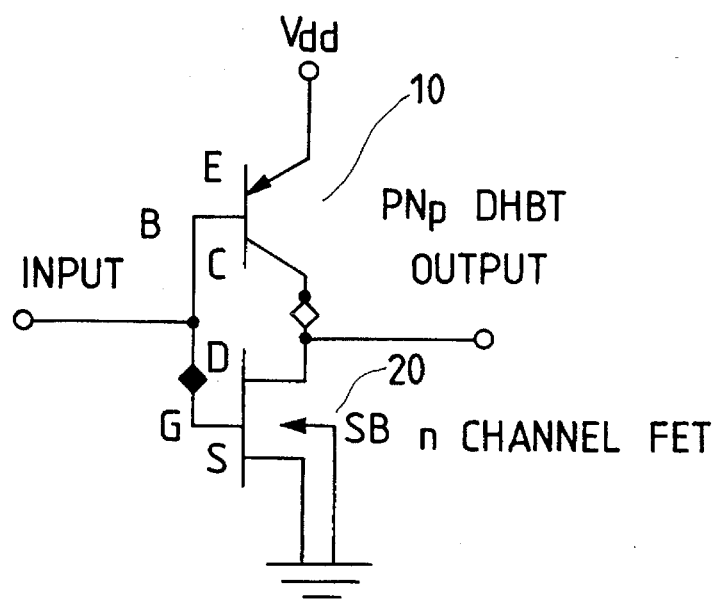

An embodiment that makes use of the FET operation of the 2DEG-HBT is described by referring to FIGS. 38(a), 38(b) and 39. The description is given with reference to the example 3. A current limiter is inserted between the emitter and base portions. Basically, the current limiter is used for connecting the source of the FET to the gate thereof. As shown in FIG. 6(a), even a positive threshold voltage Vth of the FET has a value in the range 0 to 0.15 V which allows a source-emitter current to flow through the FET. This source-emitter current can be used in the current limiter. The current Io can be adjusted also by changing the width of the current limiter. As shown in FIGS. 38(a), 38(b) and 39, the gate-side part 40'' of the current limiter is therefore inserted between the base and the emitter portions, basically allowing the multilayer structure of the 2DEG-HBT to be used as it is. As a result, the current limiter can be created without significantly changing the manufacturing processes. In addition, a current limiter can also be created by using the so-called HEMT shown in FIG. 36(b). The collector can be located at one of two locations shown in FIG. 38(a) and 39 depending upon the layout. In addition, the base electrode and the gate electrode of the current limiter can be created as a common electrode as shown in FIG. 38(b).

The following description explains how to create a diode. The GaAs/AlGaAs hetero junction is characterized in that a good and controllable hetero junction can be created. The 2DEG-HBT is a device that takes advantage of this characteristic. A unique usage of the hetero junction is to create a diode with no storage effect of minority carriers by using an Iso-Hetero junction.

Figure 42A:
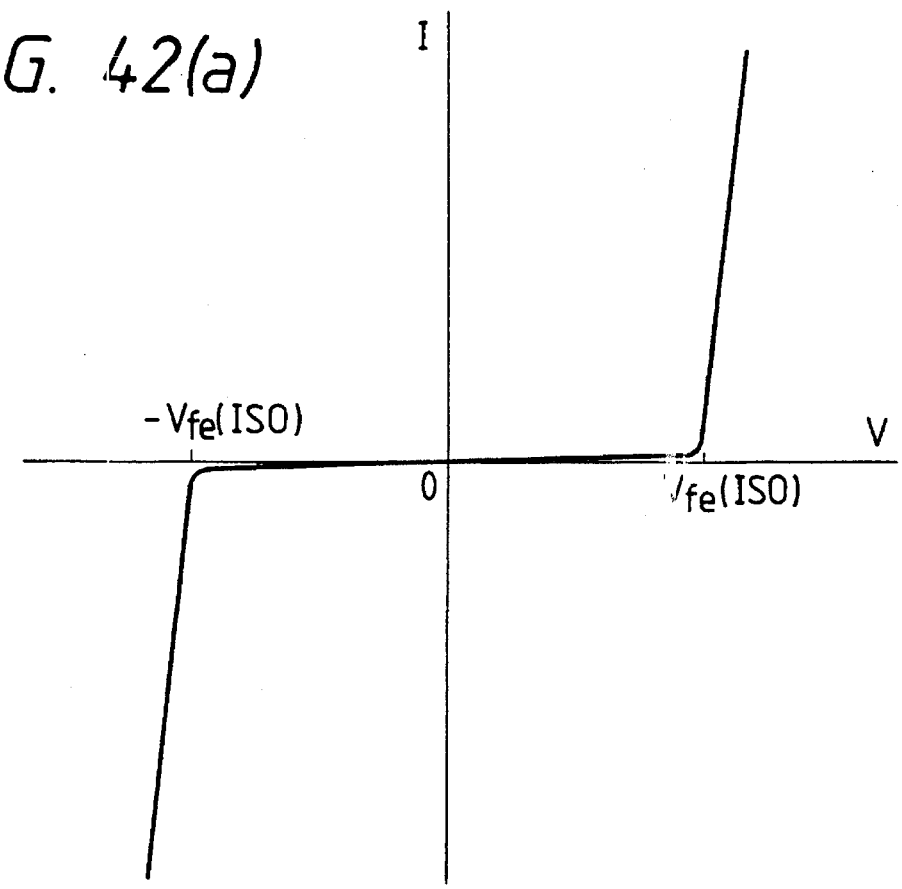
Figure 42B:
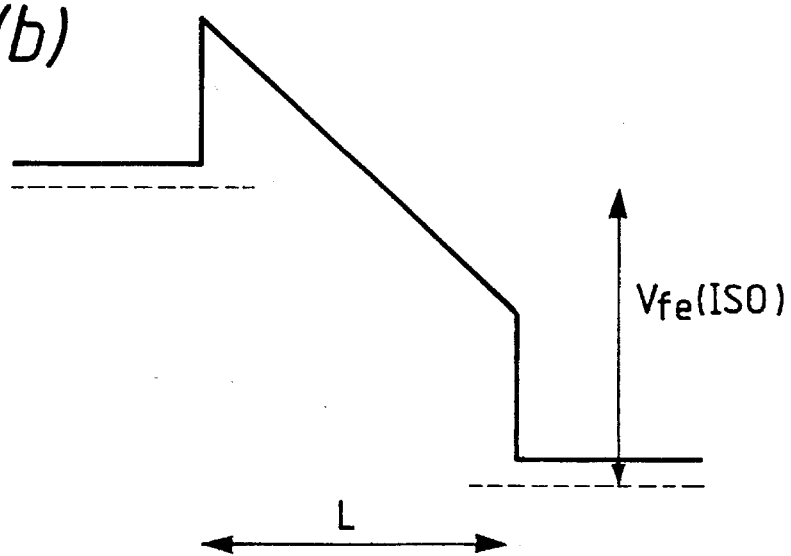

The Iso-Hetero junction is represented by junctions among n-type GaAs, undoped AlGaAs (or AlAs) and n-type GaAs, or junctions among p-type GaAs, undoped AlGaAs (or AlAs) and p-type GaAs. $In_uGa_{1-u}As$ can also be used as a substitute for the GaAs. Let L be the film thickness of the undoped layer sandwiched in the middle. A band diagram of the conduction band with a voltage applied between both terminals of the n-type GaAs, undoped AlGaAs (or AlAs) and n-type GaAs is shown in FIG. 42(b). A dotted line denotes the Fermi level. In this case, a current-voltage characteristic is shown in FIG. 42(a). The building-up voltage Vfe(ISO) can be controlled by the Al composite, the film thickness L and the operating temperature. The same holds true for a p-type Iso-Hetero junction. The building-up voltage Vie can be set at a value in the range 0 to 1 V.

EXAMPLE 10

Figure 41A:
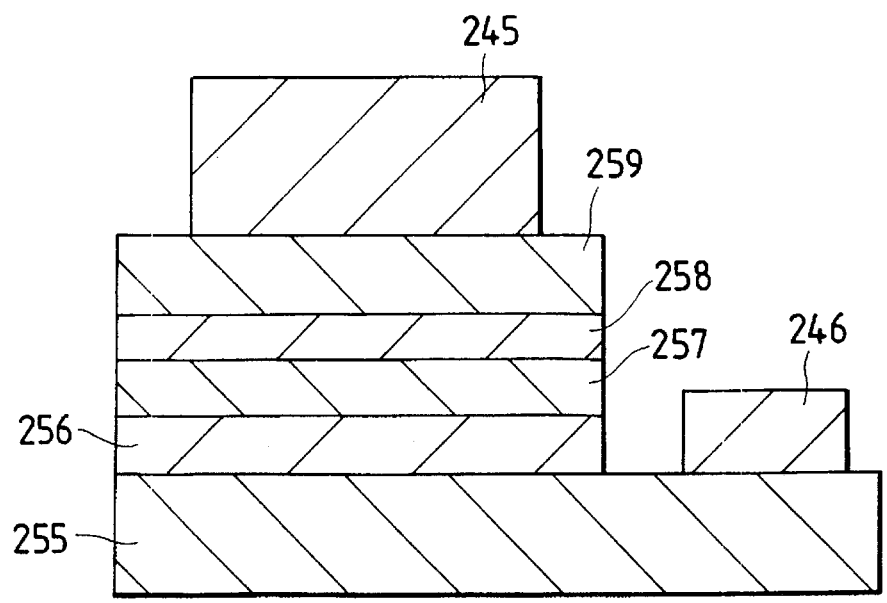

An embodiment that has something to do with the Iso-Hetero junction is described below by referring to FIGS. 40(a), 40(b), 41(a) and 41(b). A p-type Iso-Hetero junction is shown in FIG. 41(a). An undoped GaAs layer 256 with a thickness of 10 nm, an undoped $Al_xGa_{1-x}As$ (x=0.45) layer 257, an undoped GaAs layer 258 and a p-type GaAs layer 259 having a thickness of 40 nm and containing C (carbon) at a concentration of $2 \times 10^{20}/cm^3$ are piled on a p-type GaAs layer 255 having a thickness of 50 nm and containing C (carbon) at a concentration of $2 \times 10^{20}/cm^3$ one after another using the MOMBE technique to form a multilayer structure. Then, diode electrodes 245 and 246 are created. As a result, a value of bias Vfe(ISO) of 0.3 V is obtained.

Figure 41B:
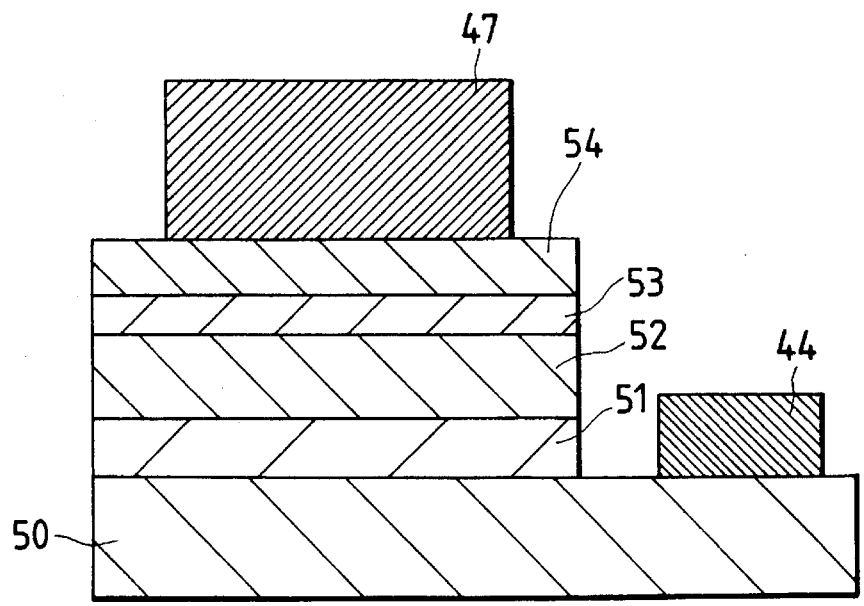

Next, an n-type Iso-Hetero junction is described by referring to FIG. 41(b). An undoped GaAs layer 51 with a thickness of 10 nm, an undoped $Al_xGa_{1-x}As$ (x=0.45) layer 52, an undoped GaAs layer 53 with a thickness of 10 nm and an n-type GaAs/InGaAs graded/InAs layer 54 having Si (silicon) at a concentration of $3 \times 10^{18}/cm^3$ are piled on an n-type GaAs layer 50 having a thickness of 160 nm and containing Si (silicon) at a concentration of $3 \times 10^{18}/cm^3$ one after another using the MBE technique to form a multilayer structure. Then, diode electrodes 47 and 44 are created. The diode electrode 47 can be made of a non-alloy metal. As a result, a bias Vfe(ISO) of 0.45 V is obtained. Such an Iso-Hetero junction diode is represented by a regular square slanting by 45 degrees. When using the diode in an n-type complementary BiFET, two structures shown in FIGS. 40(a) and (b) can be adopted.

EXAMPLE 11

Next, the voltage shift ΔV of a diode is described. In particular, the complementary BiFET has a wide range of applications including logic circuits SRAMs for high-speed computers in which the speed is the top priority, desk-top work stations and desk-top personal computers requiring a high speed and little consumed power simultaneously, digital and analog ICs for optical communication as well as portable telephones, portable personal computers and portable television telephones requiring low power consumption. It is thus necessary to control the power consumption over a wide range. As a result, the voltage shift needs to be set at a desired value in the range 0 to 1.5 V.

The following describes a case in which, the following conditions approximately hold true: ΔVgd+ΔVdd=0.75 V, Vdd=2.15 V and Vfn=1.4 V.

Roughly speaking, there are three ways of inserting a diode on the collector side of a bipolar transistor:

(1) A p-type Schottky diode is inserted into the p-type layer of the collector.
(2) A Schottky diode is inserted by creating an n-type layer in the drain portion of the FET.
(3) A p-type Iso-Hetero junction diode is inserted into the p-type layer of the collector.

On the other hand, there are, generally speaking, three ways of inserting a diode on the gate side of a FET in addition to the above:

(4) An n-type Iso-Hetero junction diode is inserted on the p-type gate (emitter) layer.
(5) An n-type Schottky diode is inserted on the p-type gate (emitter) layer.
(6) An n-type Schottky diode is inserted at selected epitaxy time into a region outside the FET.

Figure 43A:
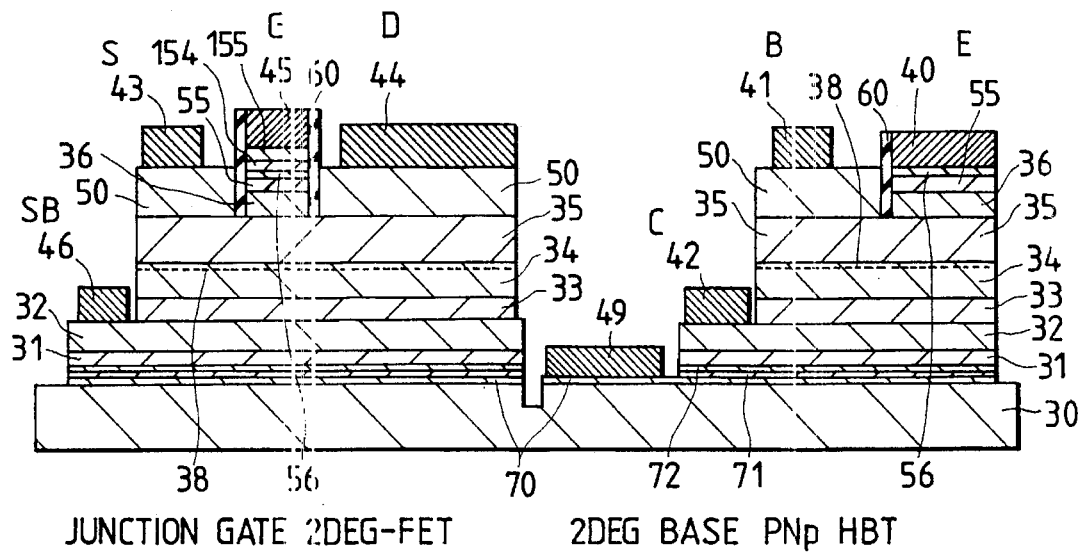
FIGS. 43(a), 43(b), 44(a) and 44(b) are cross-sectional diagrams showing complementary BiFETs each employing a diode in accordance with the present invention.

First of all, an embodiment, in which a p-type Iso-Hetero junction diode is inserted into the collector and an n-side Schottky diode is inserted in the gate portion of the FET as well, is explained by referring to FIG. 43(a). Since the basic multilayer structure is the same as that of the example 2, only differences from the example 2 are described. First of all, a p-type GaAs layer 70 having a thickness of 200 nm and containing Be at a concentration of $3\times10^{19}$/cm$^3$, an undoped layer 71 with a thickness of 30 nm and an undoped Al$_y$Ga$_{1-y}$As(y=0.45) layer 72 with a thickness of 200 nm are created on a semi-insulating GaAs substrate 30. Much like the example 2, a multilayer structure is then created by piling layers one after another starting with a p-type GaAs layer 31 containing Be at a concentration of $3\times10^{18}$/cm$^3$ and ending with a p-type GaAs layer 56. Subsequently, an n-type GaAs layer 154 having a thickness of 50 nm and containing Si at a concentration of $4\times10^{18}$/cm$^3$ and an n-type GaAs layer 155 having a thickness of 90 nm and containing Si at a concentration of $4\times10^{17}$/cm$^3$ are created on the p-type GaAs layer 56.

In the bipolar-transistor portion, the n-type GaAs layers 154 and 155 are removed. Then, a process of inserting a diode is carried out in addition to the same processes as the example 2. To be more specific, a p-type Iso-Hetero junction diode which comprises a collector electrode 42 and an electrode 49 ohmicly connected to the p-type GaAs layer 70 is created. The electrode 49 is wired to the drain portion of the FET to serve as an output terminal of the complementary BiFET. By using a heat-proof gate electrode 45 connected to the n-type GaAs layer 155 through a Schottky junction, the Schottky junction with the gate of the FET is created in a self-matching state. It should be noted that a tunnel junction exists between the p-type GaAs layer 56 and the n-type GaAs layer 154.

Figure 43B:
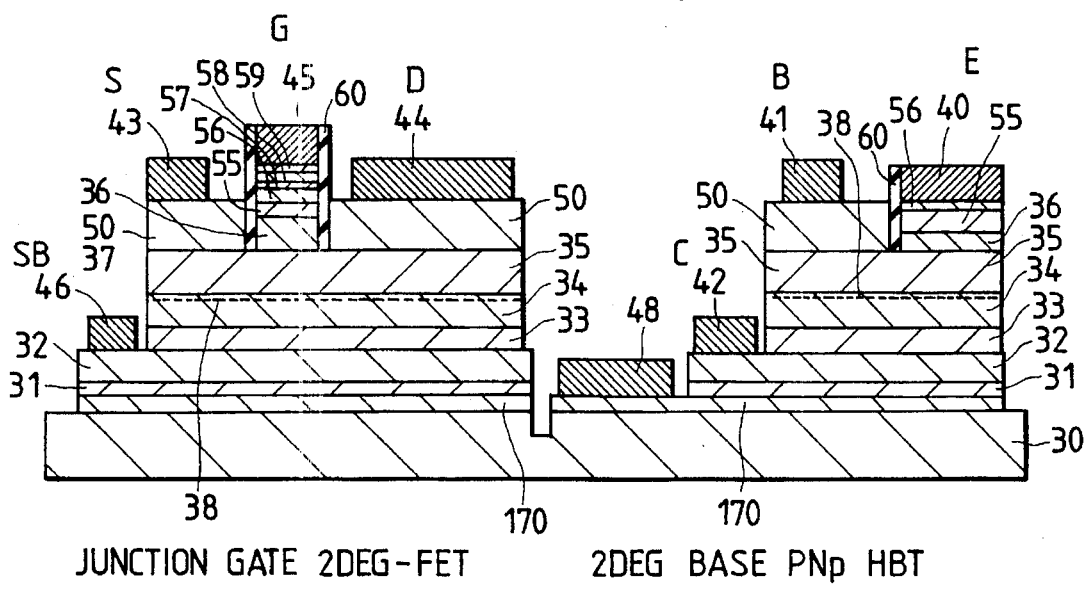

An embodiment in which a p-type Schottky diode is inserted into the collector and a p-type Iso-Hetero junction diode is inserted into the gate portion of the FET is shown in FIG. 43(b). Since the basic multilayer structure is the same as that of the example 2, only differences from the example 2 are described. First of all, a p-type GaAs layer 170 having a thickness of 300 nm and containing Be at a concentration of $3\times10^{17}$/cm$^3$ is created on a semi-insulating GaAs substrate 30 following the creation of a GaAs buffer layer. Much like the example 2, a multilayer structure is then created by piling layers one after another starting with a p-type GaAs layer 31 containing Be at a concentration of $3\times10^{18}$/cm$^3$ and ending with a p-type GaAs layer 56. Subsequently, an undoped GaAs layer 57 with a thickness of 30 nm, an undoped Al$_y$Ga$_{1-y}$As (y=0.45) layer 58 with a thickness of 200 nm and a p-type GaAs layer 59 containing Be at a concentration of $10^{20}$/cm$^3$ are created on the p-type GaAs layer 56. Processes are carried forward as shown in the drawing of the example 11 after the removal of the semiconductor layers 57, 58 and 59 from the emitter portion. A p-type Schottky diode is created between a collector electrode 42 and an electrode 48 which is linked to a p-type GaAs layer 170 through a Schottky junction. Wired to a drain electrode, the Schottky electrode 48 serves as an output terminal of the complementary BiFET.

Figure 44A:
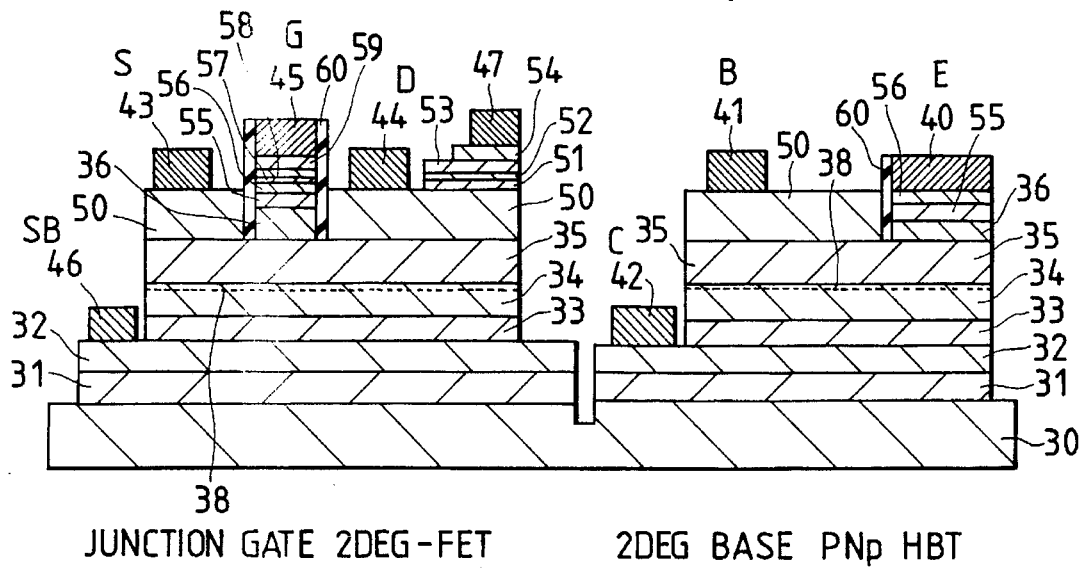

Next, an embodiment in which an n-type Iso-Hetero junction diode is inserted in the drain region and a p-type Iso-Hetero junction diode is inserted in the gate portion of the FET is explained by referring to FIG. 44(a). The basic multilayer structure is the same as that of the example 2. The gate region of the FET and the emitter region of the bipolar transistor are created in the same way as those of the device shown in FIG. 43(b). It should be noted, however, that after an n-type GaAs layer 50 undergoes a selection-growth process using the MOCVD technique, an undoped GaAs layer 51 with a thickness of 10 nm, an undoped Al$_y$Ga$_{1-y}$As (y=0.45) layer 52 with a thickness of 200 nm, an undoped GaAs layer 53 with a thickness of 10 nm and an n-type GaAs layer 54 having a thickness of 200 nm and containing Si at a concentration of $4\times10^{18}$/cm$^3$ are created by means of the MOCVD technique. In order to create an n-type Iso-Hetero junction diode, a diode electrode 47 is created from Auge/Ni/Au. The diode electrode 47 is wired to a collector electrode 42 to serve as an output terminal.

Figure 44B:
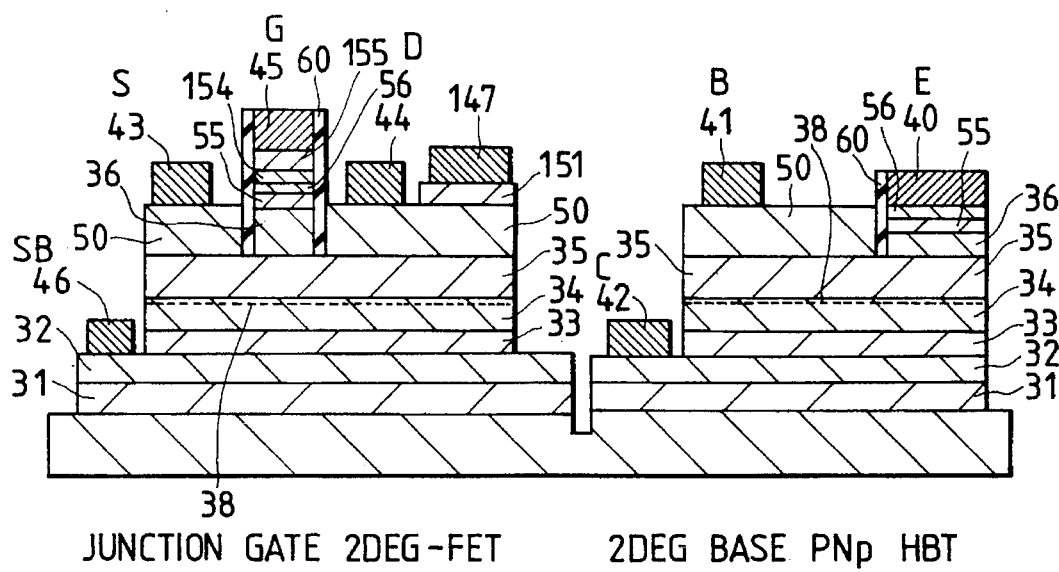

An embodiment in which an n-type Schottky diode is inserted into the drain portion and another n-type Schottky diode is inserted into the gate portion of the FET is shown in FIG. 44(b). The basic multilayer/film structure is the same as that of the example 2. The gate region of the FET and the emitter region are created in the same way as those of the device shown in FIG. 43(a). It should be noted, however, that after a GaAs layer 50 undergoes a selection-growth process using the MOCVD technique, an n-type GaAs layer 151 having a thickness of 300 nm and containing Si at a concentration of $4\times10^{17}$/cm$^3$ is created. A metallic layer 147 forming an n-type Schottky junction in conjunction with the n-type GaAs layer 151 is then formed to create a diode. A Schottky electrode 147 is wired to a collector electrode 42 to serve as an output terminal of the complementary BiFET.

The three-input NAND circuits shown in FIGS. 23 to 26 have been implemented by employing the third, nineth, tenth and example 11. The three-input NAND circuits each have extremely excellent characteristics which include consumed power in the range 2 to 300 μW and a short propagation delay time of 3 to 10 psec per unit logic gate.

In the case of the embodiments described above, a combination of an n-channel FET and a PNpHBT made up of compound semiconductor materials is adopted. It should be noted, however, that the present invention can also be implemented by reversing the conduction type of the carriers. In addition, a double hetero junction 2DEG-HBT made up of SiGe can also be combined with an n-channel MOSFET, allowing the present invention to be implemented. In particular, since SiGe has a band gap smaller than that of Si, the former and the latter correspond to a GaAs layer and an AlGaAs layer respectively. Note, however, that it is desirable to make the substrate of Si. Since a MOS-FET is used as an n-channel FET, a current limiter is required even though it is not necessary to insert a diode.

EXAMPLE 12

Figure 33:
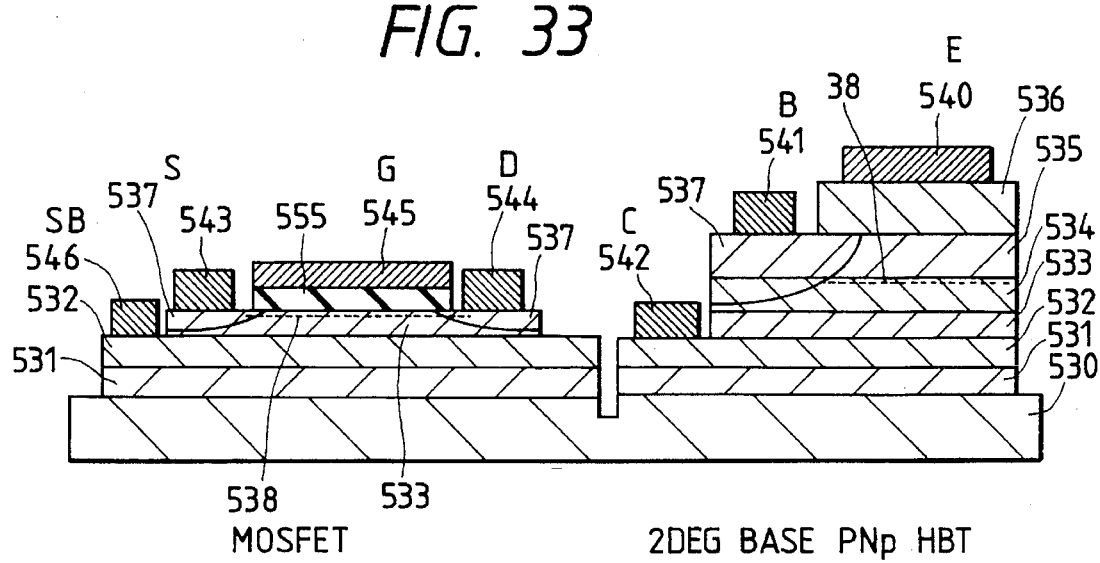
FIG. 33 shows a typical cross-sectional structure of the complementary BiFET provided by the present invention.

An embodiment implementing a double hetero junction 2DEG-HBT made up of SiGe/Si is shown in FIG. 33. An n-type Si layer 531, a p-type Si layer 532, an undoped Si layer 533, an undoped $Si_xGe_{1-x}$ (x=0.2) layer 534, an n-type Si layer 535 and a p-type Si layer 536 are created on an n-type substrate 530 by using the MBE technique to form a multilayer structure. The SiGe layer 534 and each of the layers piled thereon are then removed by an etching process from the FET portion. Subsequently, the undoped Si layer 533 undergoes a thermal oxidation process, resulting in a MOSFET. Then, arsenic ions are injected in order to create a source-drain region 537. A channel layer 538 created under the $SiO_2$ layer 555 is the so-called electron inverting layer.

In accordance with the present invention, a hetero junction is formed between the base and the collector to substantially reduce the number of minority carriers accumulated in the collector. Accordingly, the delay time it takes for the transistor to exit the saturation region is shortened considerably.

In the 2DEG-HBT, the 2DEG (Two-Dimensional Electron Gas) created in a selected dope hetero structure is used as a base layer. Since the base is created on a high-impurity collector layer, minority carriers, which are accumulated in the base region when the transistor is saturated, can be extracted out off it at a very high speed, allowing the transistor to exit from the saturation region in a short time.

By effectively making use of the feature offered by the double hetero junction 2DEG-HBT described above, a pn-junction-type FET can be formed in the same epitaxial structure, the original characteristic of the 2DEG-HBT. Thus, a complementary BiFET can be created by connecting the drain of the FET region to the collector of the bipolar transistor to serve as an output terminal, connecting the gate of the FET region to the base of the bipolar transistor to serve as an input terminal, and putting the emitter and the source at high and low potentials respectively.

Furthermore, the power consumption can be reduced by inserting a current limiter into the base or a diode into the collector and/or the gate. With such a complementary-BiFET structure, a logic gate can be created to exhibit high performance such as ultra-low power consumption of less than 10 μW per gate and an ultra-high speed resulting from a propagation delay time of smaller than 10 psec per gate.

What is claimed is:

1. A semiconductor device comprising:
  a bipolar transistor including an emitter, a base and a collector, wherein hetero junctions are each created between said emitter and said base of said bipolar transistor and between said base and collector of said bipolar transistor; and
  a field-effect transistor having a polarity different from a polarity of said bipolar transistor, said field-effect transistor including a gate, a source and a drain;
  wherein said base of said bipolar transistor and said gate of said field-effect transistor are connected to each other to serve as an input terminal,
  wherein said collector of said bipolar transistor and said drain of said field-effect transistor are connected to each other to serve as an output terminal, and
  wherein said emitter of said bipolar transistor is connected to a first power supply and said source of said field-effect transistor is connected to a second power supply.

2. A semiconductor device according to claim 1, wherein said bipolar transistor and said field-effect transistor are created on a common substrate, are separated from each other and have the same multilayer/film structures.

3. A semiconductor device according to claim 2, wherein active layers of said bipolar transistor and said field-effect transistor are each created from the same compound semiconductor layer.

4. A semiconductor device according to claim 2, wherein said substrate is made of semi-insulating GaAs.

5. A semiconductor device according to claim 4, wherein said hetero junctions are created between a GaAs layer and an AlGaAs layer.

6. A semiconductor device according to claim 3, wherein said compound semiconductor layer is an undoped GaAs layer.

7. A semiconductor device according to claim 3, wherein a diode is inserted between said collector of said bipolar transistor and said output terminal.

8. A semiconductor device according to claim 7, wherein said diode has a Schottky junction.

9. A semiconductor device according to claim 1, wherein said bipolar transistor is a PNP bipolar transistor and said field-effect transistor is an n-channel junction type field-effect transistor.

10. A semiconductor device according to claim 3, wherein a two-dimensional electron gas or a two-dimensional hole gas is created on an interface between said compound semiconductor layer and another compound semiconductor layer created on said compound semiconductor layer.

11. A semiconductor device according to claim 3, wherein a logic circuit is created.

12. A semiconductor device according to claim 2, wherein said field-effect transistor is an enhancement-type field-effect transistor.

13. A semiconductor device according to claim 1, wherein said bipolar transistor is an NPN bipolar transistor and said field-effect transistor is a p-channel field-effect transistor.

14. A semiconductor device according to claim 1, wherein said semiconductor device comprises at least one basic memory circuit for a Static Random-Access Memory.

15. A semiconductor device according to claim 1, wherein said semiconductor device comprises a logic circuit.

16. A semiconductor device according to claim 1, wherein said semiconductor device comprises a memory circuit.

17. A semiconductor device according to claim 1, wherein said semiconductor device comprises an invertor circuit.

18. A semiconductor device according to claim 3, wherein a resistor is inserted between said base of said bipolar transistor and said input terminal.

19. A semiconductor device according to claim 3, wherein a memory circuit is created.

20. A semiconductor device according to claim 1, wherein $$\Delta Vdd + \Delta Vgd + \Delta Vtp < Vdd,$$

wherein ΔVdd represents a total of a shift in voltage of a diode which is connected to said bipolar transistor and off-set voltage in the characteristics between a collector current of said bipolar transistor and a voltage which is applied between the collector and the emitter of said bipolar transistor, ΔVgd represents a shift in voltage of a diode which is connected to the gate of said field effect transistor, ΔVtp represents a difference between voltages of the base and emitter of said bipolar transistor, and Vdd represents a stand up voltage in collector current of said bipolar transistor.

21. A semiconductor device according to claim 20, wherein ΔVdd+ΔVgd+ΔVtp>Vdd−0.2 volt.

22. A semiconductor device according to claim 7, wherein said diode has an Iso-Hetero junction.

23. A semiconductor device according to claim 1, wherein $$Vfn+\Delta Vgd+\Delta Vdd \leq Vdd,$$

wherein Vfn represents a building-up voltage of a gate leak current of the field effect transistor, ΔVgd represents a shift in voltage of a diode which is connected to the gate of said field effect transistor, ΔVdd represents a total of a shift in voltage of a diode which is connected to said bipolar transistor and off-set voltage in the characteristics between a collector current of said bipolar transistor and a voltage which is applied between the collector and the emitter of said bipolar transistor, and Vdd represents a stand up voltage in collector current of said bipolar transistor.

24. A semiconductor device according to claim 1, wherein $$Vfn+\Delta Vgd+\Delta Vdd>Vdd,$$

wherein Vfn represents a building-up voltage of a gate leak current of the field effect transistor, ΔVgd represents a shift in voltage of a diode which is connected to the gate of said field effect transistor, ΔVdd represents a total of a shift in voltage of a diode which is connected to said bipolar transistor and off-set voltage in the characteristics between a collector current of said bipolar transistor and a voltage which is applied between the collector and the emitter of said bipolar transistor, and Vdd represents a stand up voltage in collector current of said bipolar transistor.

25. A semiconductor device comprising:

a bipolar transistor including an emitter, a base and a collector, wherein hereto junctions are each created between said emitter and said base of said bipolar transistor and between said base and said collector of said bipolar transistor; and a field-effect transistor having a polarity different from a polarity of said bipolar transistor, said field-effect transistor including a gate, a source and a drain;

wherein said base of said bipolar transistor and said gate of said field-effect transistor are connected to each other to serve as an input terminal, wherein said collector of said bipolar transistor and said drain of said field-effect transistor are connected to each other to serve as an output terminal, wherein said emitter of said bipolar transistor is connected to a first power supply and said source of said field-effect transistor is connected to a second power supply, wherein said bipolar transistor and said field-effect transistor are created on a common substrate, are separated from each other and have the same multilayer/film structures, wherein active layers of said bipolar transistor and said field-effect transistor are each created from the same compound semiconductor layer, and wherein a constant-current limiter is inserted between said base of said bipolar transistor and said input terminal.

26. A semiconductor device according to claim 25, wherein a diode is inserted between said collector of said bipolar transistor and said output terminal.

27. A semiconductor device according to claim 26, wherein said diode has a Schottky junction.

28. A semiconductor device according to claim 25, wherein a diode is inserted between said gate of said field-effect transistor and said input terminal.

29. A semiconductor device according to claim 28, wherein said diode has a Schottky junction.

30. A semiconductor device according to claim 26, wherein said diode has an Iso-Hetero junction.

31. A semiconductor device according to claim 28, wherein said diode has an Iso-Hetero junction.

32. A semiconductor device comprising:

a bipolar transistor including an emitter, a base and a collector, wherein hetero junctions are each created between said emitter and said base of said bipolar transistor and between said base and said collector of said bipolar transistor; and a field-effect transistor having a polarity different from a polarity of said bipolar transistor, said field-effect transistor including a gate, a source and a drain;

wherein said base of said bipolar transistor and said gate of said field-effect transistor are connected to each other to serve as an input terminal, wherein said collector of said bipolar transistor and said drain of said field-effect transistor are connected to each other to serve as an output terminal, wherein said emitter of said bipolar transistor is connected to a first power supply and said source of said field-effect transistor is connected to a second power supply, wherein said bipolar transistor and said field-effect transistor are created on a common substrate, are separated from each other and have the same multilayer/film structures, wherein active layers of said bipolar transistor and said field-effect transistor are each created from the same compound semiconductor layer, and wherein a diode is inserted between said gate of said field-effect transistor and said input terminal.

33. A semiconductor device according to claim 32, wherein said diode has a Schottky junction.

34. A semiconductor device according to claim 32, wherein said diode has an Iso-Hetero junction.

35. A semiconductor device comprising:

a bipolar transistor including an emitter, a base and a collector, wherein hereto junction are each created between said emitter and said base of said bipolar transistor and between said base and said collector of said bipolar transistor; and a field-effect transistor having a polarity different from a polarity of said bipolar transistor, said field-effect transistor including a gate, a source and a drain;

wherein said base of said bipolar transistor and said gate of said field-effect transistor are connected to each other to serve as an input terminal, wherein said collector of said bipolar transistor and said drain of said field-effect transistor are connected to each other to serve as an output terminal, wherein said emitter of said bipolar transistor is connected to a first power supply and said source of said field-effect transistor is connected to a second power supply, and wherein a diode is inserted between said collector of said bipolar transistor and said output terminal.

36. A semiconductor device according to claim 35, wherein said diode has a Schottky junction.

37. A semiconductor device according to claim 35, wherein said diode has an Iso-Hetero junction.

38. A semiconductor device comprising:

a bipolar transistor including an emitter a base and a collector, wherein hetero junctions are each created between said emitter and said base of said bipolar transistor and between said base and said collector of said bipolar transistor; and a field-effect transistor having a polarity different from a polarity of said bipolar transistor, said field-effect transistor including a gate, a source and a drain;

wherein said base of said bipolar transistor and said gate of said field-effect transistor are connected to each other to serve as an input terminal;

wherein said collector of said bipolar transistor and said drain of said field-effect transistor are connected to each other to serve as an output terminal, wherein said emitter of said bipolar transistor is connected to a first power supply and said source of said field-effect transistor is connected to a second power supply, and wherein a diode is inserted between said gate of said field-effect transistor and said input terminal.

39. A semiconductor device according to claim 38, wherein said diode has a Schottky junction.

40. A semiconductor device according to claim 38, wherein said diode has an Iso-Hetero junction.

* * * * *

UNITED STATES PATENT AND TRADEMARK OFFICE
CERTIFICATE OF CORRECTION

PATENT NO. : 5,567,961  
DATED : 22 October 1996  
INVENTOR(S) : Toshiyuki USAGAWA et al.

It is certified that error appears in the above-identified patent and that said Letters Patent is hereby corrected as shown below:

| Column | Line | |
|---|---|---|
| 4 | 46 | Change "delay time re" to --delay time $\tau$ e-- |
| 6 | 9 | Change "6x104" to --$6 \times 10^4$--. |
| 8 | 5 | Change "as" to --at--. |
| 8 | 58 | Change "have" to --has--. |
| 9 | 22 | Change "theses" to --these--. |
| 9 | 44 | Delete "speaking". |
| 11 | 51 | After "Vth" delete "as". |
| 11 | 53 | Change "has something to do deeply with" to --considerably affects--. |
| 12 | 7 | After "swing" insert --$\Delta$V--. |
| 12 | 67 | In the equation, change "...(AlgaAs)..." to --...(AlGaAs)...--. |

UNITED STATES PATENT AND TRADEMARK OFFICE
CERTIFICATE OF CORRECTION

PATENT NO. : 5,567,961

DATED : 22 October 1996

INVENTOR(S) : Toshiyuki USAGAWA et al.

It is certified that error appears in the above-identified patent and that said Letters Patent is hereby corrected as shown below:

| Column | Line | |
|---|---|---|
| 13 | 1  | After "...>" insert --/--. |
| 15 | 27 | Change "show" to --shows--. |
| 16 | 43 | Change "get settled" to --getting settled-- |
| 18 | 59 | Change "inveters" to --inverters--. |
| 19 | 6  | Change "is resulted in on" to --results in--. |
| 19 | 28 | After "should" insert --be--. |
| 19 | 35 | Change "FIG." to --FIGS.--. |
| 20 | 11 | Change "created" to --built--. |
| 21 | 60 | Change "$3 \times 10^{18}$" to --$3 \times 10^{18}$--. |
| 23 | 31 | Change "In0.52As" to --$In_{0.52}As$--. |
| 23 | 55 | Delete "is". |

UNITED STATES PATENT AND TRADEMARK OFFICE
CERTIFICATE OF CORRECTION

PATENT NO. : 5,567,961
DATED : 22 October 1996
INVENTOR(S) : Toshiyuki USAGAWA et al.

It is certified that error appears in the above-identified patent and that said Letters Patent is hereby corrected as shown below:

| Column | Line | |
|---|---|---|
| 23 | 56 | Change "resulted in" to --results--. |
| 24 | 60 | Change "deepened" to --reduced--. |
| 25 | 51 | Change "lasing" to --losing--. |
| 28 | 44 | Change "Auge/" to --AuGe/--. |
| 28 | 64 | Change "example 11" to --eleventh example-- |
| 33 | 12 | After "emitter" insert --,--. |

Signed and Sealed this

Fourth Day of March, 1997

BRUCE LEHMAN

*Attest:*

*Attesting Officer*          Commissioner of Patents and Trademarks